US012225720B2

(12) United States Patent
Itou et al.

(10) Patent No.: US 12,225,720 B2
(45) Date of Patent: Feb. 11, 2025

(54) THREE-DIMENSIONAL MEMORY DEVICE WITH DOPED SEMICONDUCTOR BRIDGE STRUCTURES AND METHODS FOR FORMING THE SAME

(71) Applicant: SANDISK TECHNOLOGIES LLC, Addison, TX (US)

(72) Inventors: Ryousuke Itou, Yokkaichi (JP); Akihisa Sai, Yokkaichi (JP); Kenzo Iizuka, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 522 days.

(21) Appl. No.: 17/530,861

(22) Filed: Nov. 19, 2021

(65) Prior Publication Data

US 2023/0055230 A1 Feb. 23, 2023

Related U.S. Application Data

(63) Continuation-in-part of application No. 17/406,463, filed on Aug. 19, 2021.

(51) Int. Cl.
*H10B 41/27* (2023.01)
*H01L 21/3213* (2006.01)
(Continued)

(52) U.S. Cl.
CPC ....... *H10B 41/27* (2023.02); *H01L 21/32134* (2013.01); *H01L 21/76877* (2013.01);
(Continued)

(58) Field of Classification Search
CPC ........... H01L 23/5221; H01L 21/31111; H01L 21/76802; H01L 21/76877;
(Continued)

(56) References Cited

U.S. PATENT DOCUMENTS 9,679,906 B2 6/2017 Lu et al.
2015/0318301 A1* 11/2015 Lee ....................... H10B 43/10 257/324

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Ratisha Mehta
*Assistant Examiner* — Brad A Knudson
(74) *Attorney, Agent, or Firm* — THE MARBURY LAW GROUP PLLC

(57) ABSTRACT

A vertically alternating sequence of continuous insulating layers and continuous sacrificial material layers is formed over a substrate, and memory opening fill structures including vertical stacks of memory elements are formed through the vertically alternating sequence. Backside trenches are formed to divide the vertically alternating sequence into a plurality of alternating stacks of insulating layers and sacrificial material layers. Bridge structures are formed within each of the backside trenches. The sacrificial material layers are replaced with electrically conductive layers while the bridge structure are present within the backside trenches.

11 Claims, 90 Drawing Sheets

(51) Int. Cl.

| | |
|---|---|
| ***H01L 21/768*** | (2006.01) |
| ***H10B 41/10*** | (2023.01) |
| ***H10B 43/10*** | (2023.01) |
| ***H10B 43/27*** | (2023.01) |
| *H01L 23/522* | (2006.01) |
| *H01L 23/532* | (2006.01) |

(52) U.S. Cl.
CPC ............. *H10B 41/10* (2023.02); *H10B 43/10* (2023.02); *H10B 43/27* (2023.02); *H01L 23/5221* (2013.01); *H01L 23/53271* (2013.01)

(58) Field of Classification Search
CPC ... H01L 23/53271; H10B 41/27; H10B 43/27; H10B 43/30; H10B 41/30
See application file for complete search history.

(56) References Cited

U.S. PATENT DOCUMENTS

| | | | | |
|---|---|---|---|---|
| 2017/0047334 | A1* | 2/2017 | Lu | H10B 41/27 |
| 2019/0115356 | A1 | 4/2019 | Lee | |
| 2020/0395376 | A1* | 12/2020 | Huo | H10B 43/50 |
| 2021/0036004 | A1 | 2/2021 | Moriyama et al. | |
| 2021/0057336 | A1 | 2/2021 | Shao et al. | |
| 2021/0057428 | A1 | 2/2021 | Hu et al. | |
| 2021/0111064 | A1 | 4/2021 | Billingsley et al. | |
| 2021/0125920 | A1* | 4/2021 | Hu | H01L 21/76224 |
| 2021/0134827 | A1 | 5/2021 | Iwai et al. | |
| 2021/0202324 | A1* | 7/2021 | Scarbrough | H10B 43/10 |
| 2022/0085057 | A1* | 3/2022 | Jang | H10B 43/27 |
| 2022/0189982 | A1* | 6/2022 | Luo | H10B 41/27 |
| 2022/0238548 | A1 | 7/2022 | Liu et al. | |

OTHER PUBLICATIONS

U.S. Appl. No. 16/782,307, filed Feb. 5, 2020, SanDisk Technologies LLC.
U.S. Appl. No. 16/881,346, filed May 22, 2020, SanDisk Technologies LLC.
U.S. Appl. No. 16/881,401, filed May 22, 2020, SanDisk Technologies LLC.
U.S. Appl. No. 17/039,160, filed Sep. 30, 2020, SanDisk Technologies LLC.
U.S. Appl. No. 17/116,093, filed Dec. 9, 2020, SanDisk Technologies LLC.
U.S. Appl. No. 17/146,866, filed Jan. 12, 2021, SanDisk Technologies LLC.
U.S. Appl. No. 17/174,064, filed Feb. 11, 2021, SanDisk Technologies LLC.
U.S. Appl. No. 17/174,094, filed Feb. 11, 2021, SanDisk Technologies LLC.
U.S. Appl. No. 17/226,321, filed Apr. 9, 2021, SanDisk Technologies LLC.
U.S. Appl. No. 17/376,490, filed Jul. 15, 2021, SanDisk Technologies LLC.
U.S. Appl. No. 17/406,463, filed Aug. 19, 2021, SanDisk Technologies LLC.
Notification of Transmittal of The International Search Report and Written Opinion of the International Searching Authority for International Patent Application No. PCT/US2022/028391, mailed Sep. 21, 2022, 13 pages.
USPTO Office Communication, Non-Final Office Action for U.S. Appl. No. 17/406,463, mailed Apr. 23, 2024, 14 pages.

* cited by examiner

THREE-DIMENSIONAL MEMORY DEVICE WITH DOPED SEMICONDUCTOR BRIDGE STRUCTURES AND METHODS FOR FORMING THE SAME

RELATED APPLICATIONS

This application is a continuation-in-part application of U.S. application Ser. No. 17/406,463 filed on Aug. 19, 2021, the entire contents of which are incorporated herein by reference.

FIELD

The present disclosure relates generally to the field of semiconductor devices, and particularly to a three-dimensional memory device including doped semiconductor bridge structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a pair of alternating stacks of insulating layers and electrically conductive layers laterally spaced apart from each other by a backside trench, wherein each of the pair of alternating stacks and the backside trench laterally extend along a first horizontal direction; arrays of memory openings vertically extending through a respective alternating stack among the pair of alternating stacks; arrays of memory openings fill structures located in the arrays of memory openings, wherein each of the memory opening fill structures comprises a respective vertical stack of memory elements; and a backside trench fill structure located within the backside trench and comprising a plurality of bridge structures.

According to another aspect of the present disclosure, a method of forming a three-dimensional memory device is provided, which comprises: forming a vertically alternating sequence of continuous insulating layers and continuous sacrificial material layers over a substrate; forming arrays of memory opening through the vertically alternating sequence; forming arrays of memory opening fill structures in the arrays of memory openings, wherein each of the memory opening fill structures comprises a respective vertical stack of memory elements; forming backside trenches laterally extending along a first horizontal direction through the vertically alternating sequence, wherein a plurality of alternating stacks of insulating layers and sacrificial material layers are laterally spaced apart by the backside trenches; forming first bridge structures comprising a first doped semiconductor material within each of the backside trenches at a first vertical distance from a horizontal plane including a top surface of the substrate; forming second bridge structures comprising a second doped semiconductor material within each of the backside trenches at a second vertical distance from the horizontal plane including the top surface of the substrate, wherein the second vertical distance is less than the first vertical distance; and replacing the sacrificial material layers with electrically conductive layers while the first and the second bridge structures are present within the backside trenches.

According to an aspect of the present disclosure, a three-dimensional memory device is provided, which comprises: a pair of alternating stacks of insulating layers and electrically conductive layers laterally spaced apart from each other by a backside trench, wherein each of the pair of alternating stacks and the backside trench laterally extends along a first horizontal direction; arrays of memory openings vertically extending through a respective alternating stack among the pair of alternating stacks; arrays of memory openings fill structures located in the arrays of memory openings, wherein each of the memory opening fill structures comprises a respective vertical stack of memory elements; and a backside trench fill structure located within the backside trench and comprising at least one bridge structure including a doped semiconductor material.

According to another aspect of the present disclosure, a method of forming a three-dimensional memory device is provided, which comprises: forming a vertically alternating sequence of continuous insulating layers and continuous sacrificial material layers over a substrate; forming arrays of memory opening through the vertically alternating sequence; forming arrays of memory opening fill structures in the arrays of memory openings, wherein each of the memory opening fill structures comprises a respective vertical stack of memory elements; forming backside trenches laterally extending along a first horizontal direction through the vertically alternating sequence, wherein a plurality of alternating stacks of insulating layers and sacrificial material layers are laterally spaced apart by the backside trenches; forming a set of one or more bridge structures comprising a doped semiconductor material within each of the backside trenches; and replacing the sacrificial material layers with electrically conductive layers while the sets of at least one bridge structure are present within the backside trenches.

DETAILED DESCRIPTION

Figure 1A:
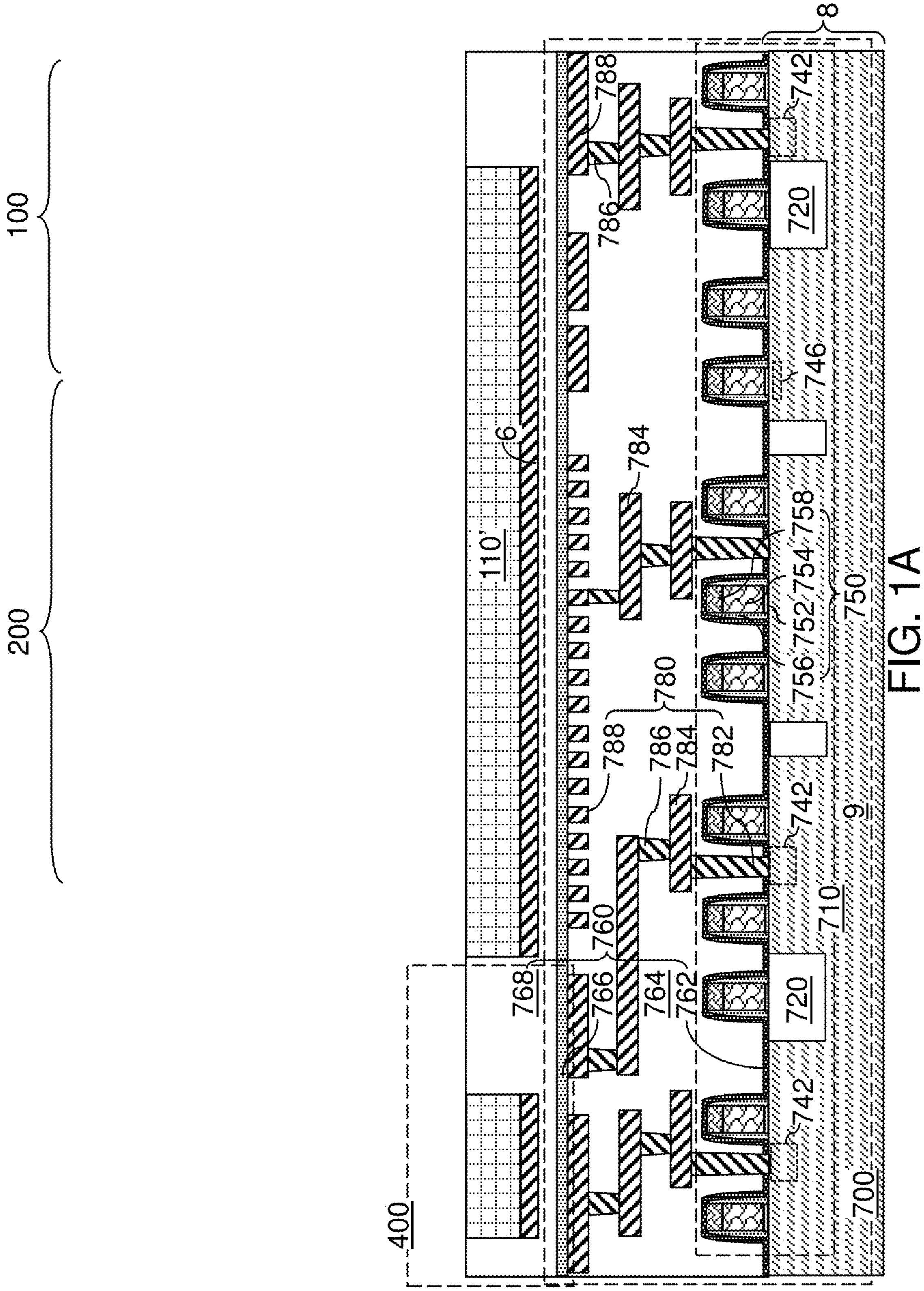
FIG. 1A is a vertical cross-sectional view of a first exemplary structure after formation of semiconductor devices, lower level dielectric layers, lower metal interconnect structures, and in-process source level material layers on a semiconductor substrate according to an embodiment of the present disclosure.

Neighboring alternating stacks of insulating layers and electrically conductive layers (e.g., word lines) in a three-dimensional NAND memory device may be laterally spaced apart by backside trenches. The backside trenches render the device structure vulnerable to deformation or collapse during replacement of sacrificial material layers with electrically conductive layers. As discussed above, the embodiments of the present disclosure provide a three-dimensional memory device including doped semiconductor bridge structures and methods of forming the same, the various aspects of which are described herein in detail. The doped semiconductor bridge structures can be employed to reduce deformation of a three-dimensional memory device. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
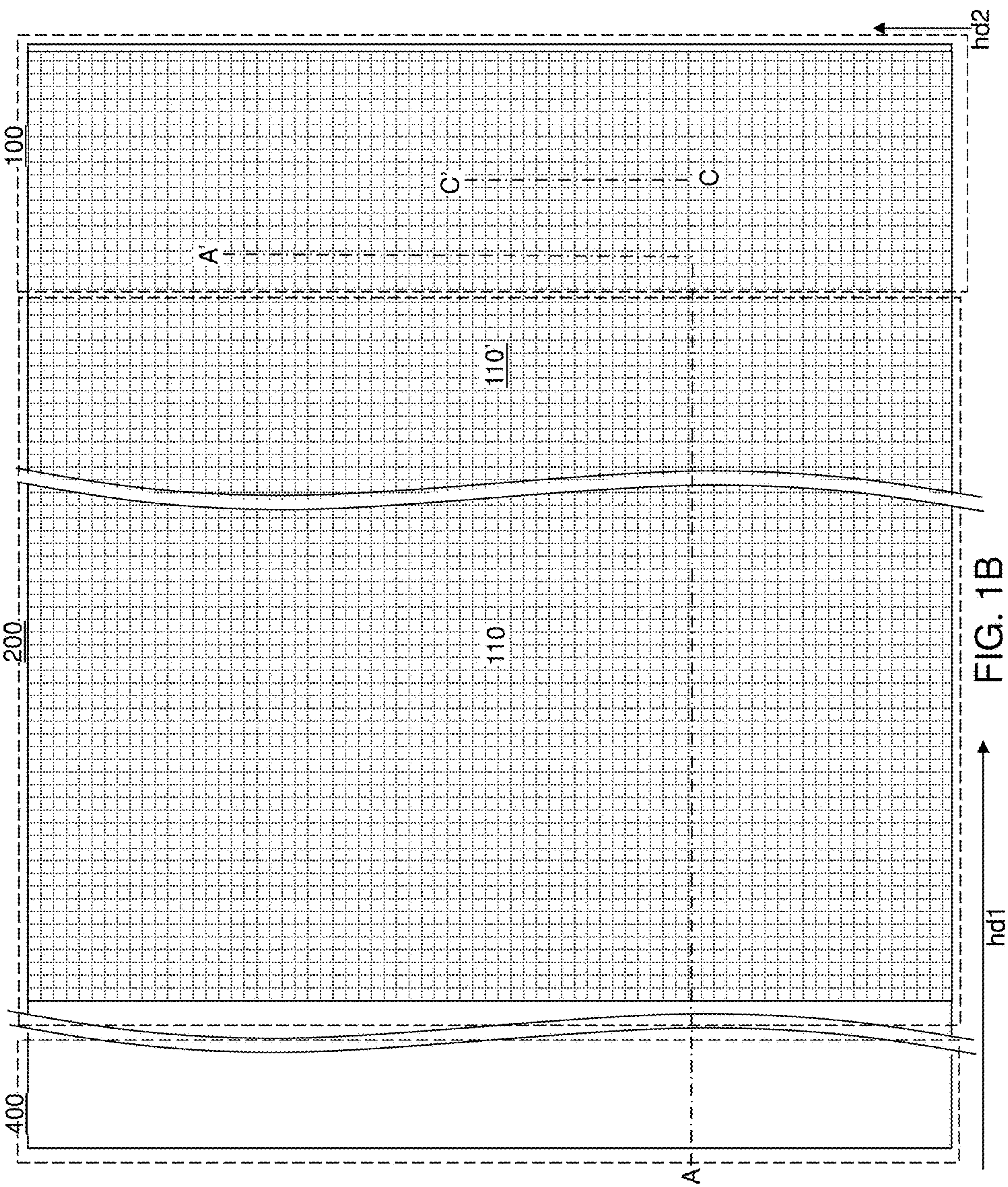
FIG. 1B is a top-down view of the first exemplary structure of FIG. 1A. The hinged vertical plane A-A' is the plane of the vertical cross-sectional view of FIG. 1A.
Figure 1C:
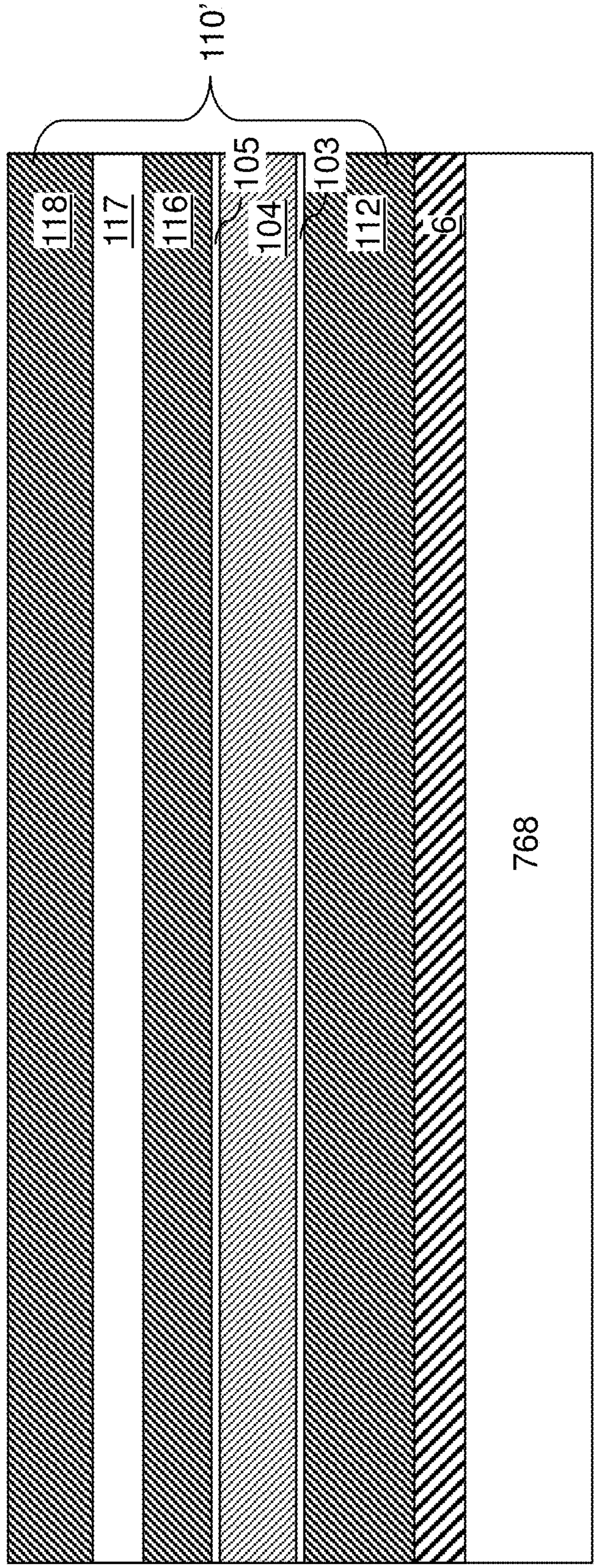
FIG. 1C is a magnified view of the in-process source level material layers along the vertical plane C-C' of FIG. 1B.

Referring to FIGS. 1A-1C, a first exemplary structure according to an embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
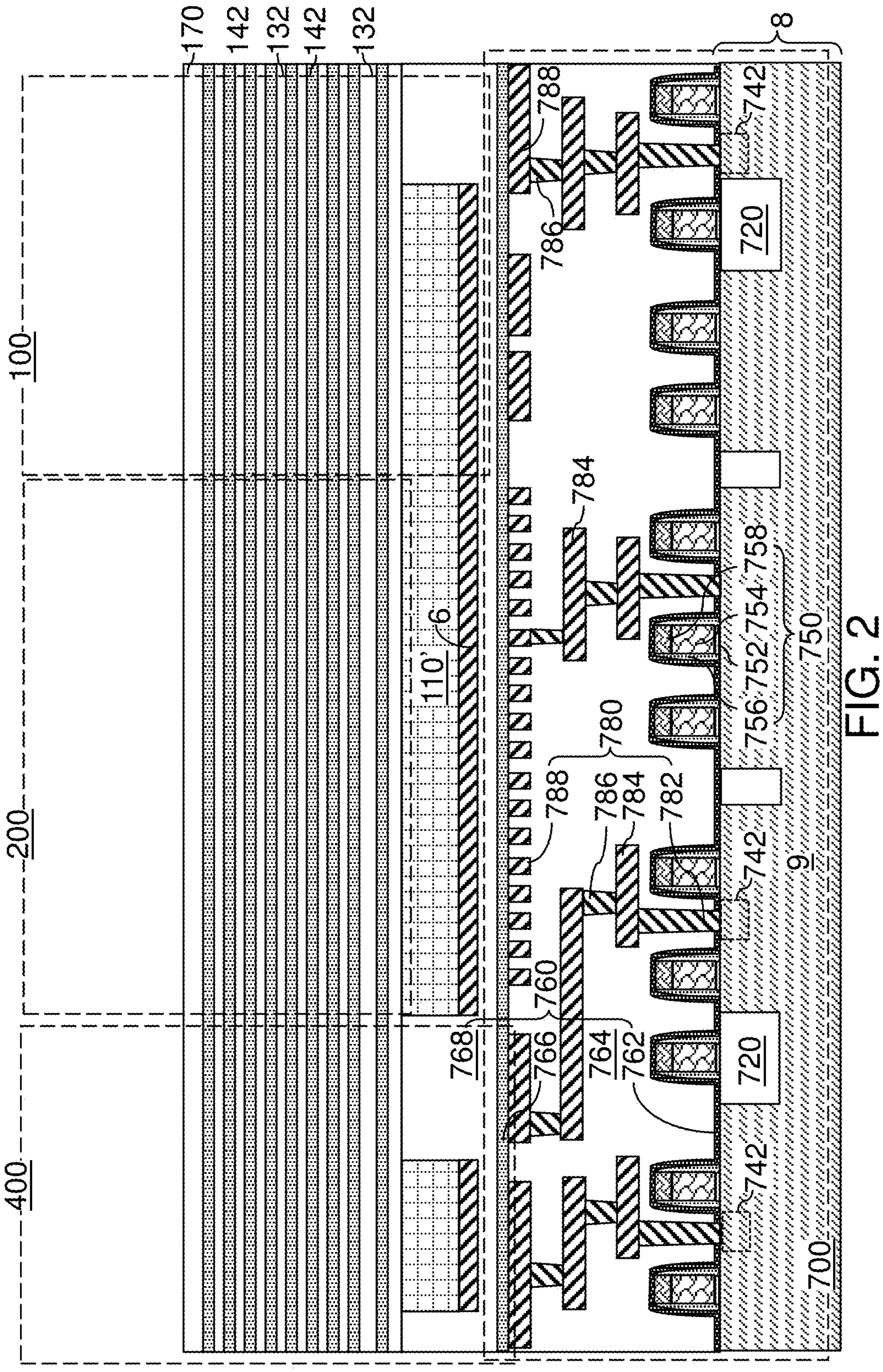
FIG. 2 is a vertical cross-sectional view of the first exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
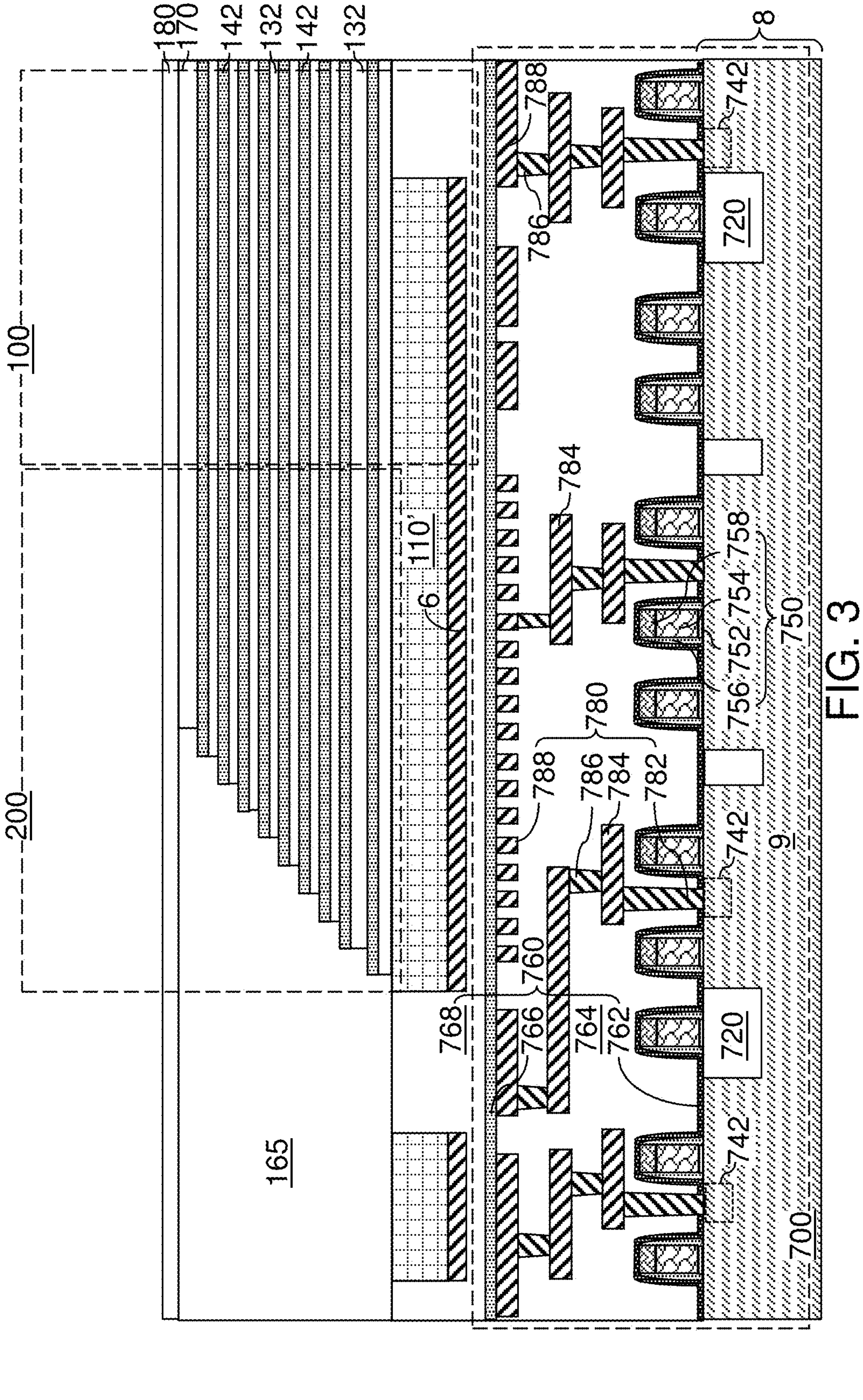
FIG. 3 is a vertical cross-sectional view of the first exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
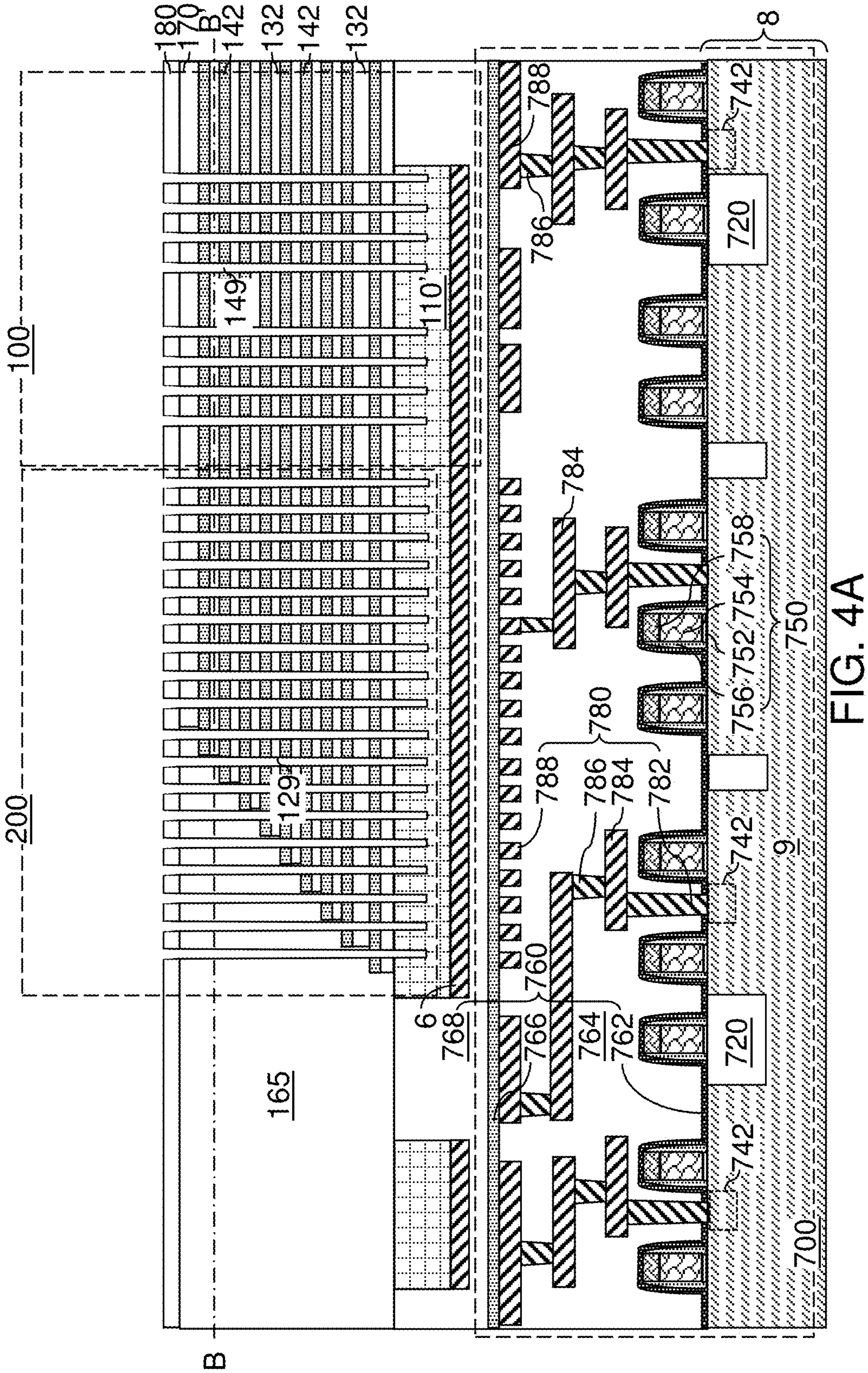
FIG. 4A is a vertical cross-sectional view of the first exemplary structure after formation of first-tier memory openings and first-tier support openings according to an embodiment of the present disclosure.
Figure 4B:
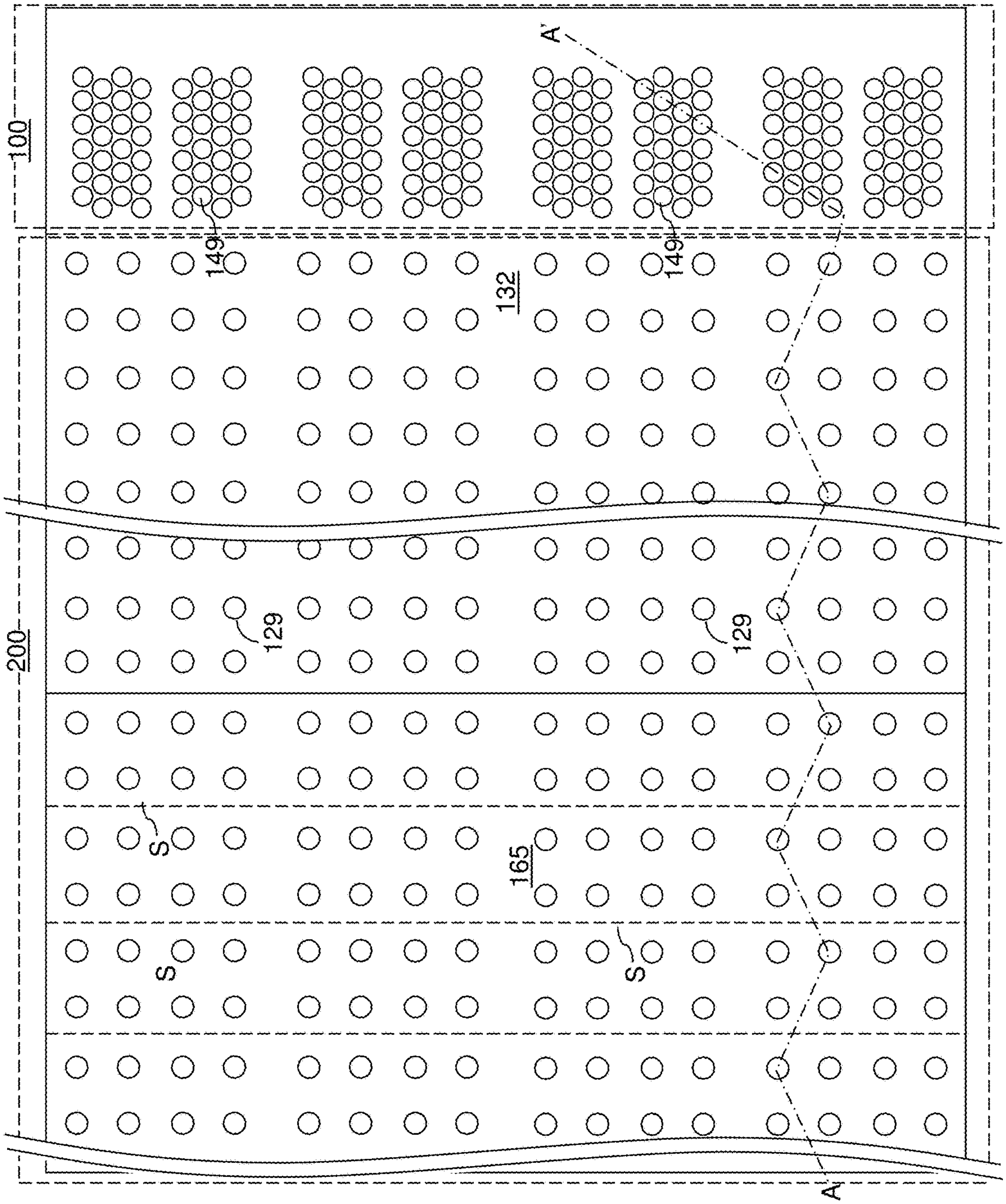
FIG. 4B is a horizontal cross-sectional view of the first exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
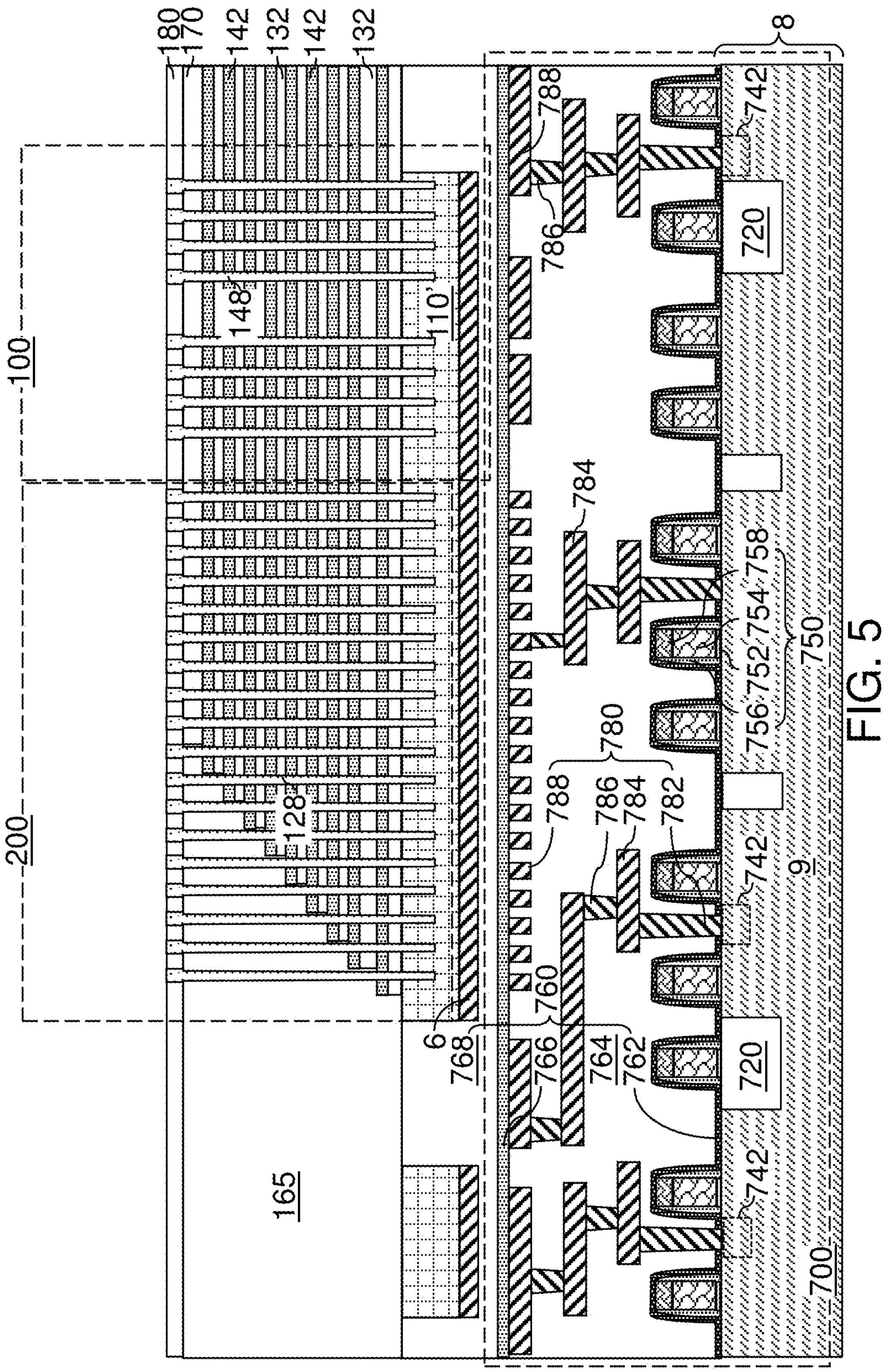
FIG. 5 is a vertical cross-sectional view of the first exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
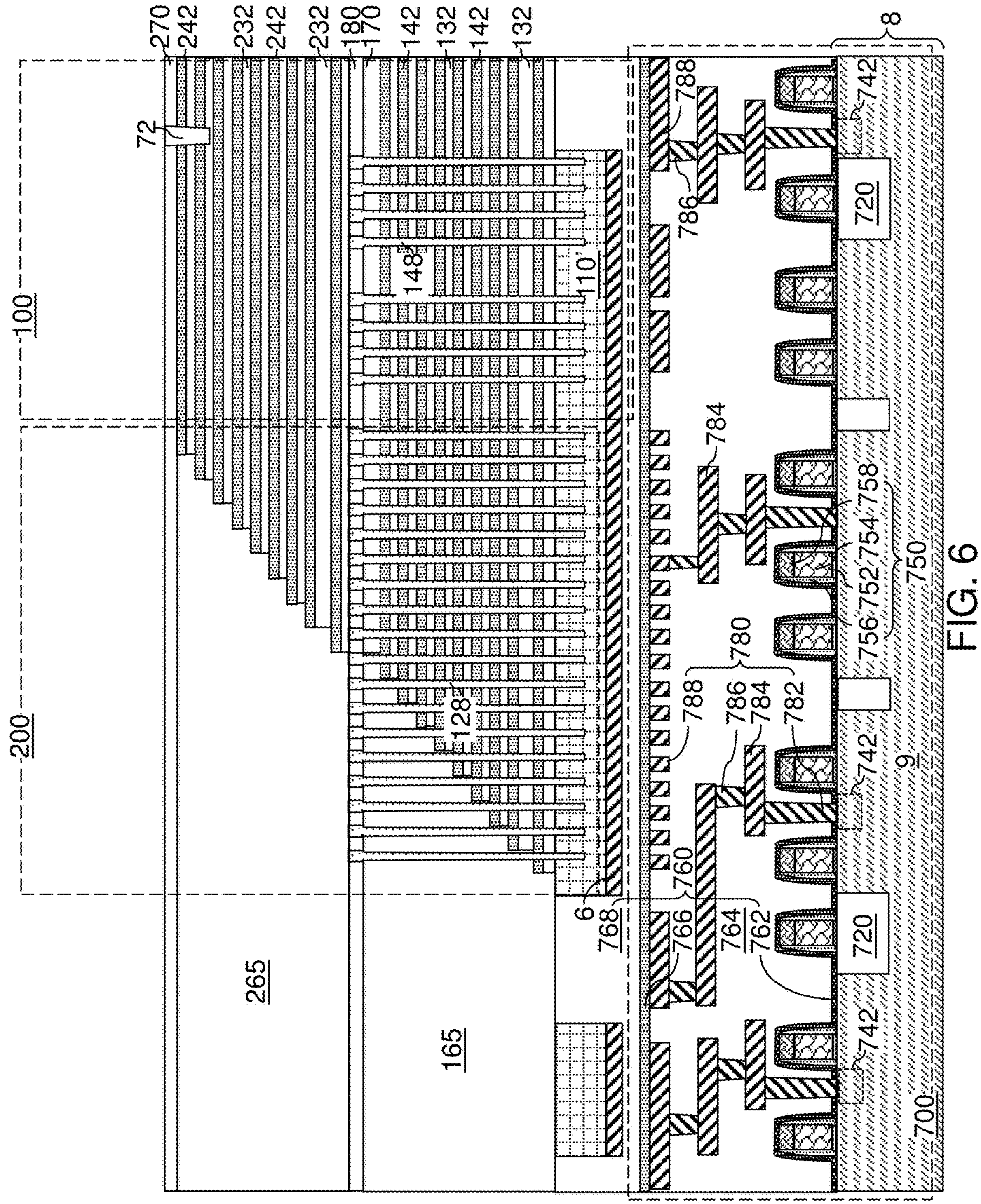
FIG. 6 is a vertical cross-sectional view of the first exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
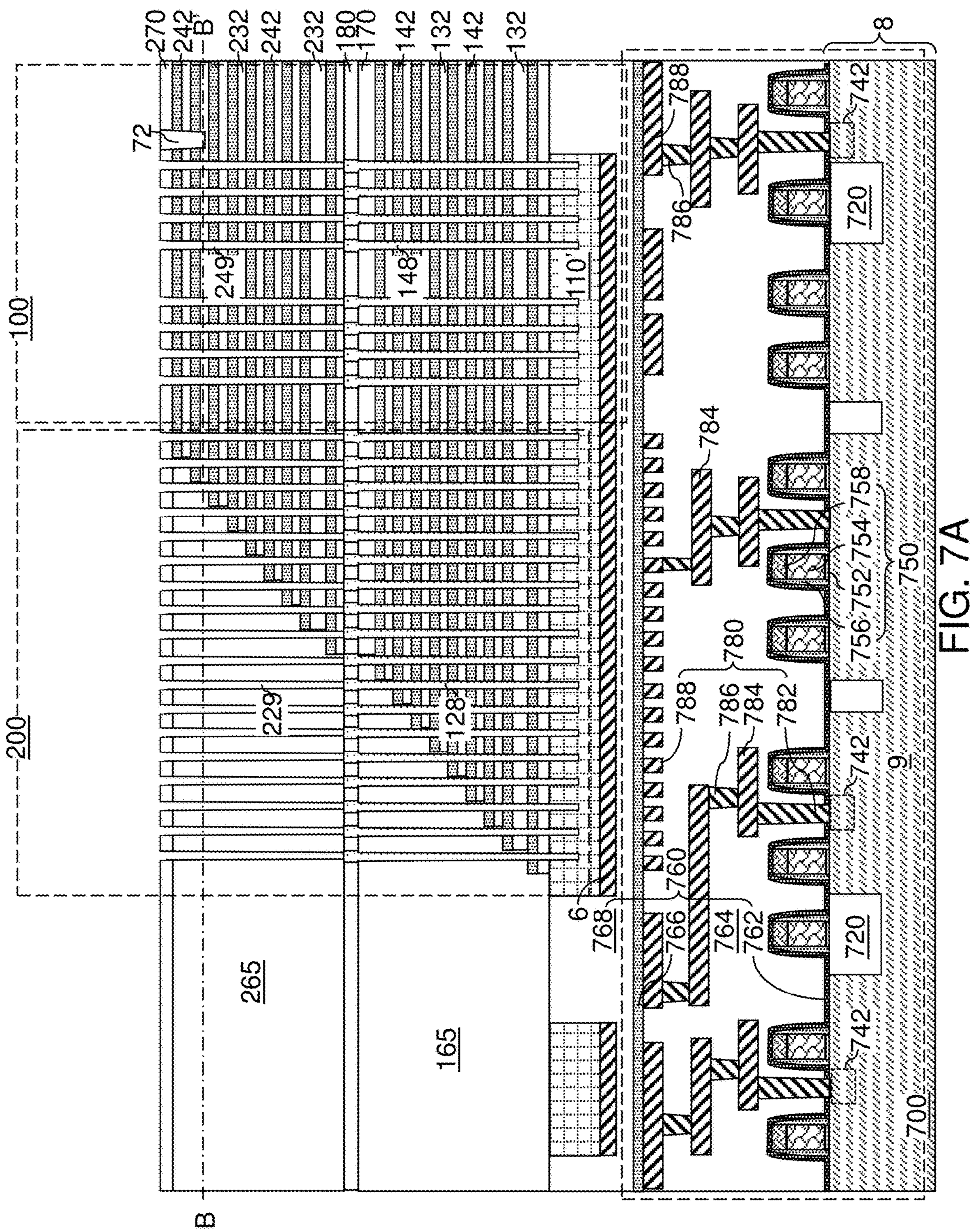
FIG. 7A is a vertical cross-sectional view of the first exemplary structure after formation of second-tier memory openings and second-tier support openings according to an embodiment of the present disclosure.
Figure 7B:
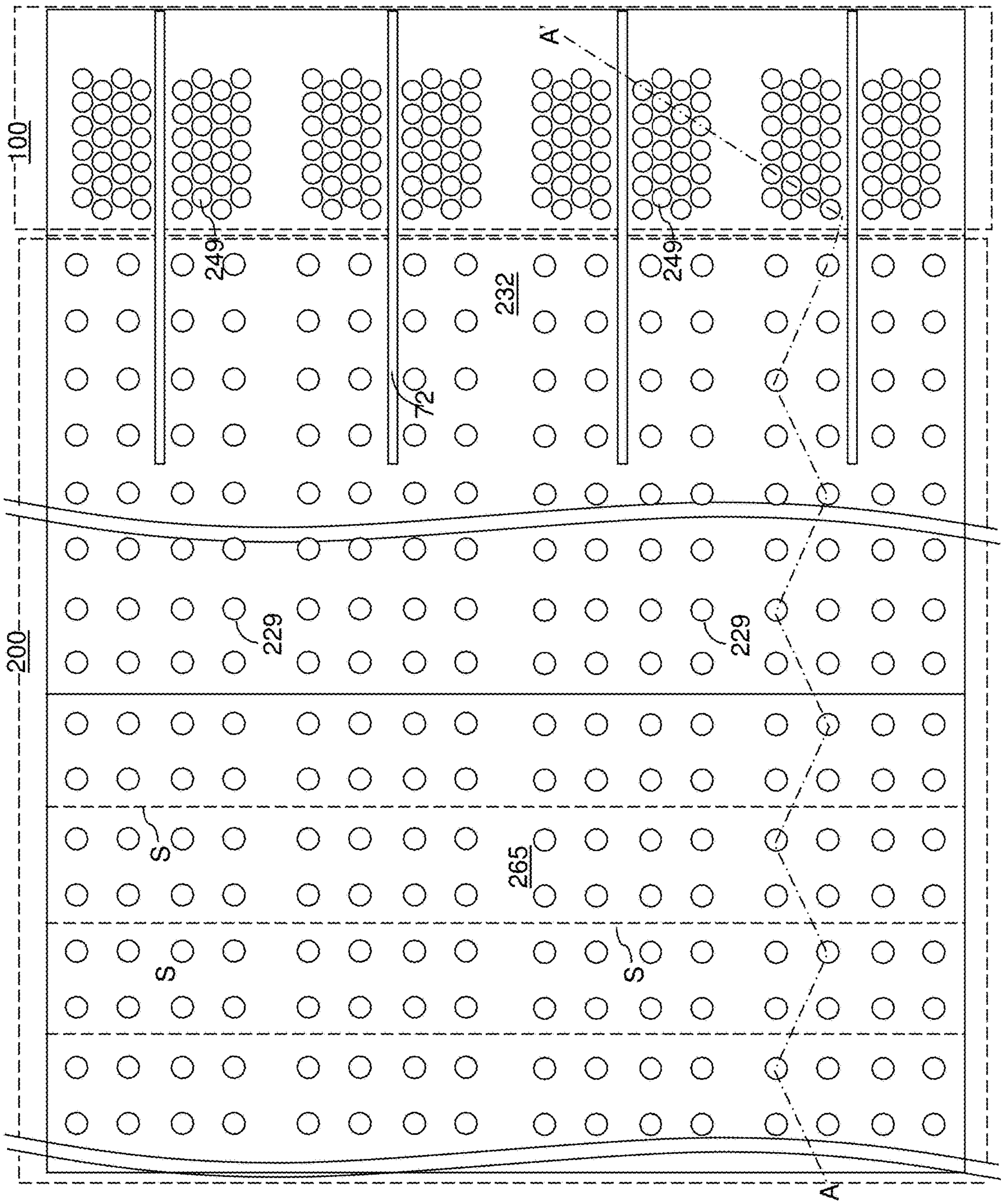
FIG. 7B is a horizontal cross-sectional view of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
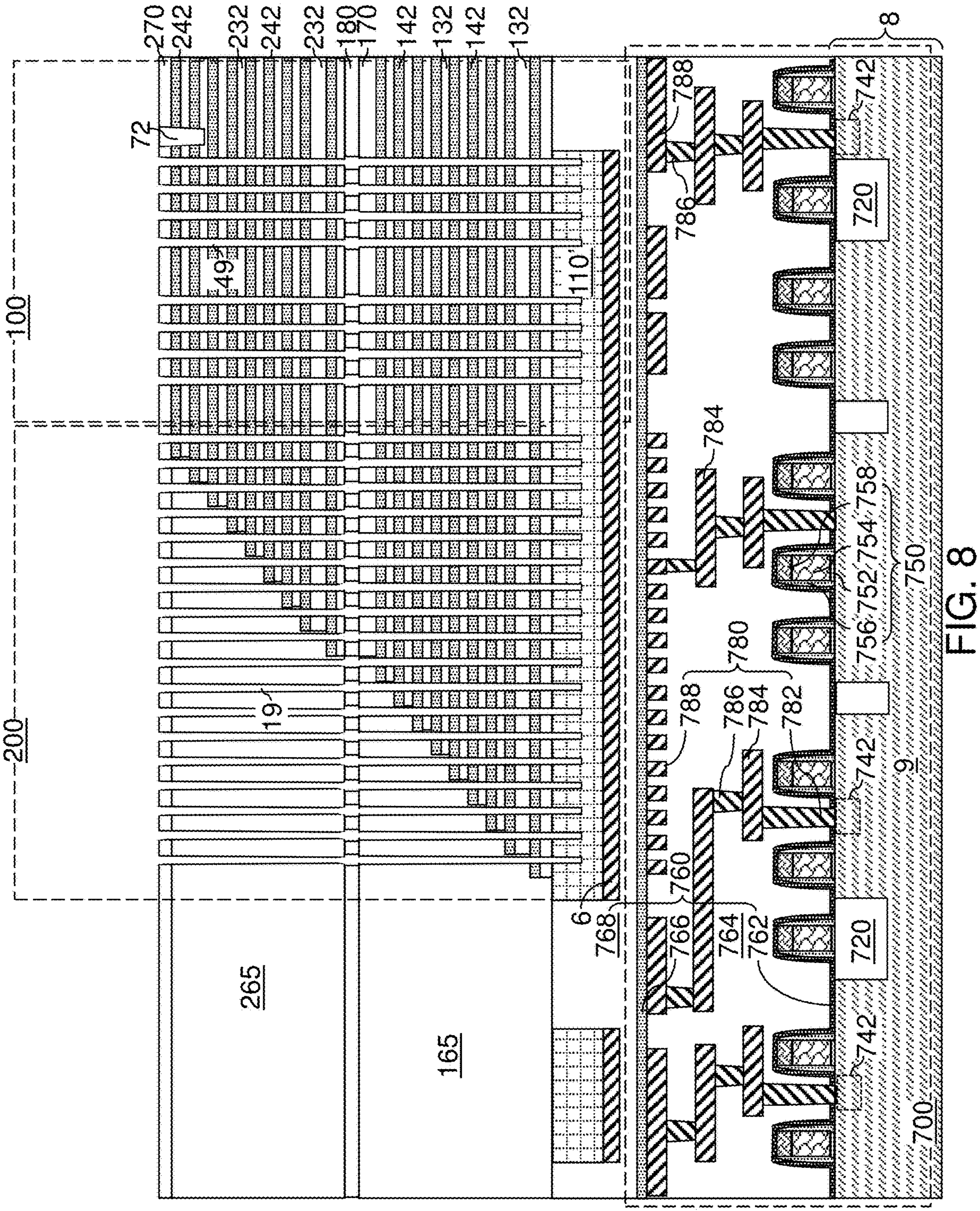
FIG. 8 is a vertical cross-sectional view of the first exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Figure 9B:
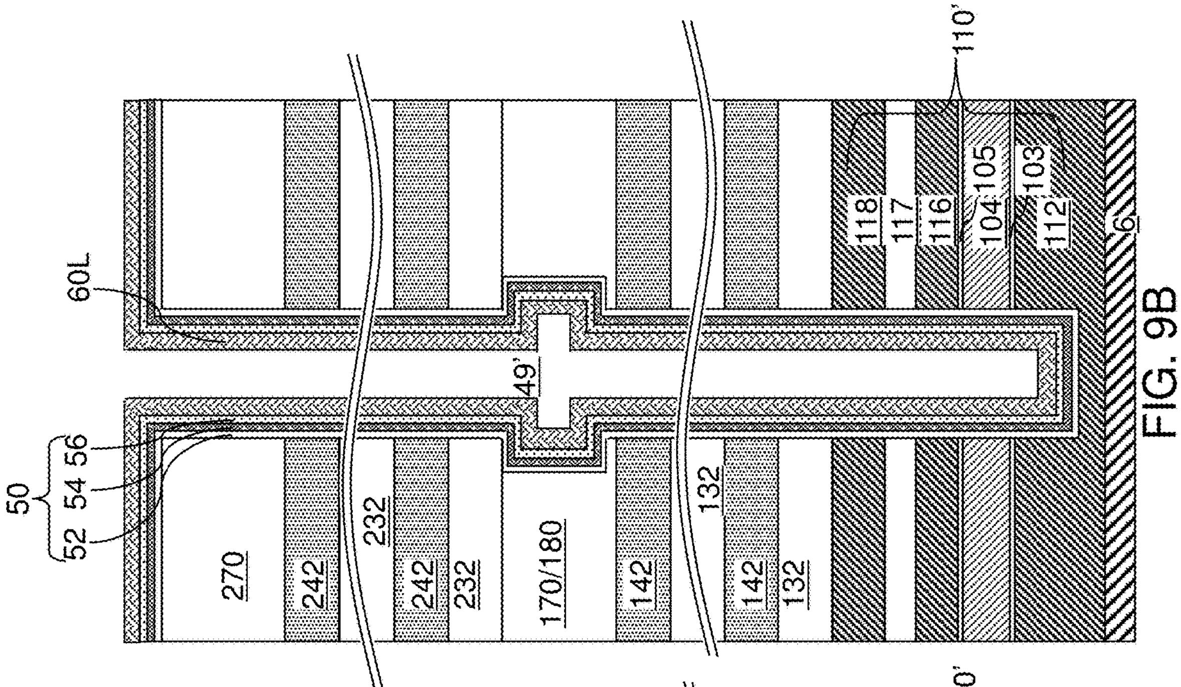
FIGS. 9A-9D illustrate sequential vertical cross-sectional views of a memory opening during formation of a memory opening fill structure according to an embodiment of the present disclosure.
Figure 9A:
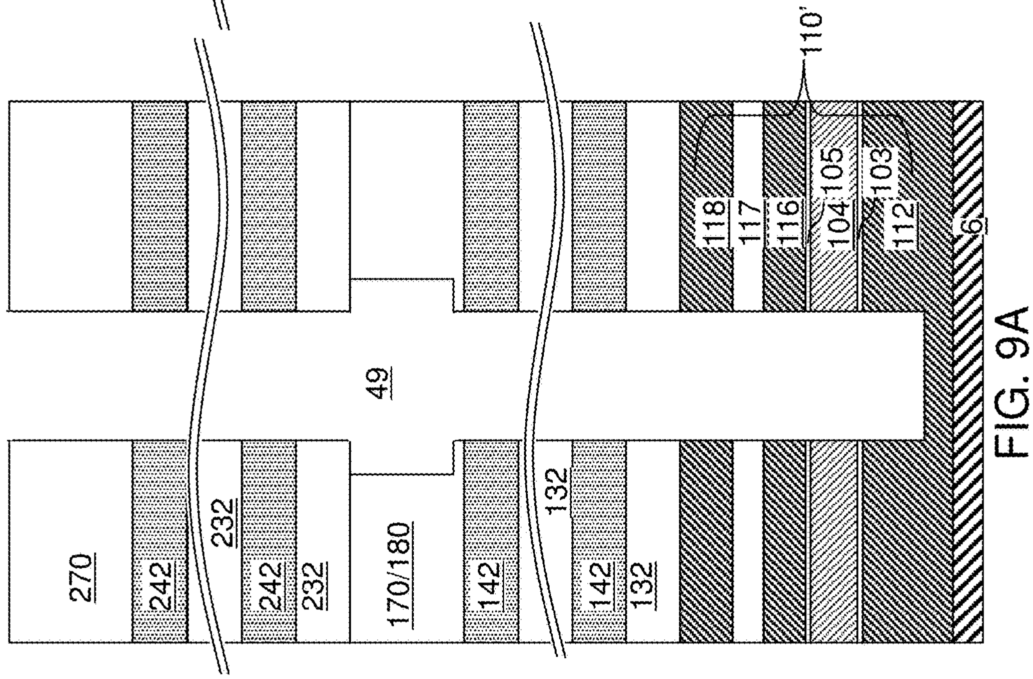

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 9D:
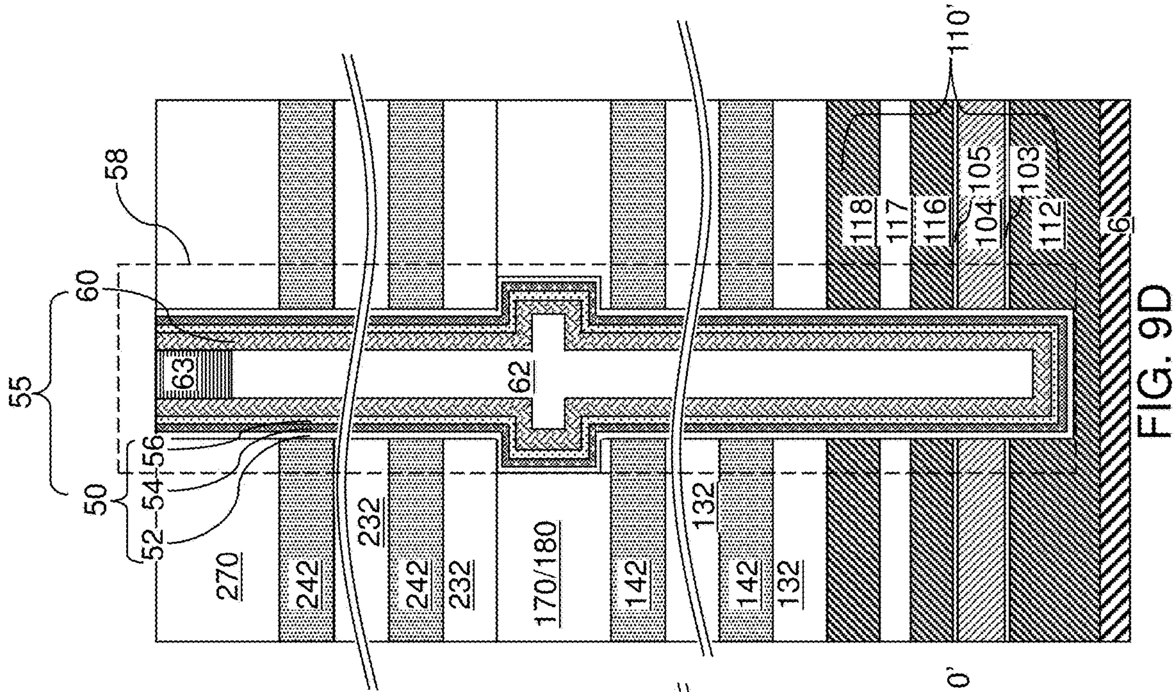
Figure 9C:
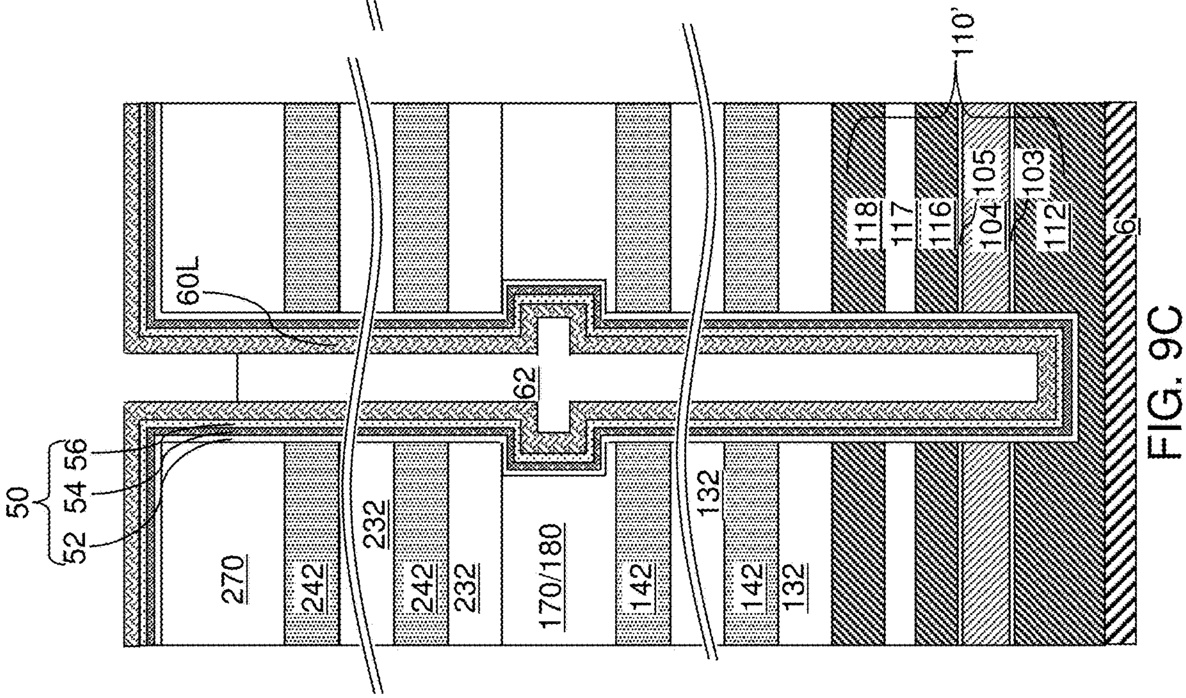

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
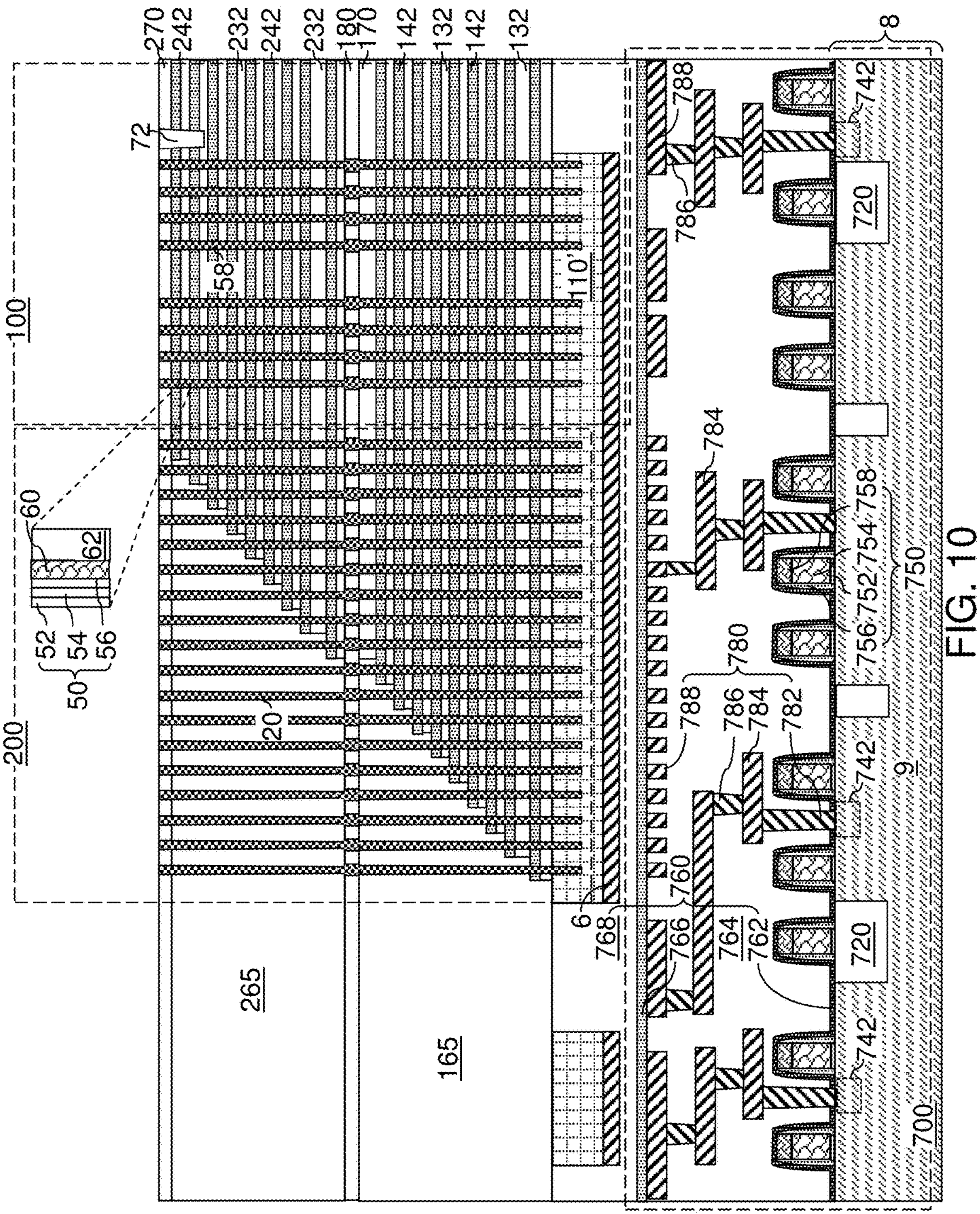
FIG. 10 is a vertical cross-sectional view of the first exemplary structure after formation of memory opening fill structures and support pillar structures according to an embodiment of the present disclosure.

Referring to FIG. 10, the first exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
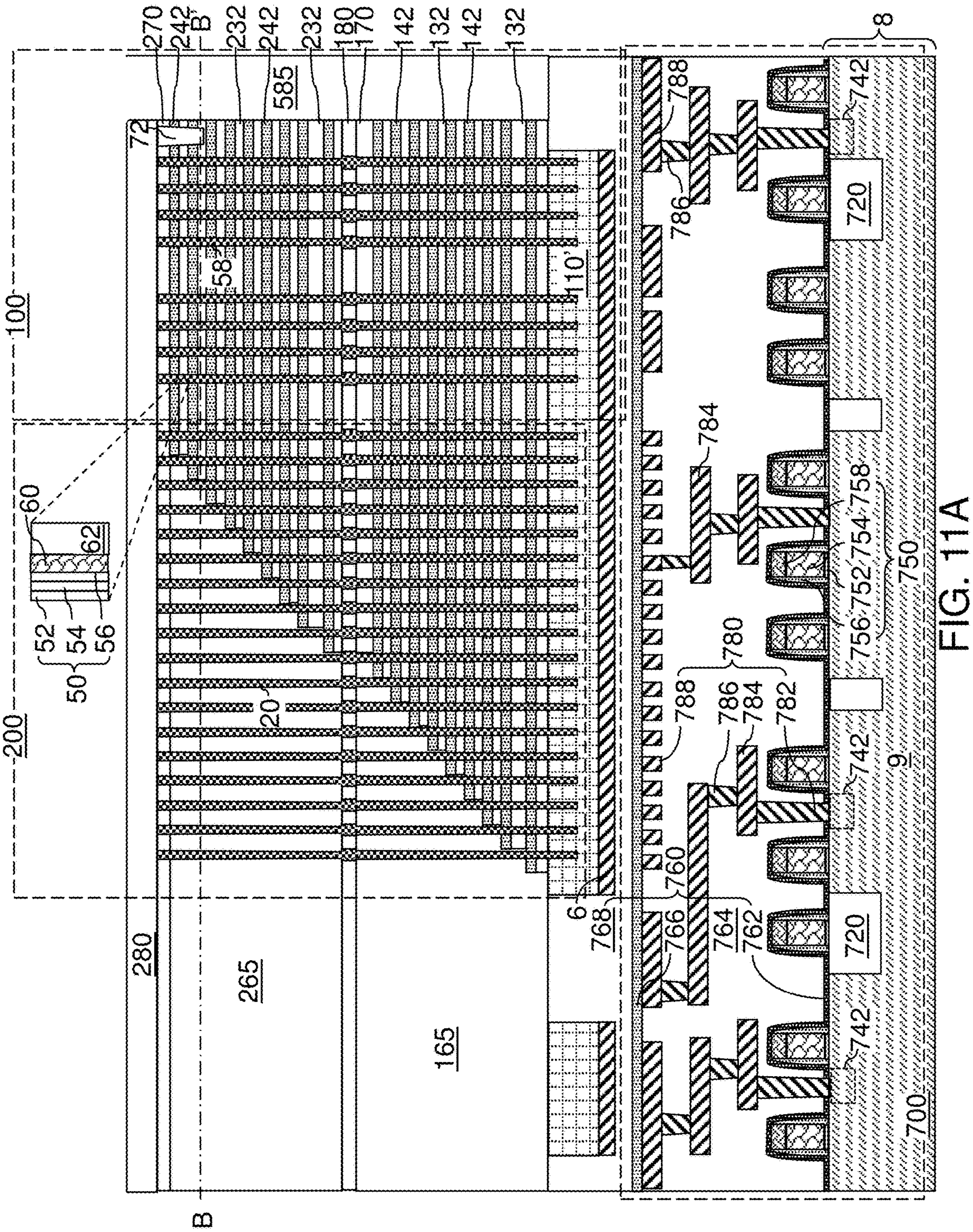
FIG. 11A is a vertical cross-sectional view of the first exemplary structure after formation of pillar cavities according to an embodiment of the present disclosure.
Figure 11B:
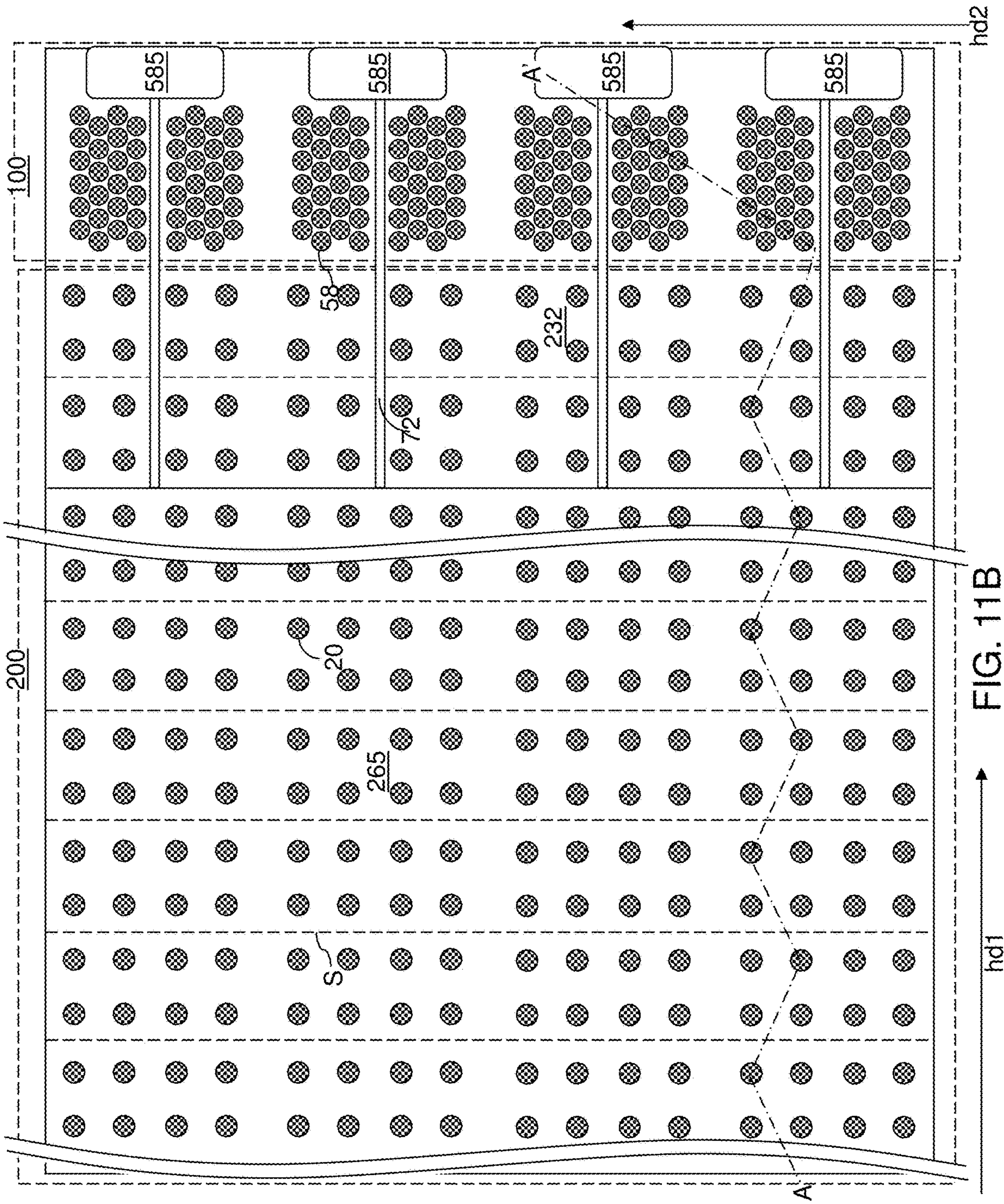
FIG. 11B is a horizontal cross-sectional view of the first exemplary structure along the horizontal plane B-B' of FIG. 11A. The hinged vertical plane A-A' corresponds to the plane of the vertical cross-sectional view of FIG. 11A.

Referring to FIGS. 11A and 11B, a contact-level dielectric layer 280 may be formed over the second-tier structure (232, 242, 270, 265, 72). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form discrete openings within the area of the memory array region 100 in which memory opening fill structures 58 are not present. An anisotropic etch may be performed to form vertical-interconnection-region cavities 585 having substantially vertical sidewalls that extend through the contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical-interconnection-region cavity 585. The photoresist layer may be removed, for example, by ashing.

Figure 12:
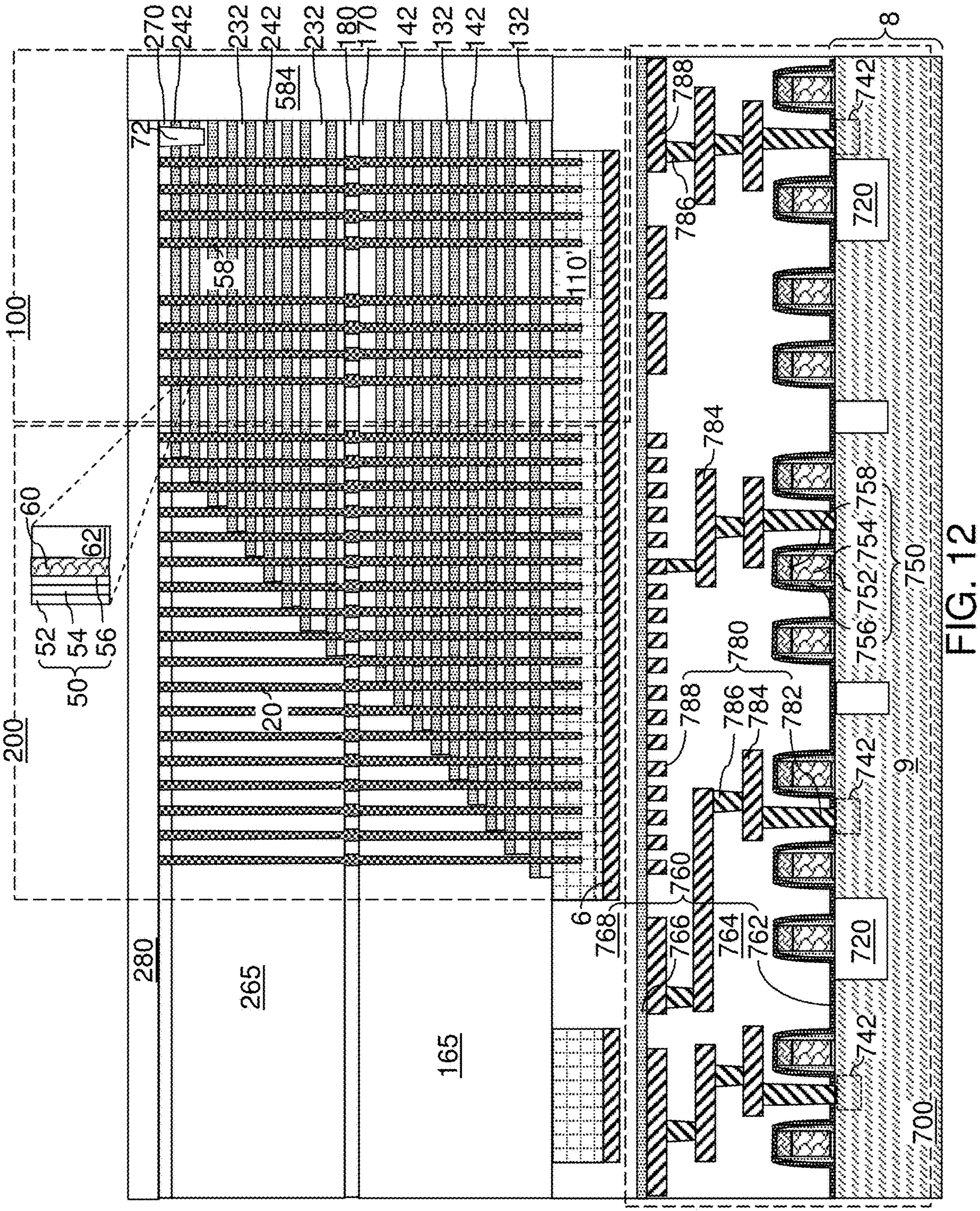
FIG. 12 is a vertical cross-sectional view of the first exemplary structure after formation of dielectric pillar structures according to an embodiment of the present disclosure.

Referring to FIG. 12, a dielectric material such as silicon oxide may be deposited in the vertical-interconnection-region cavities 585 by a conformal deposition process (such as low pressure chemical vapor deposition) or a self-planarizing deposition process (such as spin coating). Excess portions of the deposited dielectric material may be removed from above the top surface of the contact-level dielectric layer 280 by a planarization process. Remaining portions of the dielectric material in the vertical-interconnection-region cavities 585 constitute interconnection region dielectric fill material portions 584.

Figure 13A:
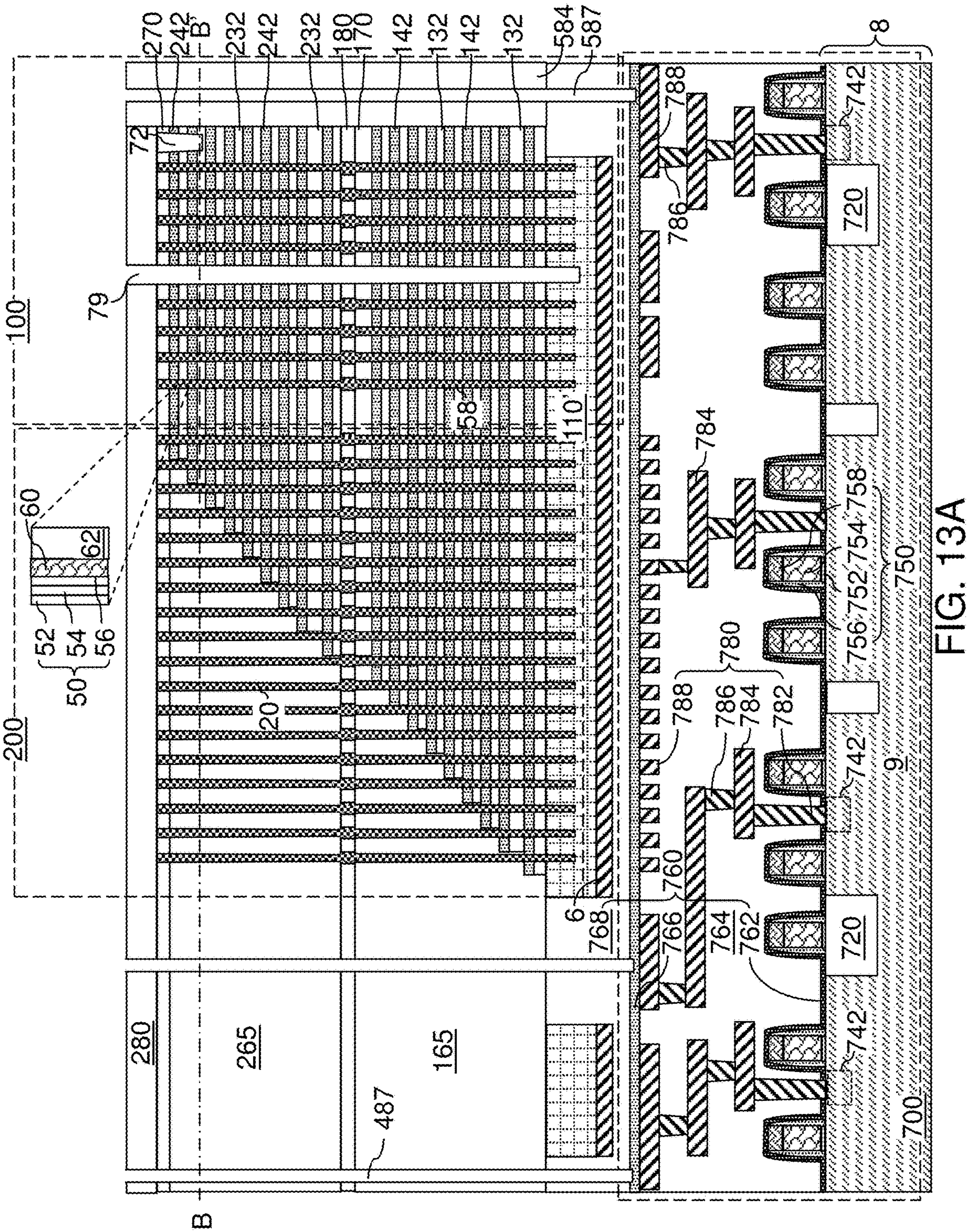
FIG. 13A is a vertical cross-sectional view of the first exemplary structure after formation of a contact-level dielectric layer and backside trenches according to an embodiment of the present disclosure.
Figure 13B:
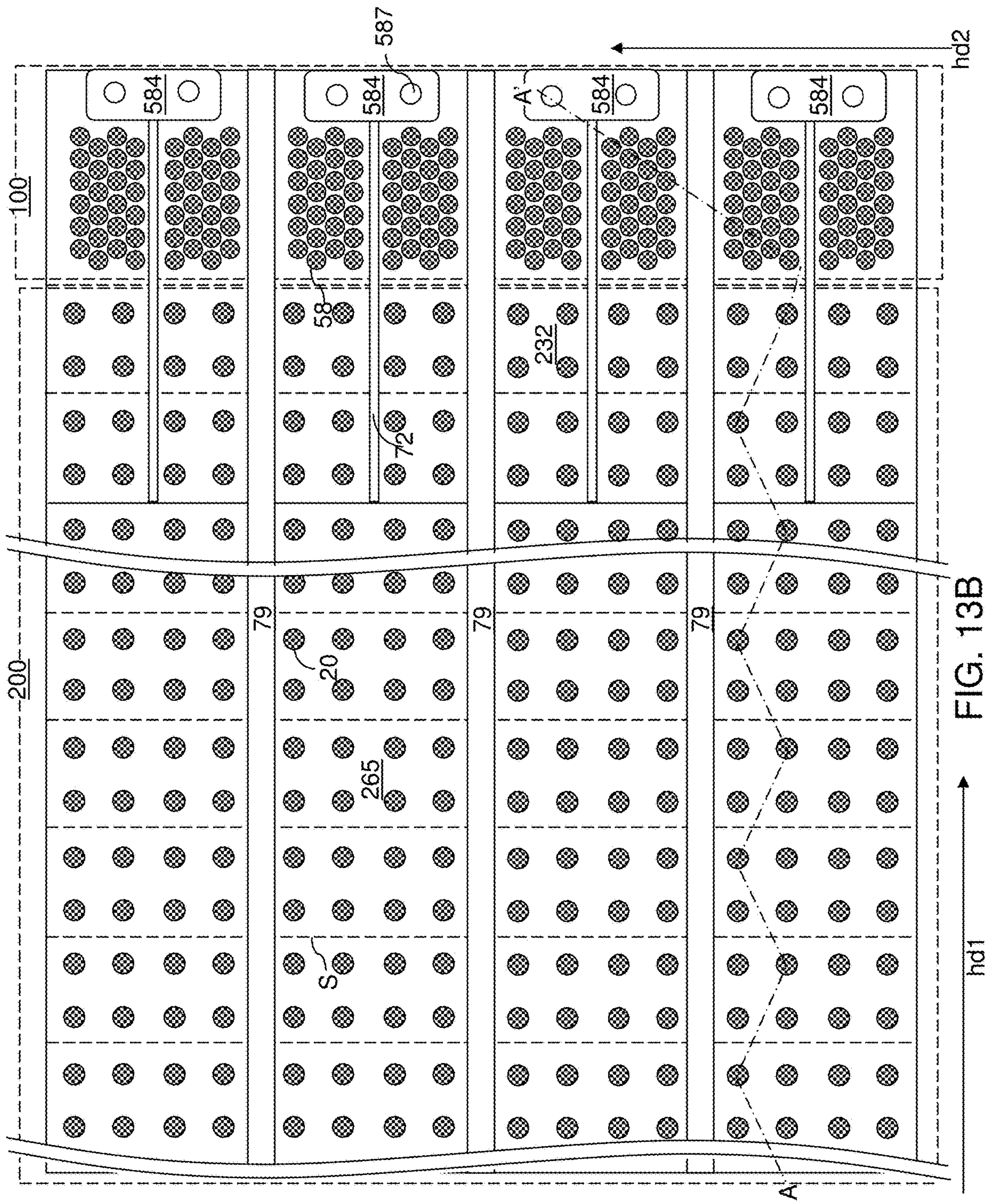
FIG. 13B is a horizontal cross-sectional view of the first exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer may be applied over the contact-level dielectric layer 280 and may be lithographically patterned to form openings therein. The openings comprise elongated openings that extend along the first horizontal direction hd1 between clusters of memory opening fill structures 58, and discrete openings that are formed over the retro-stepped dielectric material portions (165, 265) and over the interconnection region dielectric fill material portions 584.

An anisotropic etch process can be performed to transfer the pattern of the openings through underlying material portions. Backside trenches 79 may be formed by transferring the pattern in the photoresist layer (not shown) through the contact-level dielectric layer 280, the second-tier structure (232, 242, 270, 265, 72), and the first-tier structure (132, 142, 170, 165), and into the in-process source-level material layers 110'. Portions of the contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The anisotropic etch process transfers the pattern of discrete openings over the interconnection region dielectric fill material portions 584 through the interconnection region dielectric fill material portions 584. Through-memory-level via cavities 587 can be formed through the interconnection region dielectric fill material portions 584 and through openings in the in-process source-level material layers 110' down to a top surface of a respective lower-level metal interconnect structure 780. Peripheral-region via cavities 487 are formed through the retro-stepped dielectric material portions (265, 165) and through openings in the in-process source-level material layers 110' down to a top surface of a respective lower-level metal interconnect structure 780. The photoresist layer can be subsequently removed, for example, by ashing.

Figure 14:
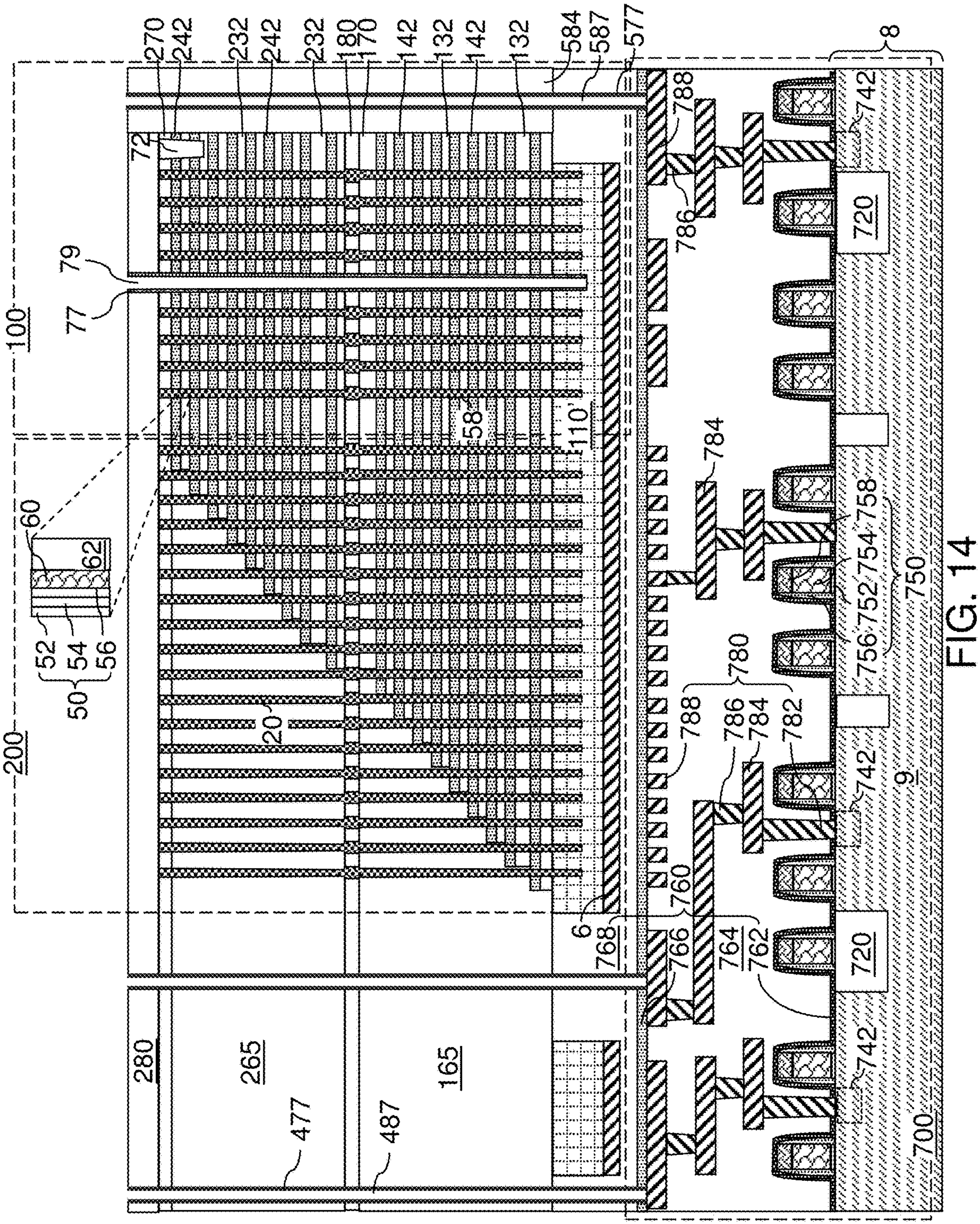
FIG. 14 is a vertical cross-sectional view of the first exemplary structure after formation of backside trench spacers according to an embodiment of the present disclosure.
Figure 15A:
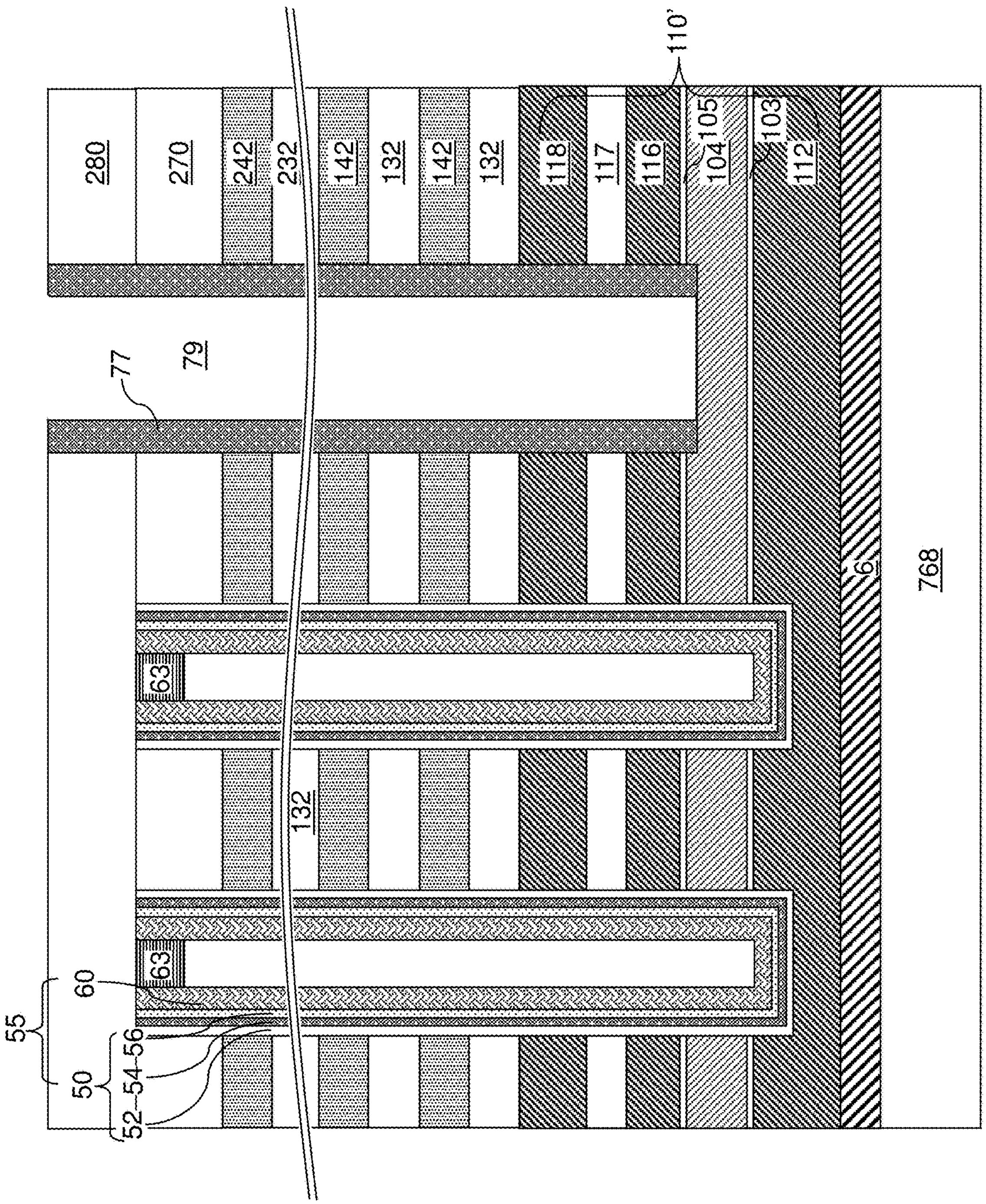
FIGS. 15A-15E illustrate sequential vertical cross-sectional views of memory opening fill structures and a backside trench during formation of source-level material layers according to an embodiment of the present disclosure.

Referring to FIGS. 14 and 15A, a backside trench spacer 77 may be formed on sidewalls of each backside trench 79. For example, a conformal spacer material layer may be deposited in the backside trenches 79 and over the contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 15B:
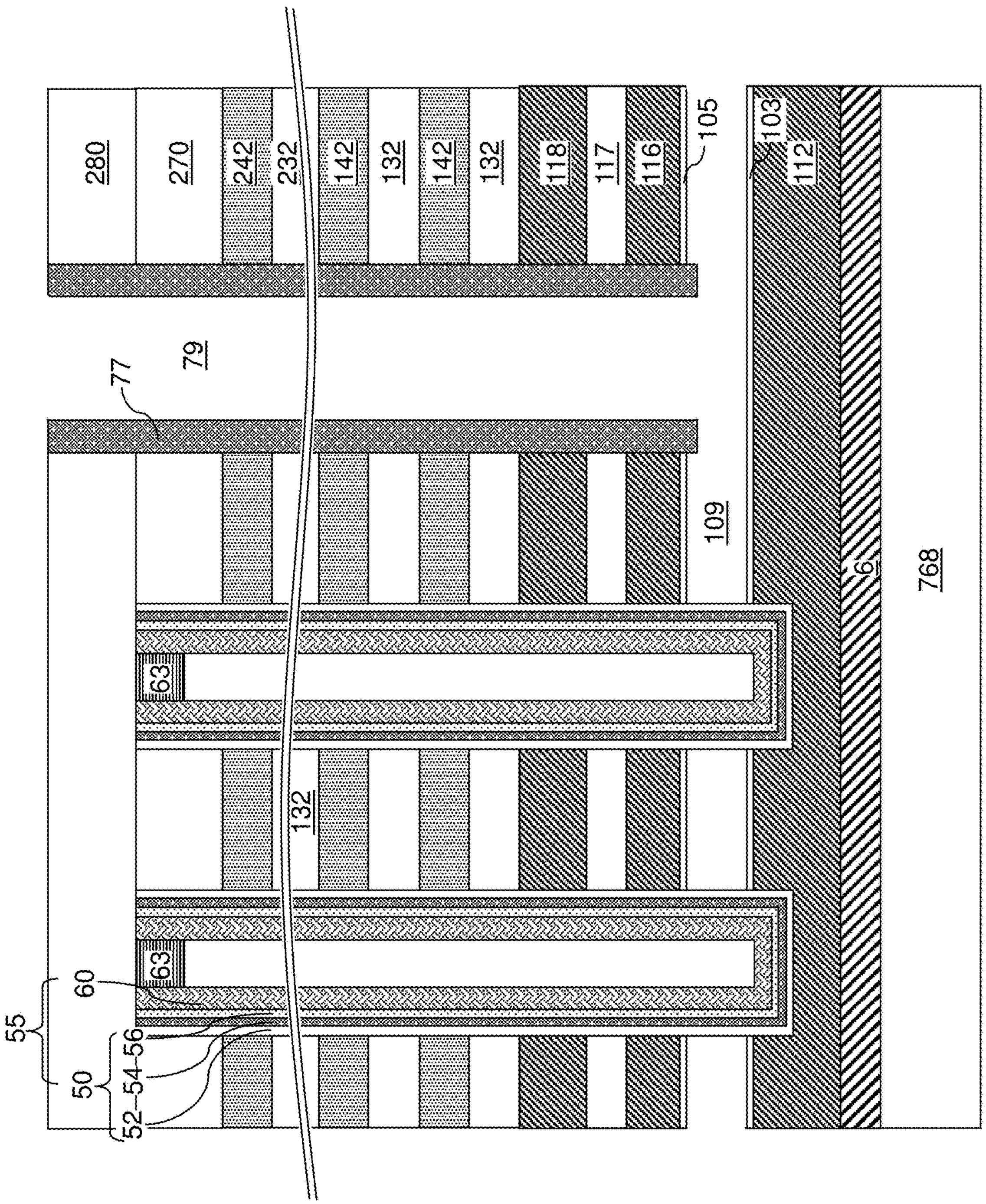

Referring to FIG. 15B, an etchant that etches the material of the source-level sacrificial layer 104 selective to the materials of the first alternating stack (132, 142), the second alternating stack (232, 242), the first and second insulating cap layers (170, 270), the contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 15C:
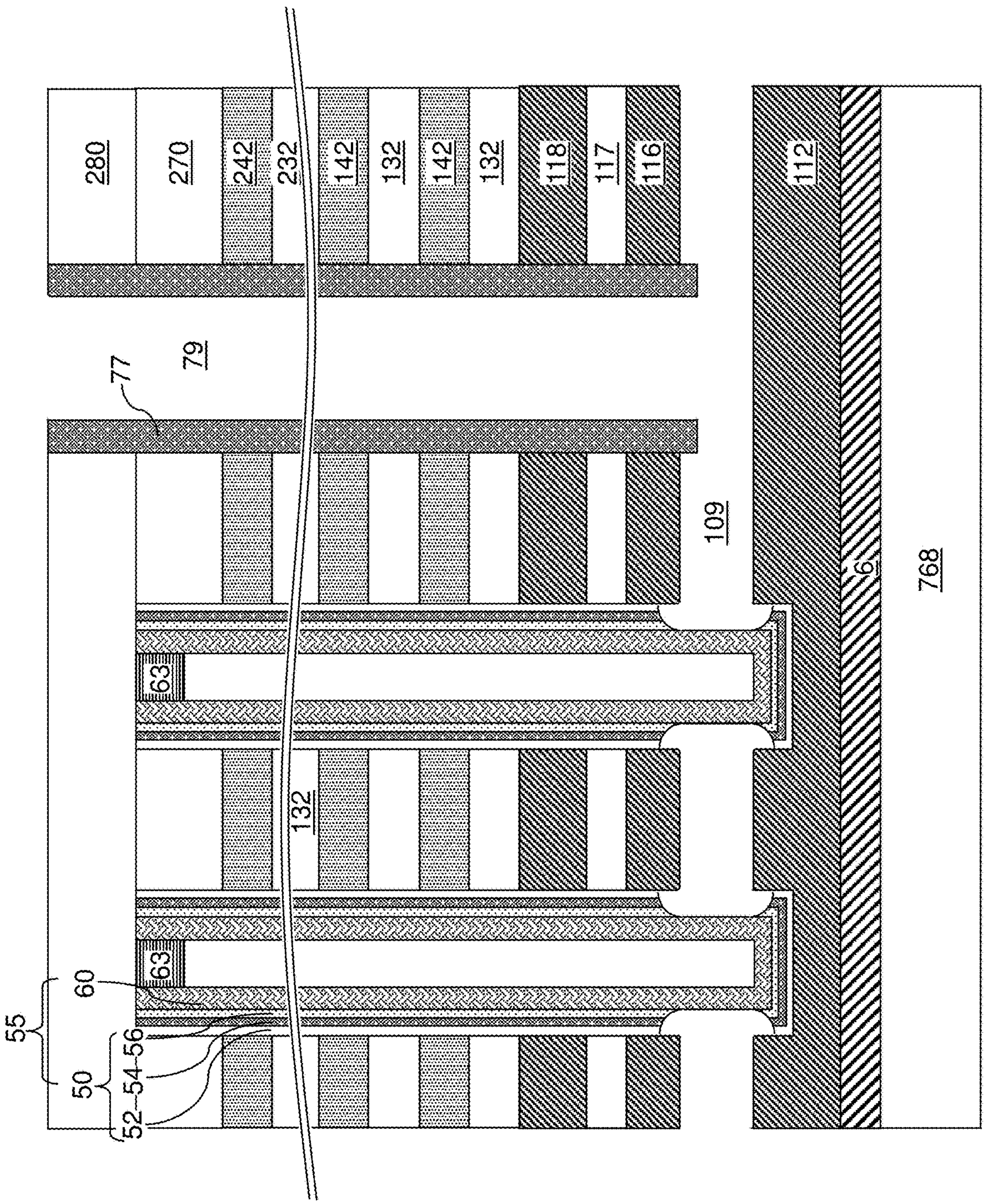

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15D:
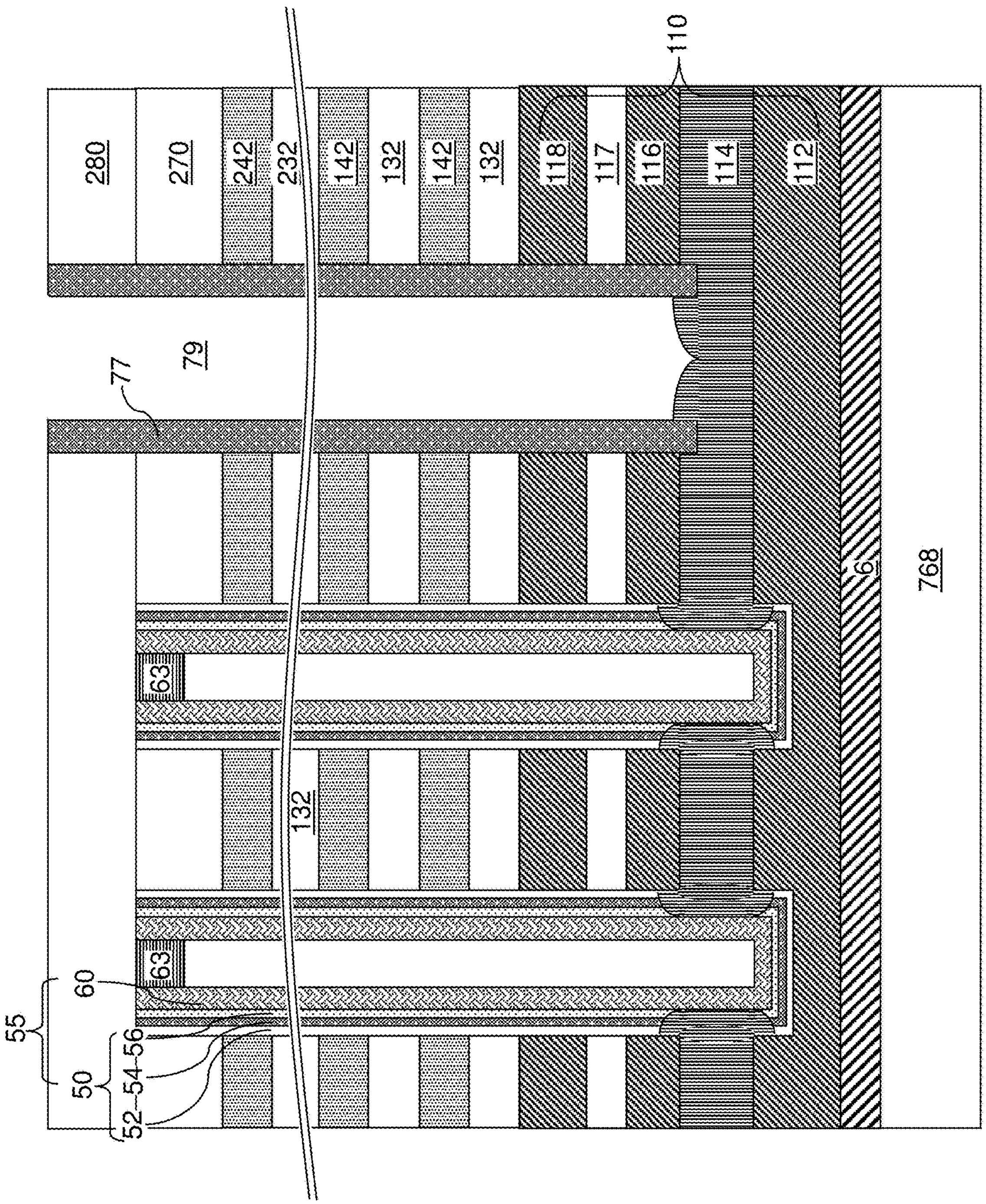

Referring to FIG. 15D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 15E:
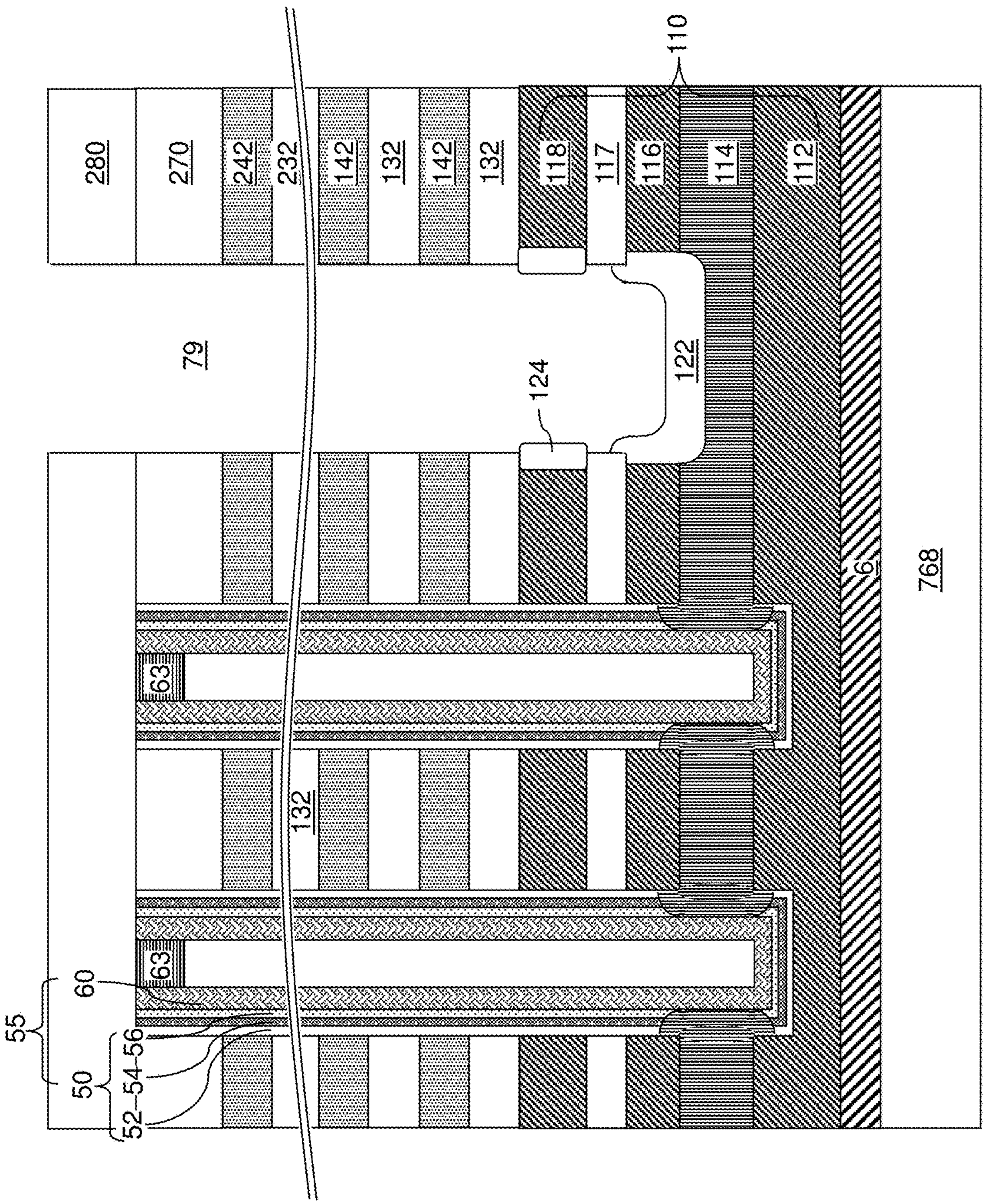
Figure 16:
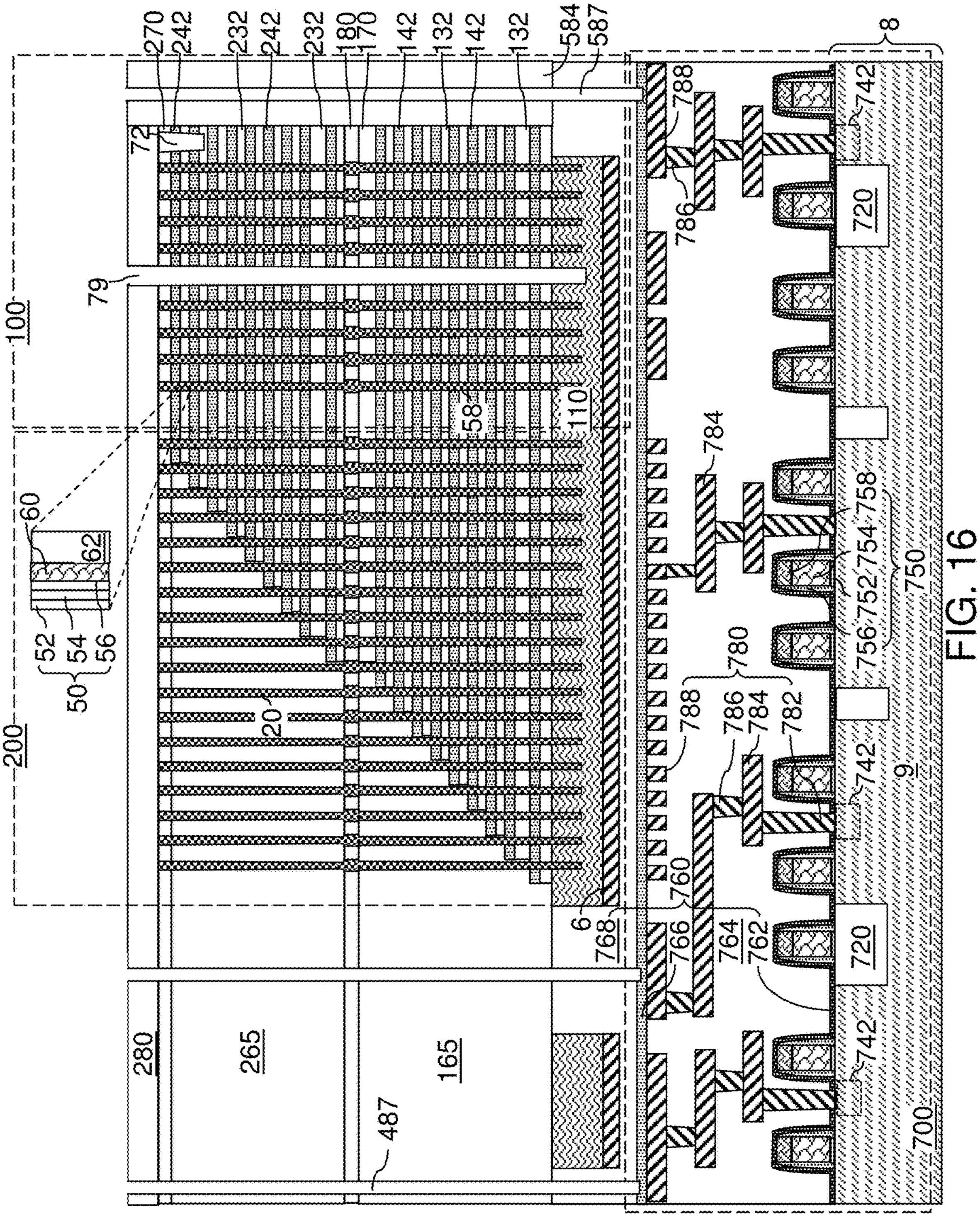
FIG. 16 is a vertical cross-sectional view of the first exemplary structure after formation of source-level material layers according to an embodiment of the present disclosure.

Referring to FIGS. 15E and 16, the backside trench spacers 77 may be removed selective to the insulating layers (132, 232), the first and second insulating cap layers (170, 270), the contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 17A:
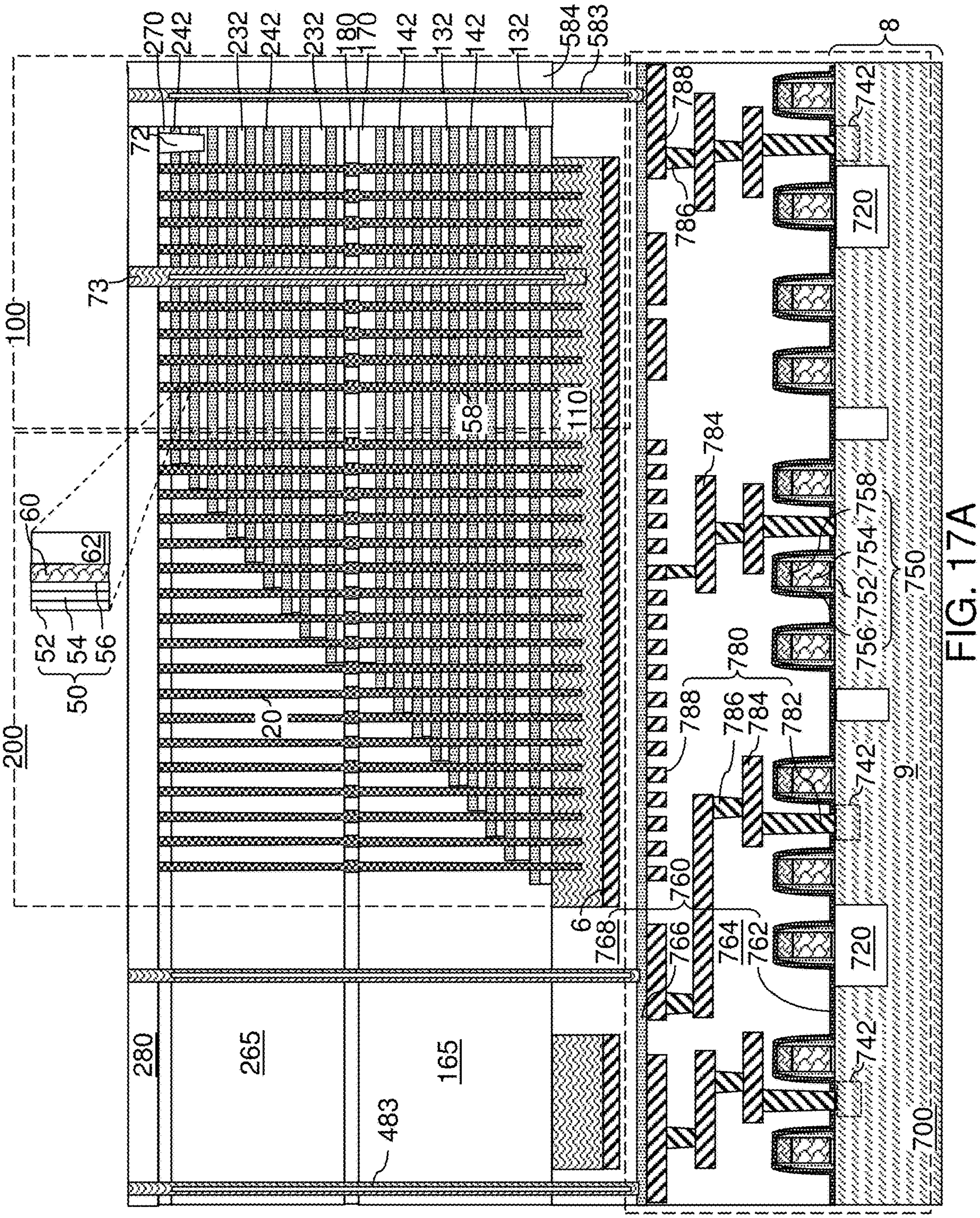
FIG. 17A is a vertical cross-sectional view of the first exemplary structure after formation of various sacrificial fill structures according to an embodiment of the present disclosure.

Referring to FIG. 17A and according to an aspect of the present disclosure, various sacrificial fill structures (73, 583, 483) can be formed in the backside trenches 79, the through-memory-level via cavities 587, and the peripheral-region via cavities 487 by depositing a sacrificial fill material therein. According to an aspect of the present disclosure, the sacrificial fill material comprises a semiconductor material that changes etch resistance upon doping. In an illustrative example, the sacrificial fill material comprises a semiconductor material such as amorphous silicon, polysilicon, an amorphous silicon-germanium alloy, or a polycrystalline silicon-germanium alloy. In this case, upon doping of the semiconductor material with boron, the etch rate of the semiconductor material can decrease by a factor of at least 100 in a wet etch solution including trimethyl-2 hydroxyethyl ammonium hydroxide (TMY).

Excess portions of the sacrificial fill material may be removed from above the horizontal plane including the top surface of the contact-level dielectric layer 280. Each remaining portion of the sacrificial fill material filling a backside trench 79 constitutes a semiconductor backside trench fill structure 73. Each remaining portion of the sacrificial fill material filling a through-memory-level via cavity 587 constitutes a sacrificial through-memory-level via cavity fill structure 583. Each remaining portion of the sacrificial fill material filling a peripheral-region via cavity 487 constitutes a sacrificial peripheral-region via cavity fill structure 483. One or more of the semiconductor backside trench fill structures 73, the sacrificial through-memory-level via cavity fill structures 583, and the sacrificial peripheral-region via cavity fill structures 483 may comprise a void therein. Top surfaces of the semiconductor backside trench fill structures 73, the sacrificial through-memory-level via cavity fill structures 583, and the sacrificial peripheral-region via cavity fill structures 483 can be formed within the horizontal plane including the top surface of the contact-level dielectric layer 280. Generally, a semiconductor backside trench fill structure 73 comprising an undoped semiconductor material may be formed in each of the backside trenches 79. An undoped semiconductor material refers to a semiconductor material in which the density of dopants (such as boron, phosphorus or arsenic) is less than $1.0\times10^{14}/cm^3$.

Figure 17B:
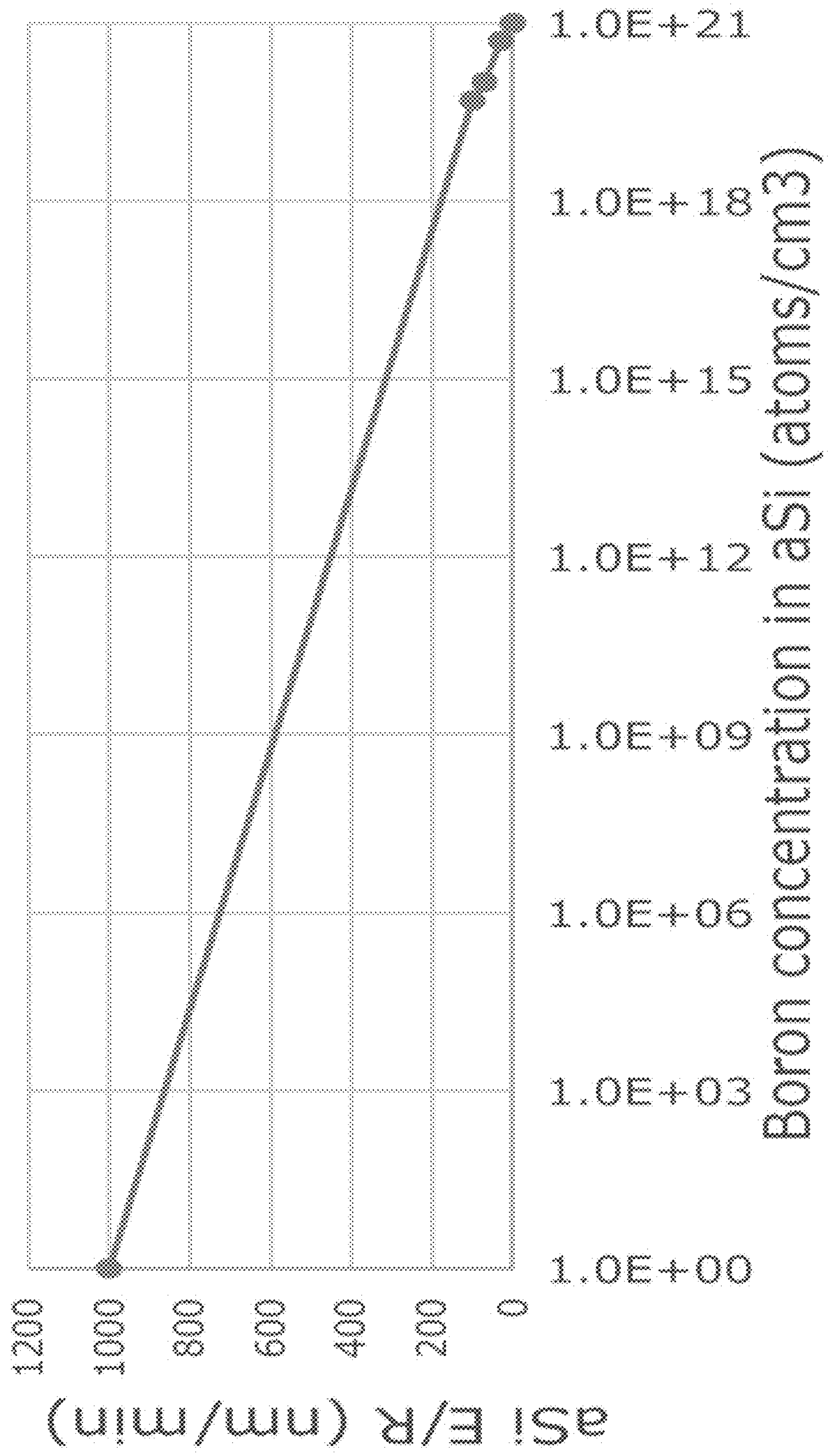
FIG. 17B is a graph illustrating the dependence of the etch rate of boron-doped amorphous silicon in TMY.

Referring to FIG. 17B, the etch rate of boron-doped amorphous silicon is illustrated as a function of atomic concentration of boron therein. The etch rate of boron-doped amorphous silicon in TMY including boron at an atomic concentration greater than $1.0\times10^{21}/cm^3$ can be less than the etch rate of amorphous silicon including boron at an atomic concentration less than $1.0\times10^{14}/cm^3$ by a factor of 100 or more, such as a factor of 300 to 1000.

Figure 18A:
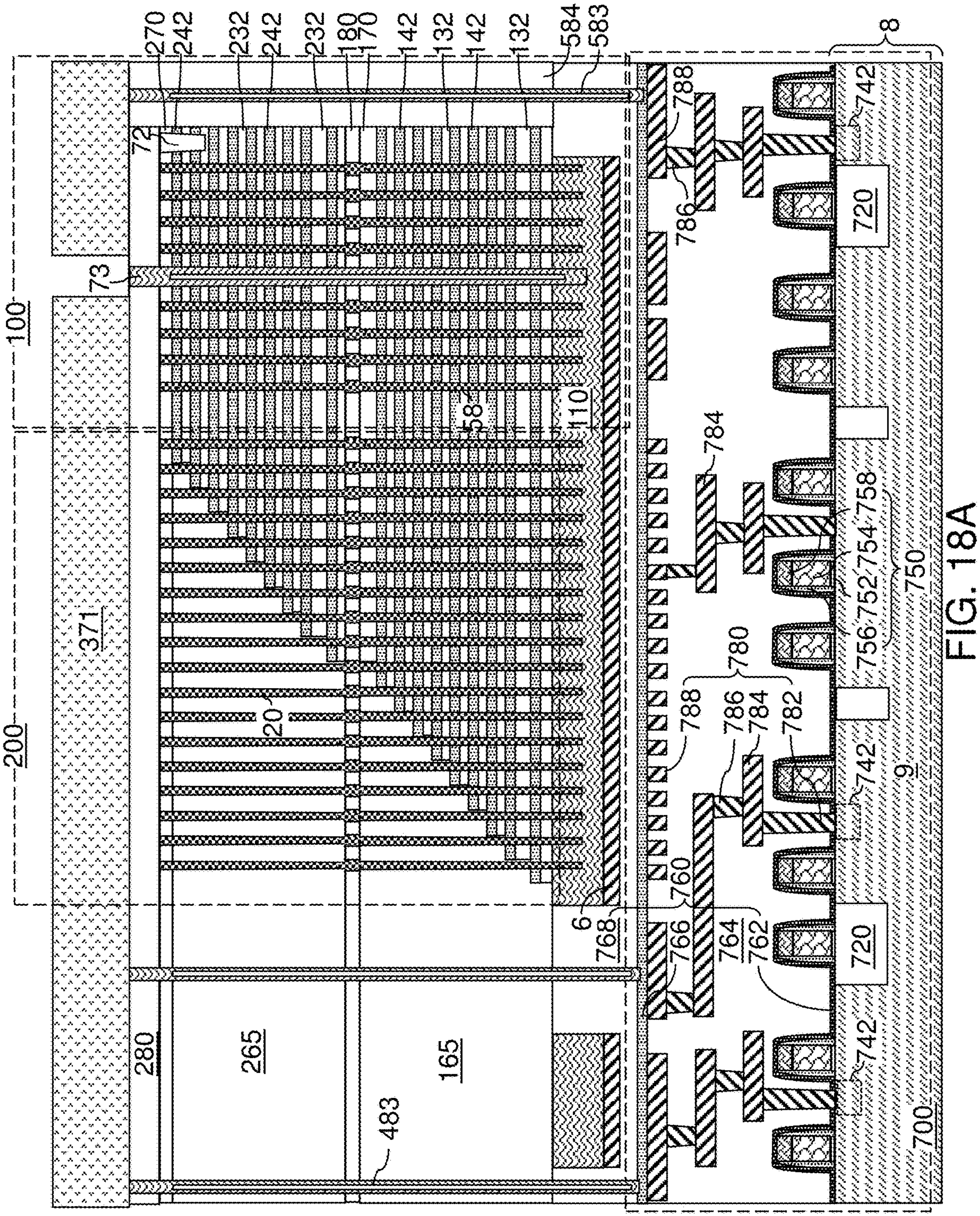
FIG. 18A is a vertical cross-sectional view of the first exemplary structure after formation of a first patterned photoresist layer according to an embodiment of the present disclosure.
Figure 18B:
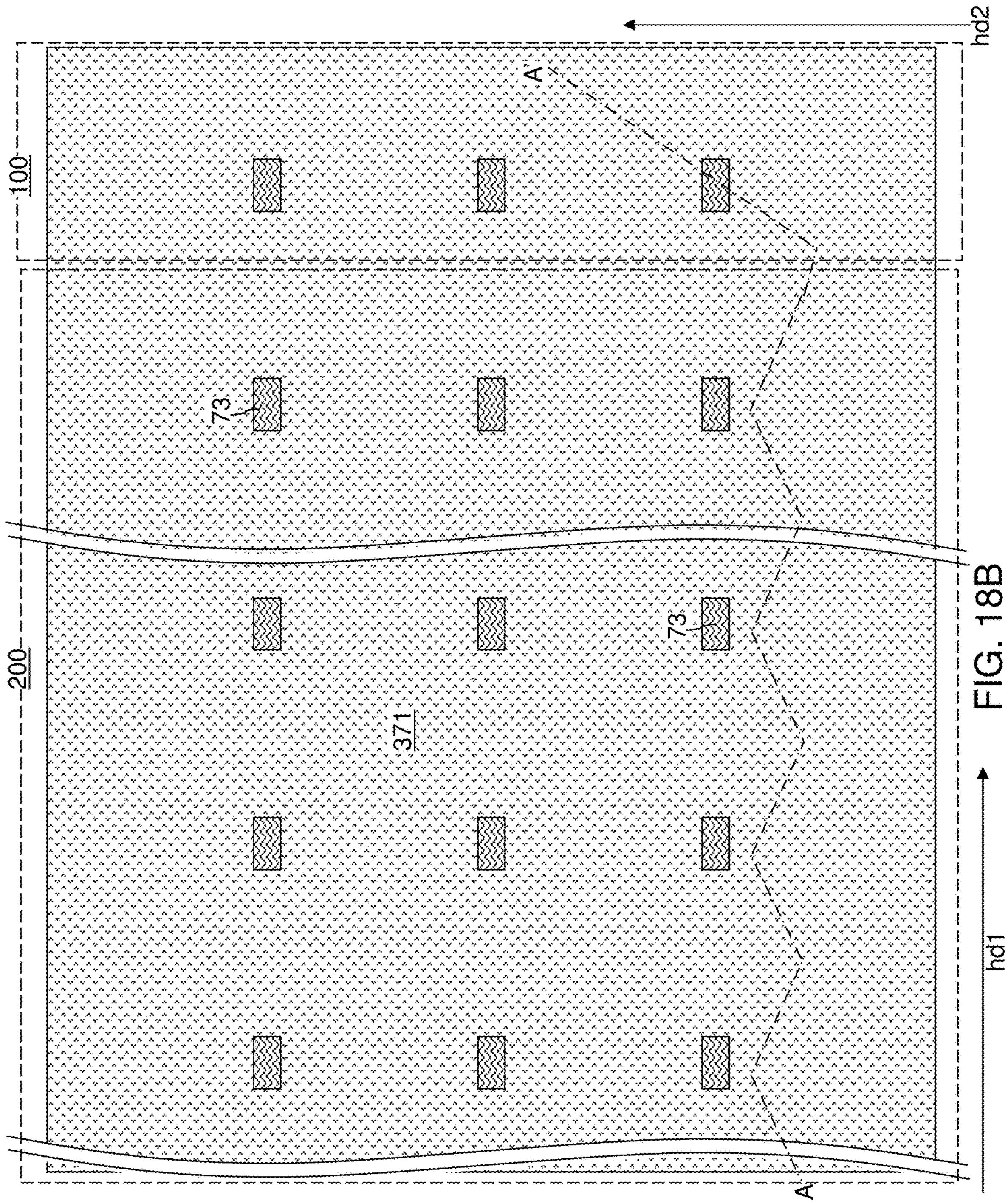
FIG. 18B is a top-down view of the first exemplary structure of FIG. 18A. The hinged vertical plane A-A' corresponds to the plane of the vertical cross-sectional view of FIG. 18A.

Referring to FIGS. 18A and 18B, a first photoresist layer 371 can be applied over the contact-level dielectric layer 280, and can be lithographically patterned to form an array of openings over discrete areas of the semiconductor backside trench fill structures 73. The array of openings in the first patterned photoresist layer 371 may comprise rows of rectangular openings arranged with a periodicity along the first horizontal direction hd1. In one embodiment, the periodicity of the rectangular openings over each semiconductor backside trench fill structure 73 may be in a range from 3 times the width of the underlying semiconductor backside trench fill structure 73 to 100 times the width of the underlying semiconductor backside trench fill structure 73, and/or may be in a range from 6 times the width of the underlying semiconductor backside trench fill structure 73 to 50 times the width of the underlying semiconductor backside trench fill structure 73. The length of each opening in the first patterned photoresist layer 371 may be in a range from 0.5 times the width of the underlying semiconductor backside trench fill structure 73 to 5 times the width of the underlying semiconductor backside trench fill structure 73, and/or may be in a range from 1 times the width of the underlying semiconductor backside trench fill structure 73 to 2 times the width of the underlying semiconductor backside trench fill structure 73. In one embodiment, a two-dimensional periodic array of openings can be formed in the first patterned photoresist layer 371 such that a top surface of a semiconductor backside trench fill structure 73 is physically exposed at the bottom each of opening through the first patterned photoresist layer 371. The sacrificial through-memory-level via cavity fill structures 583 and the sacrificial peripheral-region via cavity fill structures 483 are covered with the first patterned photoresist layer 371.

Figure 19:
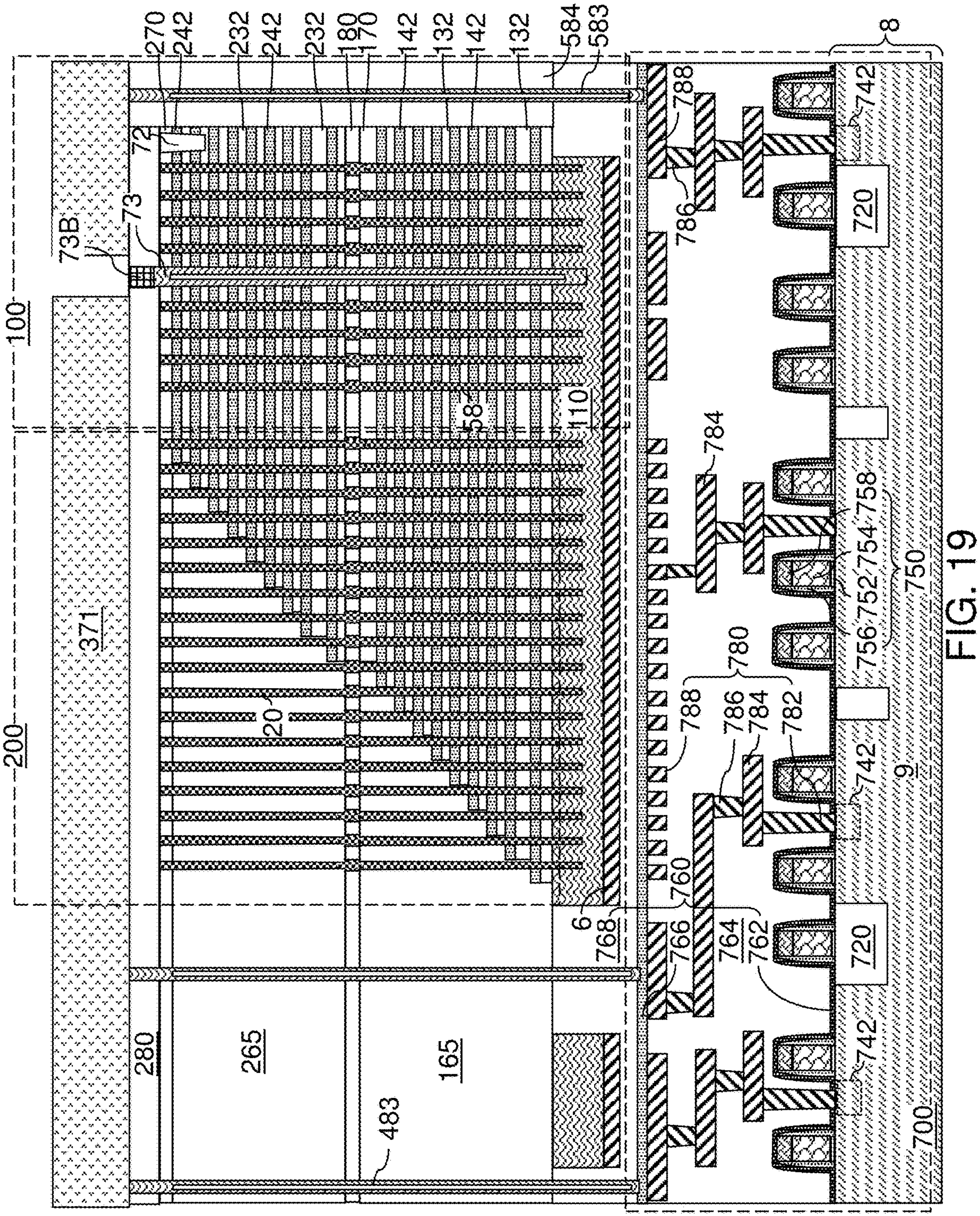
FIG. 19 is a vertical cross-sectional view of the first exemplary structure after formation of bridge structures by implantation of boron into portions of semiconductor backside trench fill structures according to an embodiment of the present disclosure.

Referring to FIG. 19, dopant atoms that reduce the etch rate of the undoped semiconductor material of the semiconductor backside trench fill structures 73 can be provided through the openings in the first patterned photoresist layer 371 into discrete unmasked surface portions of the semiconductor backside trench fill structures 73. The dopant atoms may be provided by ion implantation, gas phase diffusion doping or any other suitable doping method. For example, the semiconductor backside trench fill structures 73 may comprise amorphous silicon, polysilicon, an amorphous silicon germanium alloy, or a polycrystalline silicon-germanium alloy that are undoped, i.e., including electrical dopants at an atomic concentration less than $1.0\times10^{14}/cm^3$, and the dopants implanted into the discrete unmasked surface portions of the semiconductor backside trench fill structures 73 may comprise boron. In one embodiment, the atomic concentration of boron atoms in the implanted regions of the semiconductor backside trench fill structures 73 may be in a range from $1.0\times10^{19}/cm^3$ to $5.0\times10^{21}/cm^3$, such as $1.0\times10^{21}/cm^3$ to $5.0\times10^{21}/cm^3$.

The implanted portions of the semiconductor backside trench fill structures 73 including dopants atoms at an atomic concentration of at least $1.0\times10^{19}/cm^3$, such as at least $1.0\times10^{21}/cm^3$ are herein referred to as bridge structures 73B, which differ in material composition from the material composition of the unimplanted portions of the semiconductor backside trench fill structures 73 by the presence of the implanted dopants. In one embodiment, the bridge structures 73B can be formed by implantation of boron atoms into discrete surface portions of semiconductor (e.g., silicon) backside trench fill structures 73.

Generally, at least one discrete surface portion of the semiconductor backside trench fill structure 73 can be converted into a respective set of one or more bridge structures 73B within each of the backside trenches 79 by locally implanting boron atoms. In one embodiment, a set of at least one bridge structure 73B comprising a boron-doped semiconductor material (e.g., boron doped silicon) can be formed within each of the backside trenches 79. In one embodiment, the at least one bridge structure 73B consists essentially of boron-doped silicon or a boron-doped silicon-germanium alloy.

Generally, a pair of contact-level dielectric material portions (such as a pair of portions of the contact-level dielectric layer 280 that are laterally spaced apart by a backside trench 79) can overlie a respective one of the pair of alternating stacks of insulating layers (132, 232) and spacer material layers (such as sacrificial material layers (142, 242), and can be laterally spaced apart by the backside trench 79. In this case, the at least one bridge structure 73B may contact respective sidewall segments of the pair of contact-level dielectric material portions. In one embodiment, the at least one bridge structure 73B comprises a respective top surface located within a horizontal plane including top surfaces of the pair of contact-level dielectric material portions (such as top surfaces of a pair of portions of the contact-level dielectric layer 280 that are laterally spaced apart by a backside trench 79). In one embodiment, each bottom surface of the at least one bridge structure 73B may be located within a horizontal plane located above a horizontal plane including top surfaces of topmost spacer material layers (such as the topmost second sacrificial material layer 242) within the pair of alternating stacks.

In one embodiment, each bridge structure 73B may comprise a pair of lengthwise sidewalls that contact a pair of contact-level dielectric material portions (such as two portions of the contact-level dielectric layer 280 that are laterally spaced apart along the second horizontal direction (e.g., bit line direction) hd2 by a backside trench 79) and a pair of widthwise sidewalls that laterally extend along the second horizontal direction hd2 and adjoined to the pair of lengthwise sidewalls. The widthwise sidewalls of the at least one bridge structure 73B that contact a semiconductor backside trench fill structure 73 are parallel to the second horizontal direction hd2 that is perpendicular to the first horizontal direction (e.g., word line direction) hd1. In one embodiment, the at least one bridge structure 73B comprises a respective lengthwise sidewalls that are parallel to the first horizontal direction hd1 and adjoined to a respective pair of widthwise sidewalls that are parallel to the second horizontal direction hd2.

In one embodiment, the plurality of bridge structures 73B may be formed such that the plurality of bridge structures 73B comprises a periodic one-dimensional array of bridge structures 73B having a periodicity along the first horizontal direction hd1. The first patterned photoresist layer 371 can be subsequently removed, for example, by ashing.

Figure 20A:
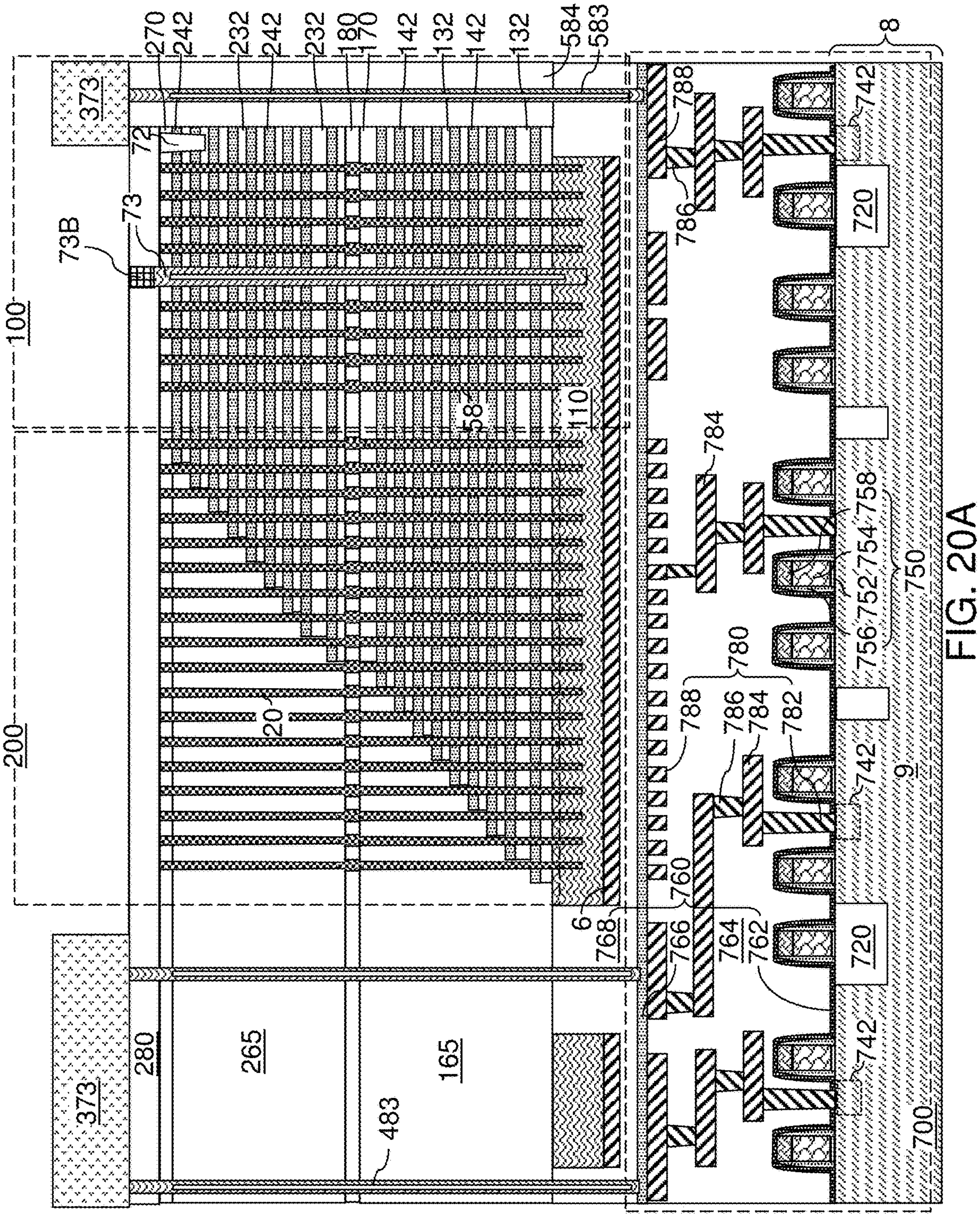
FIG. 20A is a vertical cross-sectional view of the first exemplary structure after formation of a second patterned photoresist layer according to an embodiment of the present disclosure.
Figure 20B:
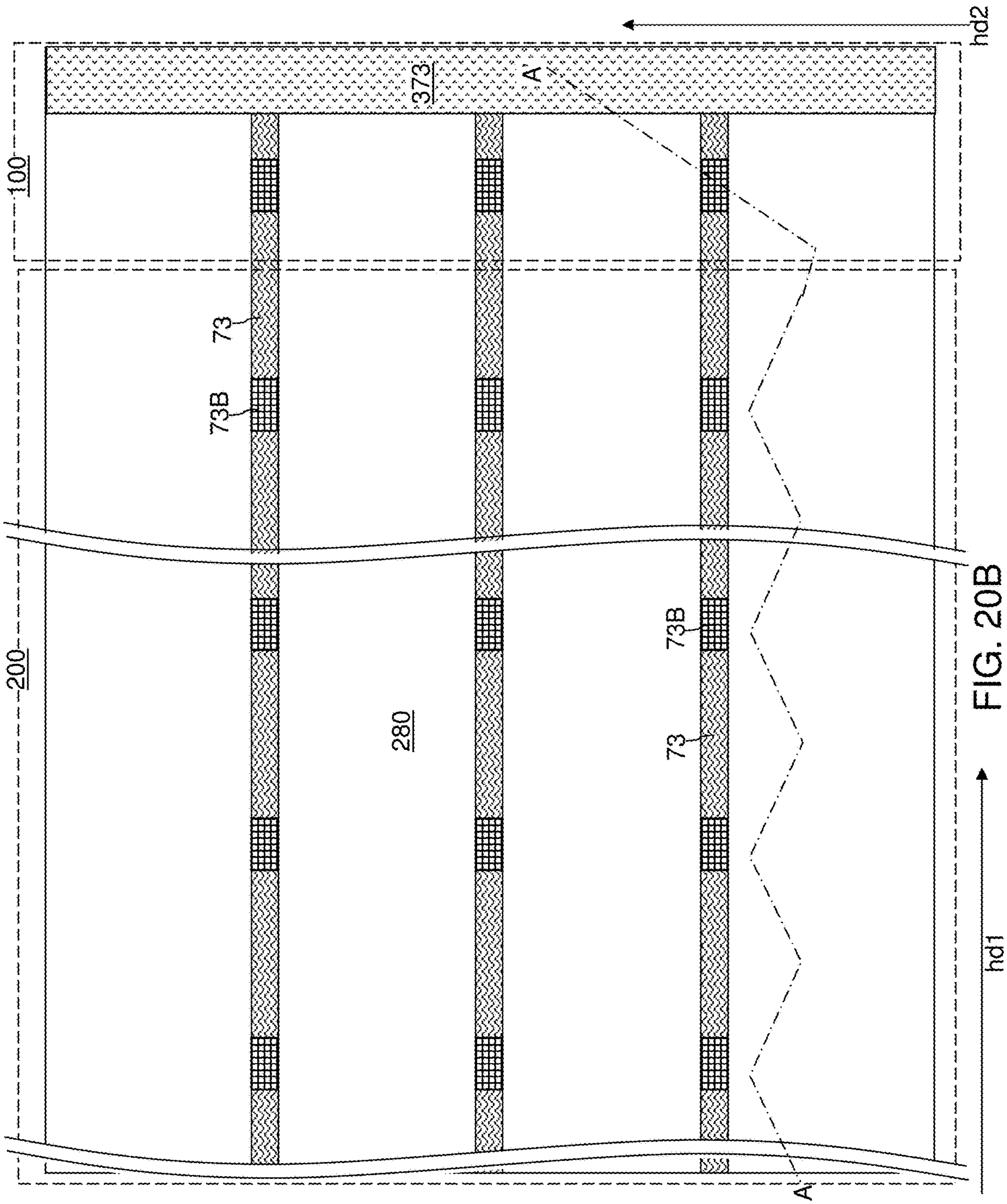
FIG. 20B is a top-down view of the first exemplary structure of FIG. 20A. The hinged vertical plane A-A' corresponds to the plane of the vertical cross-sectional view of FIG. 20A.

Referring to FIGS. 20A and 20B, a second photoresist layer 373 can be applied over the contact-level dielectric layer 280, and can be lithographically patterned to cover the sacrificial through-memory-level via cavity fill structures 583 and the sacrificial peripheral-region via cavity fill structures 483 without covering the physically exposed top surfaces of the semiconductor backside trench fill structures 73.

Figure 21A:
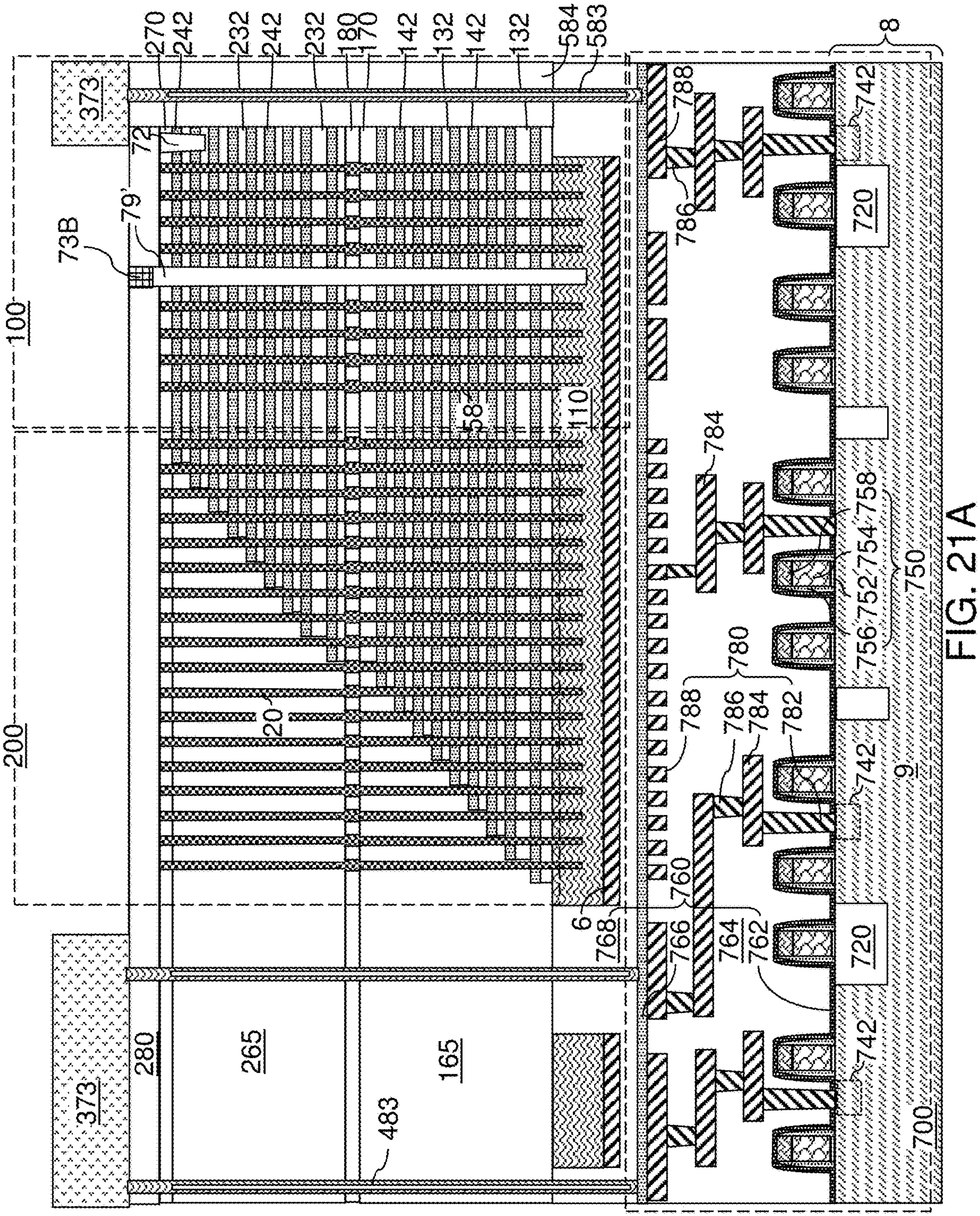
FIG. 21A is a vertical cross-sectional view of the first exemplary structure after removal of undoped portions of the semiconductor backside trench fill structures according to an embodiment of the present disclosure.
Figure 21B:
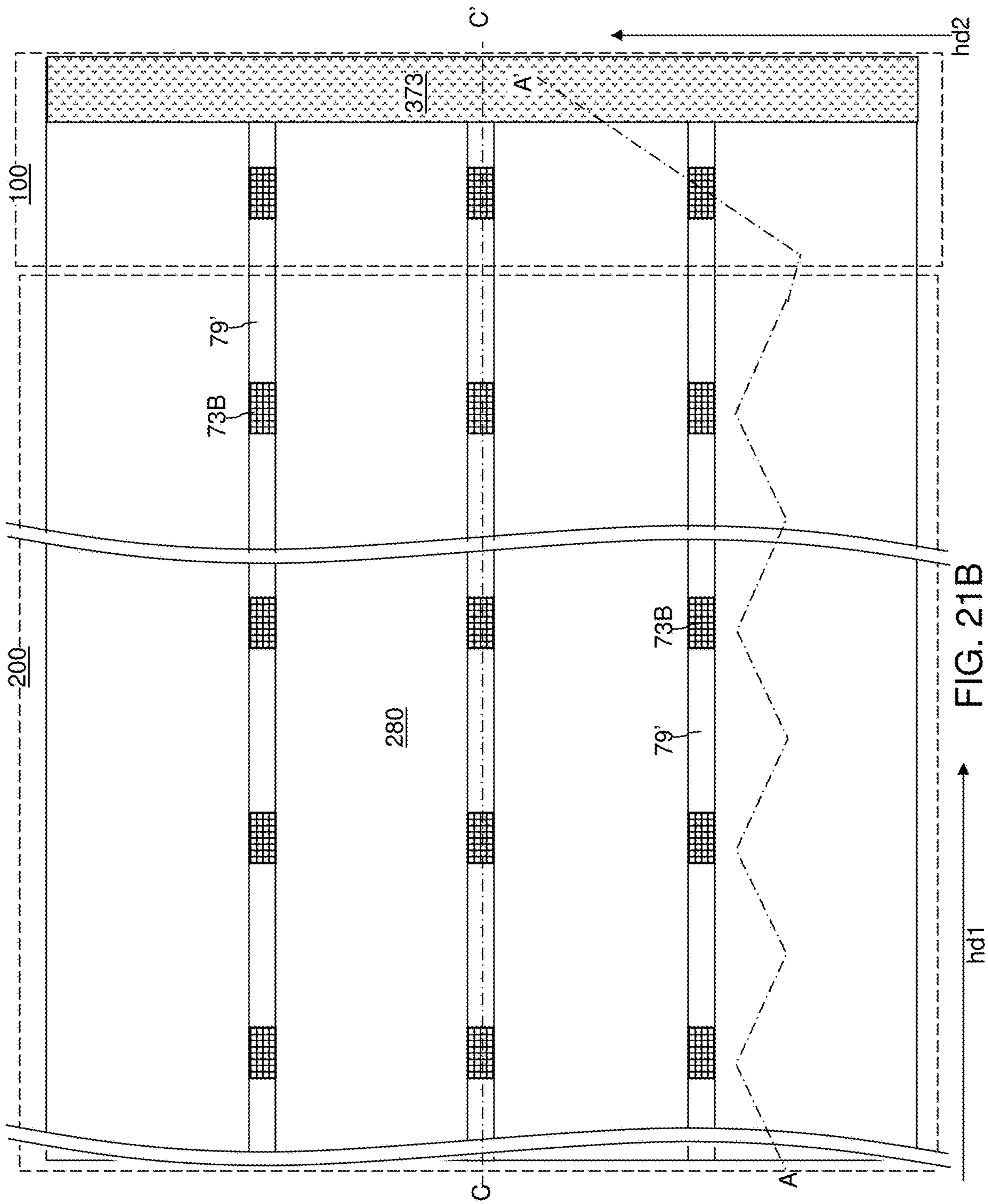
FIG. 21B is a top-down view of the first exemplary structure of FIG. 21A. The hinged vertical plane A-A' corresponds to the plane of the vertical cross-sectional view of FIG. 21A.
Figure 21C:
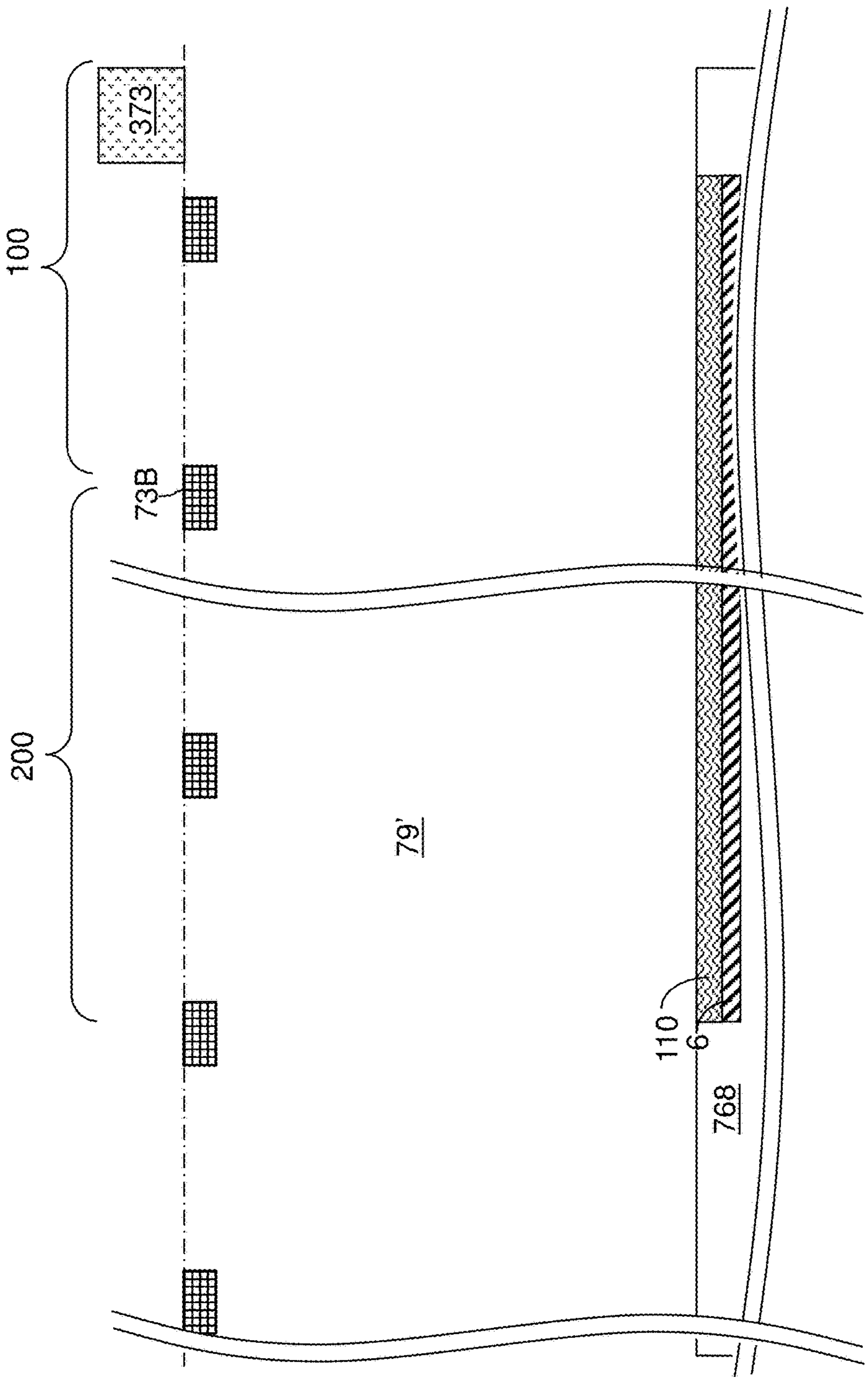
FIG. 21C is a vertical cross-sectional view of the first exemplary structure along the vertical plane C-C' of FIG. 21B.

Referring to FIGS. 21A and 21B, an etchant that etches the material of the semiconductor backside trench fill structures 73 selective to the material of the bridge structures 73B can be applied to the first exemplary structure by performing an isotropic etch process. For example, a wet etch process employing TMY can be performed to etch the material of the semiconductor backside trench fill structures 73 selective to the material of the bridge structures 73B. For example, the semiconductor backside trench fill structures 73 may comprise an undoped semiconductor material such as undoped amorphous silicon, undoped polysilicon, an undoped amorphous silicon germanium alloy, or an undoped polycrystalline silicon-germanium, the bridge structures 73B may comprise a doped semiconductor material including boron atoms at an atomic concentration in a range from $1.0\times10^{21}/cm^3$ to $5.0\times10^{21}/cm^3$, and the etch process may comprise a wet etch process employing TMY. Backside cavities 79' are formed in volumes from which the semiconductor backside trench fill structures 73 are etched.

Generally, the semiconductor backside trench fill structures 73 (e.g., the portions of the semiconductor backside trench fill structures 73 as formed at the processing steps of FIGS. 17A and 17B that are not implanted by the boron atoms) can be removed selective to the sets of at least one bridge structure 73B by performing a selective isotropic etch process. The backside cavities 79' are formed in volumes from which the portions of the semiconductor backside trench fill structures 73 are removed. In one embodiment, the selective isotropic etch process comprises a wet etch process employing trimethyl-2 hydroxyethyl ammonium hydroxide (TMY). Generally, the set of at least one bridge structure 73B can overlie a respective backside cavity 79' within each of the backside trenches 79. Each backside cavity 79' comprises a volume of a void within a respective one of the backside trenches 79.

Figure 22:
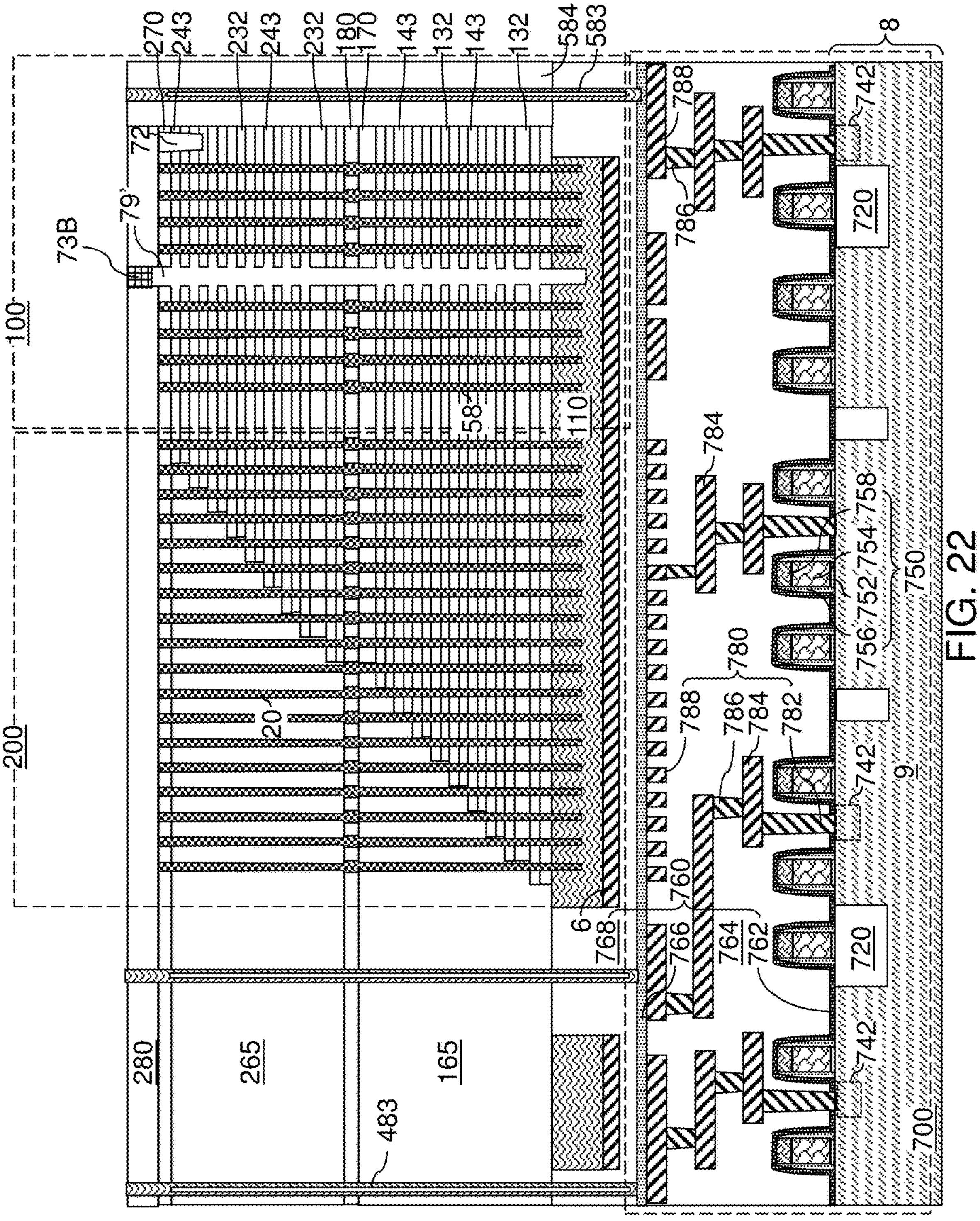
FIG. 22 is a vertical cross-sectional view of the first exemplary structure after formation of backside recesses according to an embodiment of the present disclosure.

Referring to FIG. 22, the sacrificial material layers (142, 242) are removed selective to the insulating layers (132, 232), the first and second insulating cap layers (170, 270), the contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

According to an aspect of the present disclosure, the backside recesses (143, 243) can be formed by removing the sacrificial material layers (142, 242) selective to the insulating layers (132, 232), the sets of one or more bridge structures 73B, and the arrays of memory opening fill structures 58 while the sets of the one or more bridge structures 73B provide structural support at the level of the contact-level dielectric layer 280 and deformation of the first exemplary structure at the level of the contact-level dielectric layer 280 is suppressed or prevented.

Figure 23A:
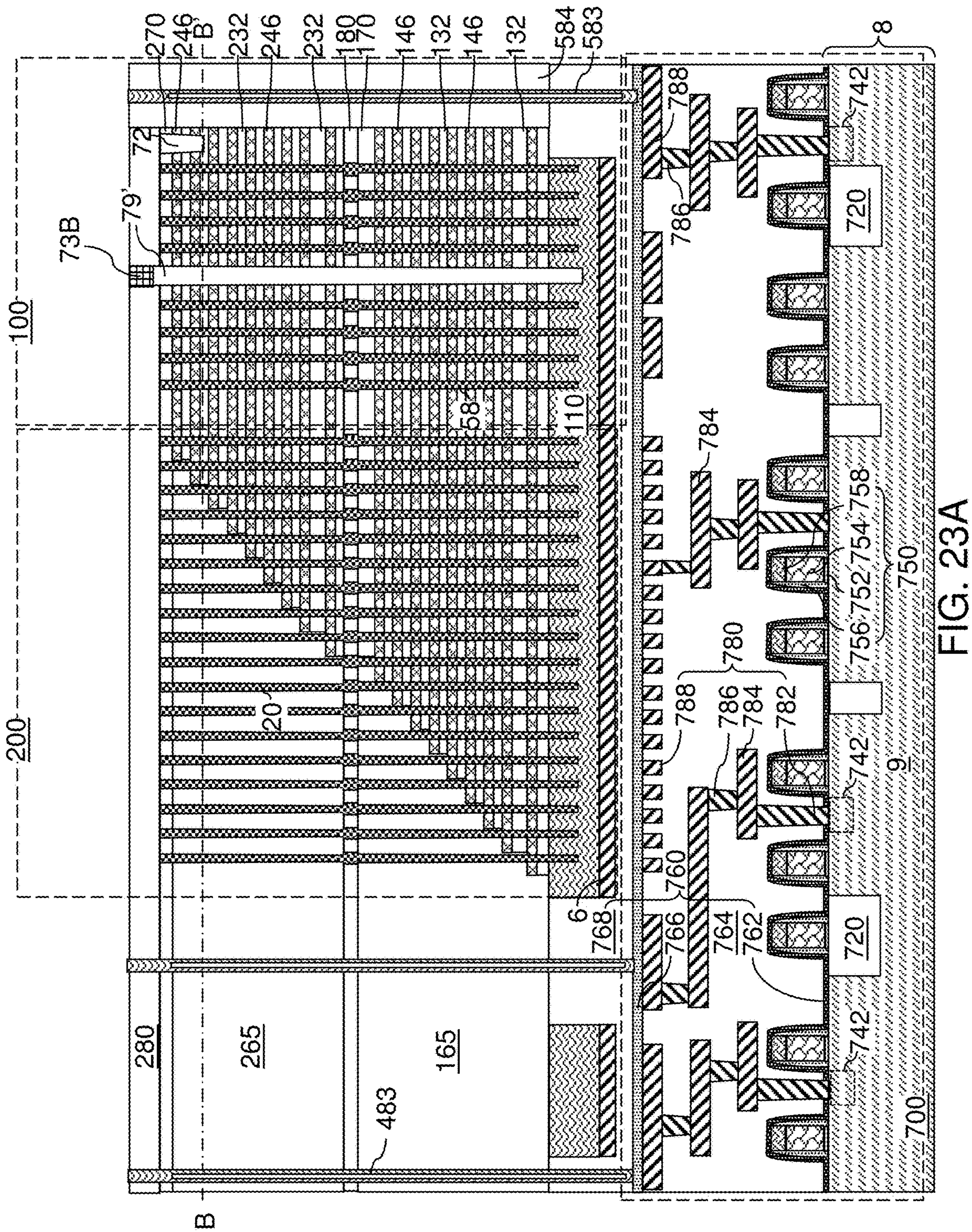
FIG. 23A is a vertical cross-sectional view of the first exemplary structure after formation of electrically conductive layers according to an embodiment of the present disclosure.
Figure 23B:
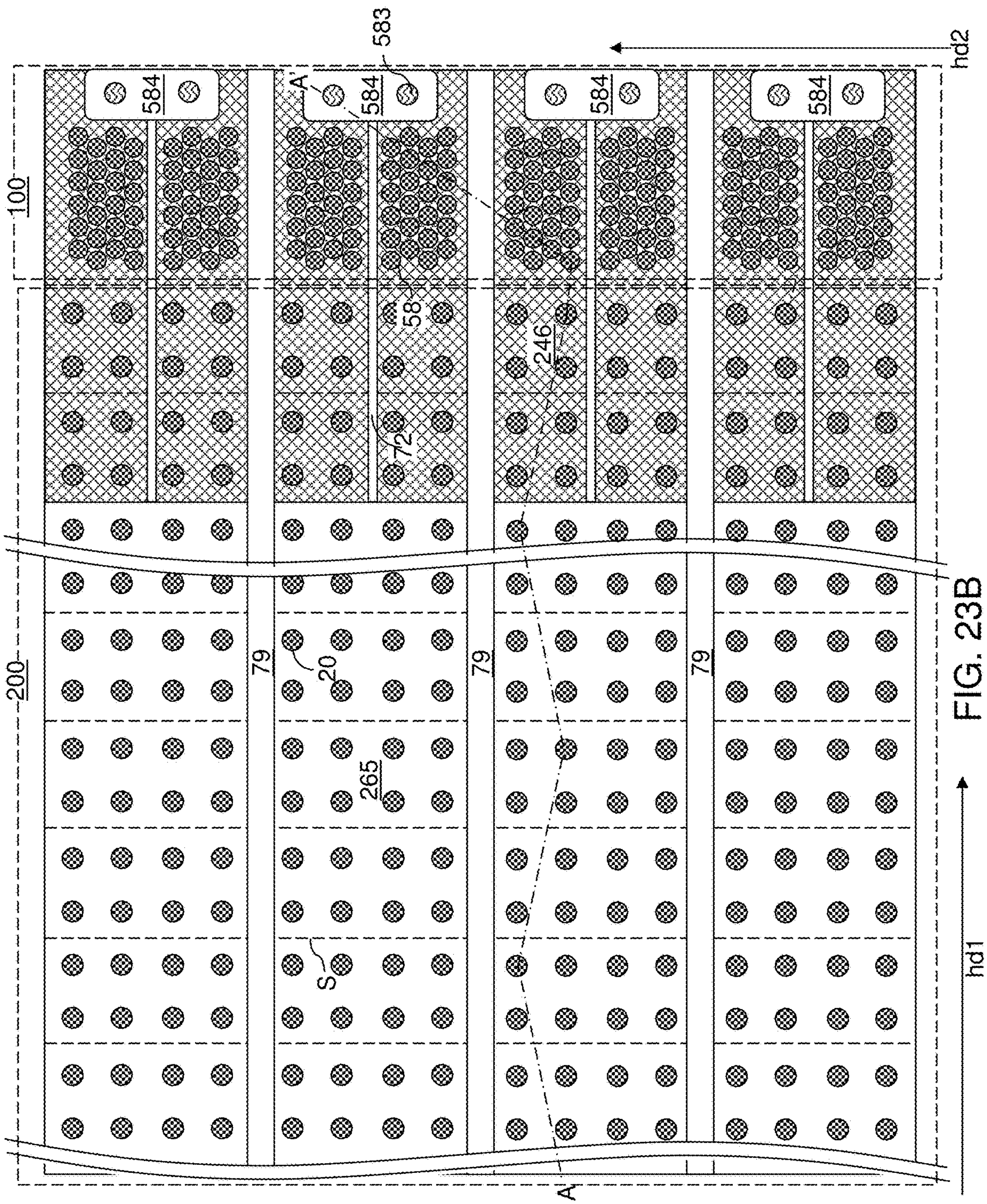
FIG. 23B is a horizontal cross-sectional view of the first exemplary structure along the horizontal plane B-B' of FIG. 23A. The hinged vertical plane A-A' corresponds to the plane of the vertical cross-sectional view of FIG. 23A.
Figure 24A:
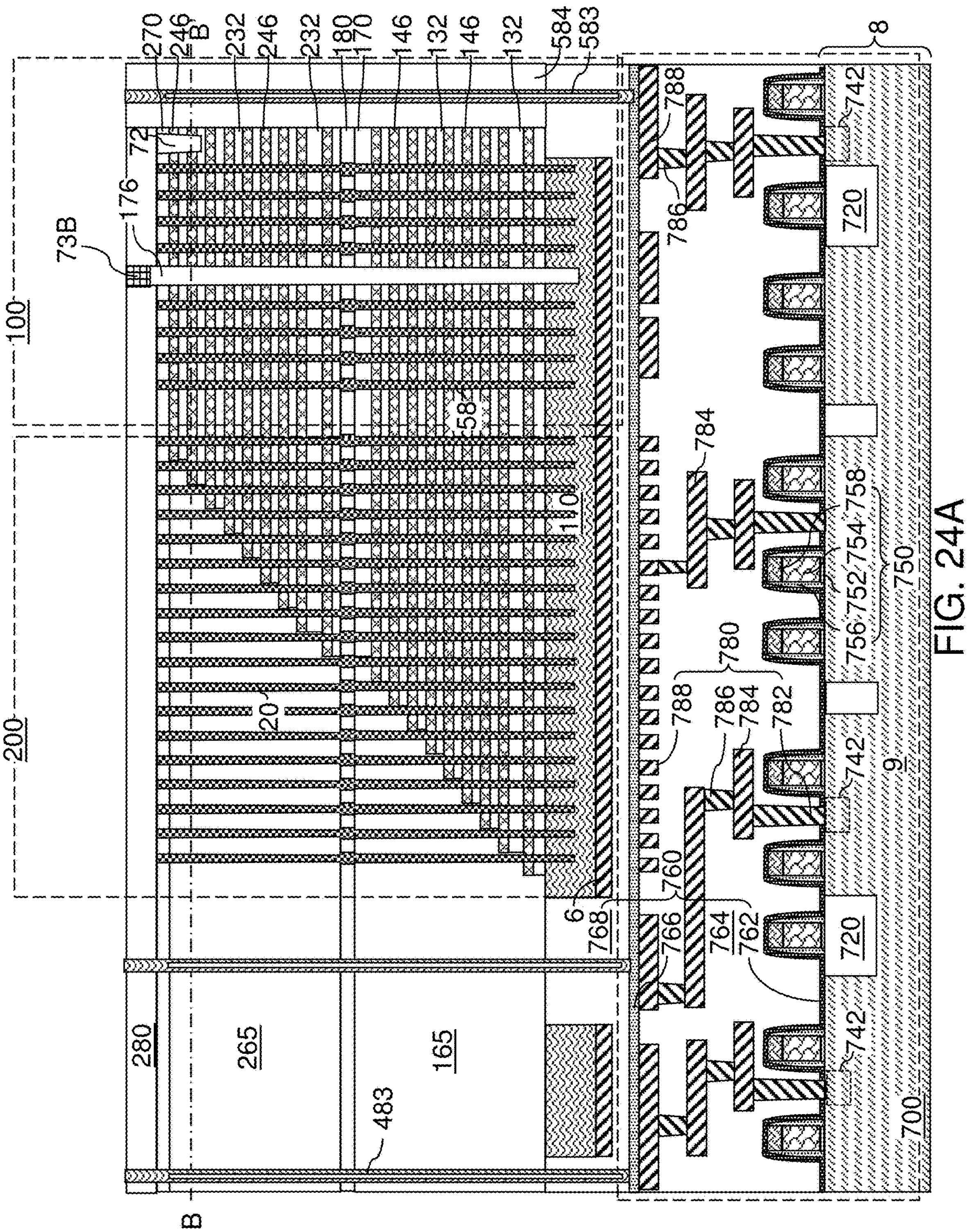
FIG. 24A is a vertical cross-sectional view of the first exemplary structure after formation of backside trench fill structures in the backside trenches according to an embodiment of the present disclosure.
Figure 24B:
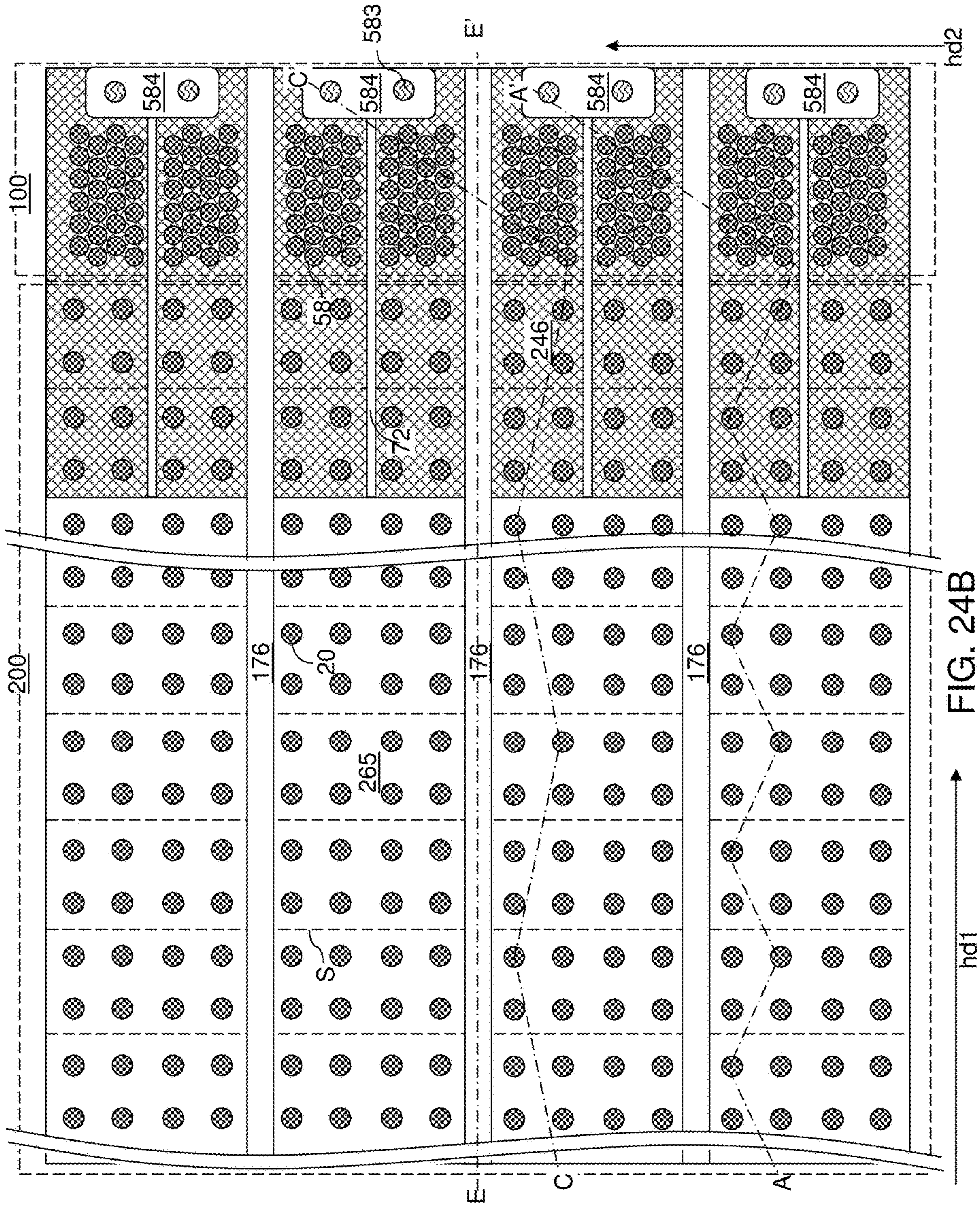
FIG. 24B is a horizontal cross-sectional view of the first exemplary structure along the horizontal plane B-B' of FIG. 24A. The hinged vertical plane A-A' corresponds to the plane of the vertical cross-sectional view of FIG. 24A.
Figure 24C:
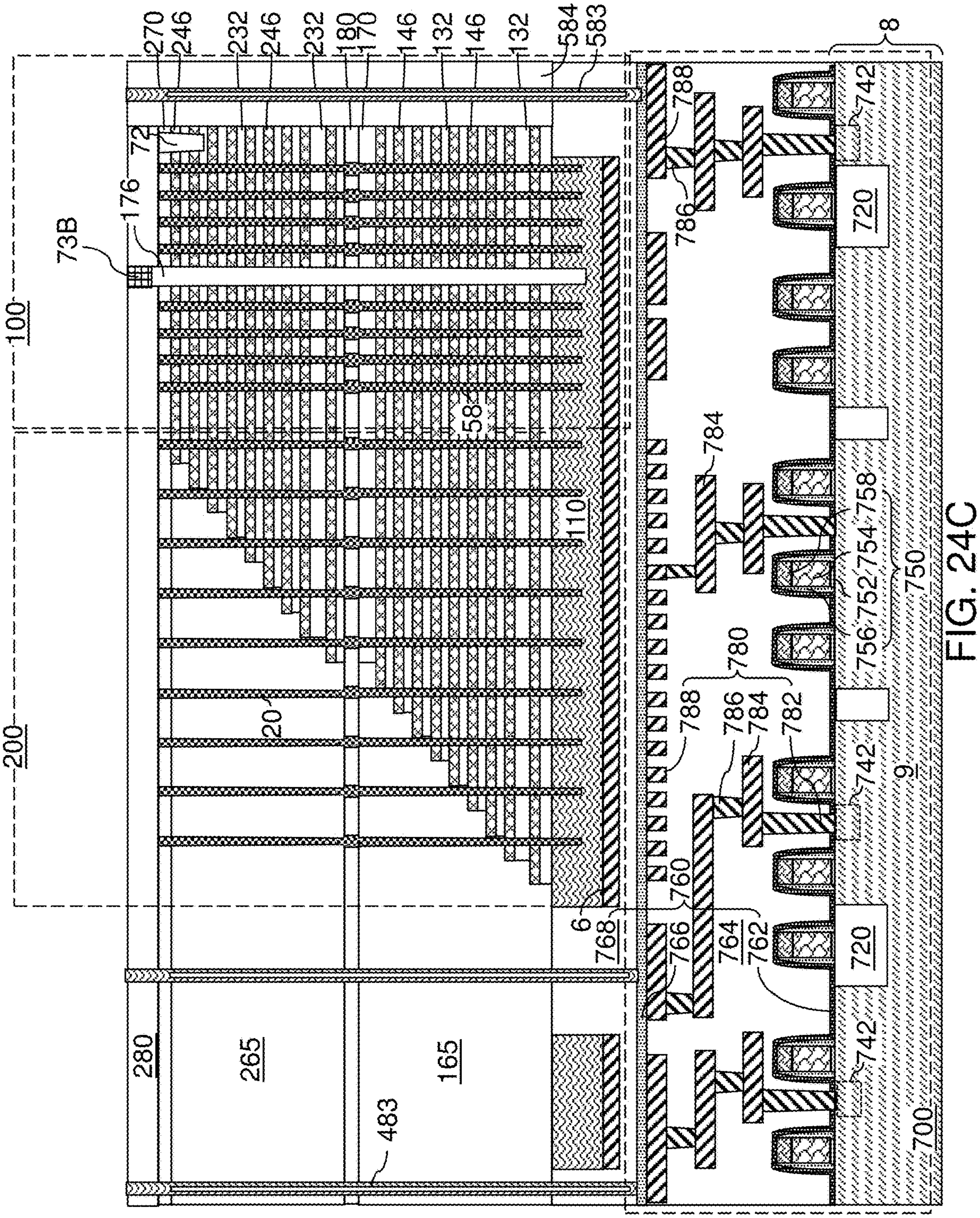
FIG. 24C is a vertical cross-sectional view of the first exemplary structure along the vertical plane C-C' of FIG. 24B.
Figure 24D:
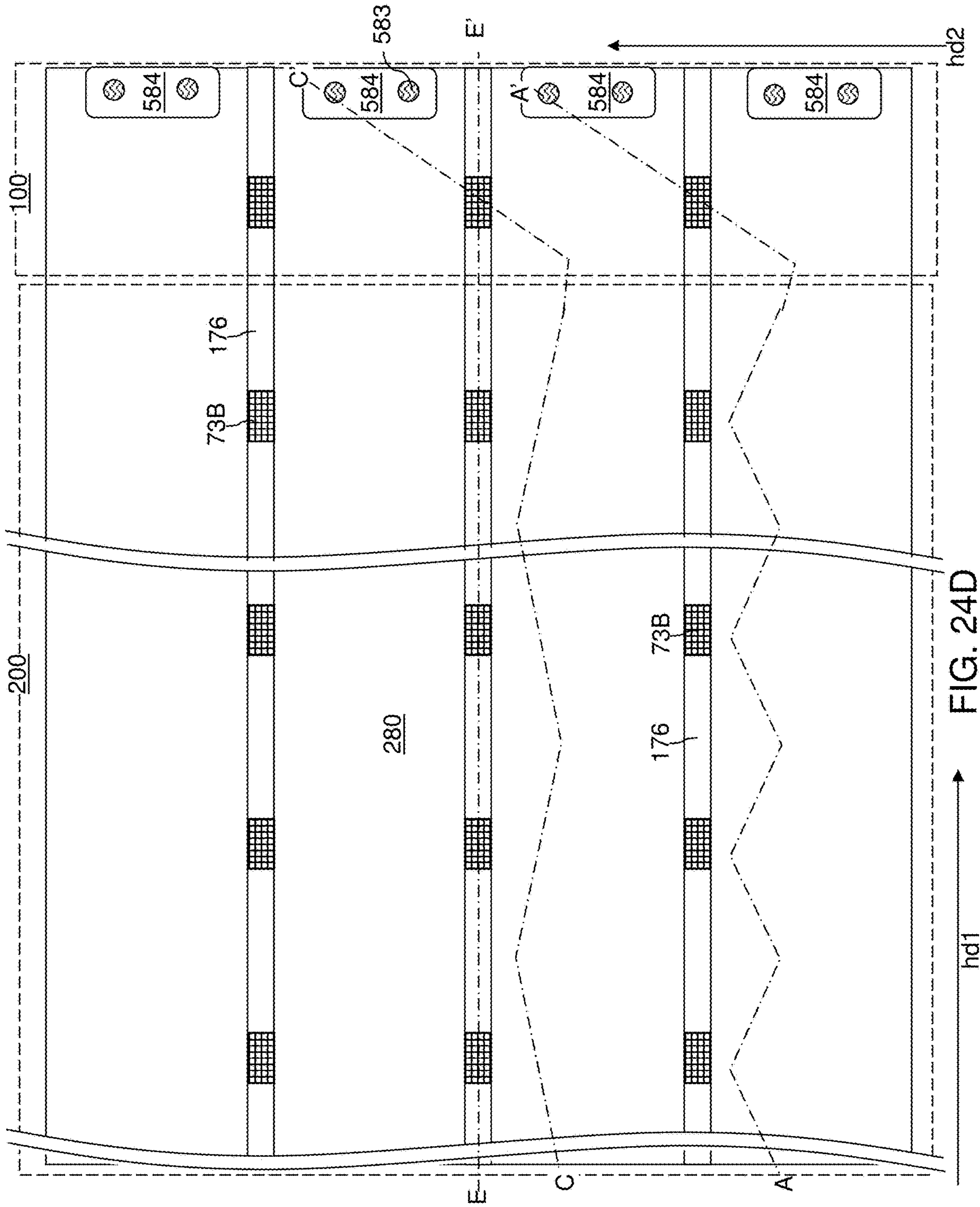
FIG. 24D is a top-down view of the first exemplary structure of FIGS. 24A-24C. The hinged vertical plane A-A' corresponds to the plane of the vertical cross-sectional view of FIG. 24A. The hinged vertical plane C-C' corresponds to the plane of the vertical cross-sectional view of FIG. 24C.
Figure 24E:
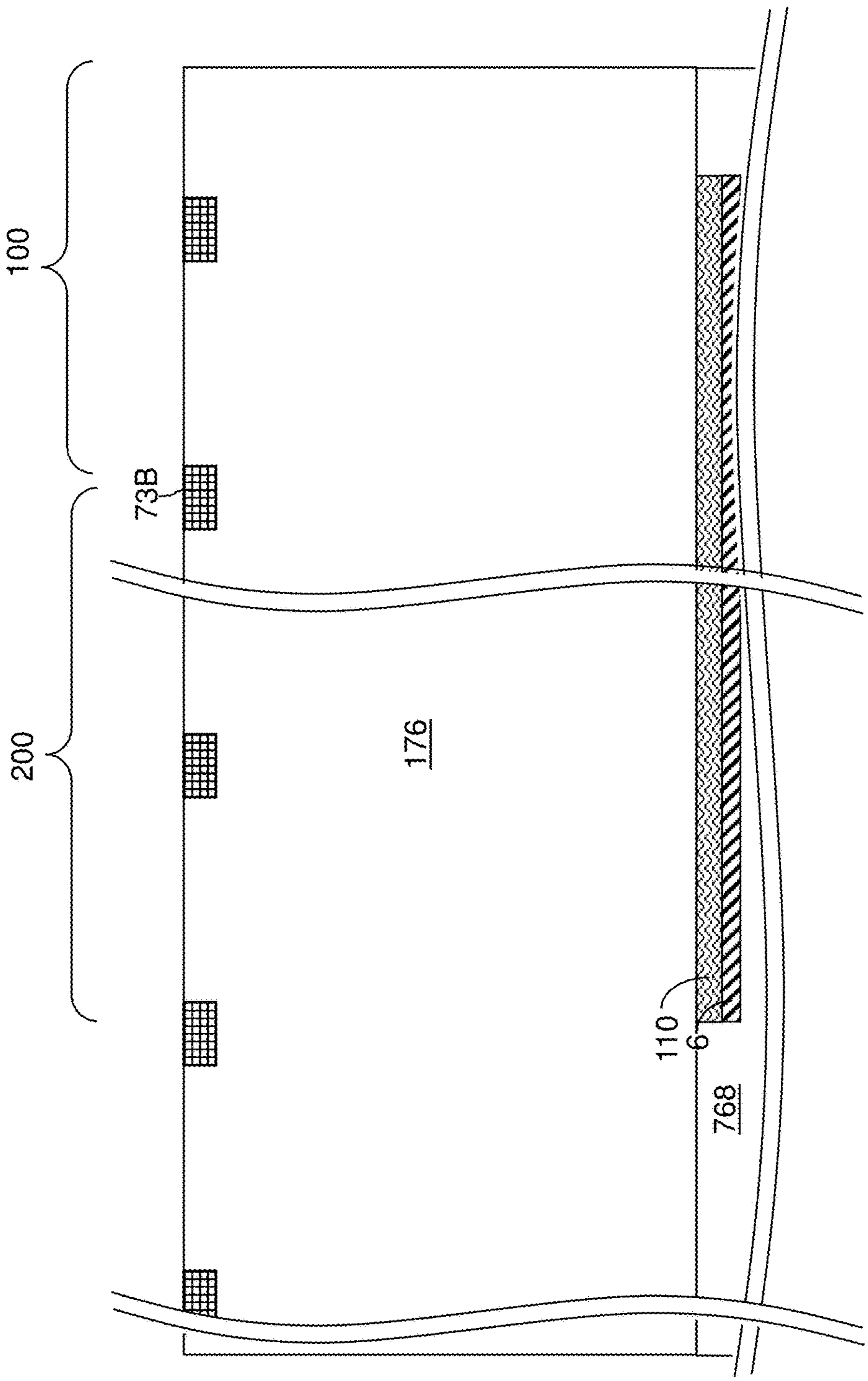
FIG. 24E is a vertical cross-sectional view of the first exemplary structure along the vertical plane E-E' of FIGS. 24B and 24D.

Referring to FIGS. 23A and 23B, a backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Generally, the electrically conductive layers (146, 246) can be formed by depositing at least one electrically conductive material in the backside recesses (143, 243) while the sets of at least one bridge structure 73B are located within the backside trenches 79 and provide structural support to the first exemplary structure at the level of the contact-level dielectric layer 280. In one embodiment, each bottom surface of the at least one bridge structure 73B may be located within a horizontal plane located above a horizontal plane including top surfaces of topmost electrically conductive layers (such as top surfaces of topmost second electrically conductive layer 246) within a pair of alternating stacks of insulating layers (132, 232) and electrically conductive layers (146, 246) that are laterally spaced apart by a backside trench 79.

Referring to FIGS. 24A-24E, a dielectric fill material may be conformally deposited in the backside trenches 79 and over the contact-level dielectric layer 280 by a conformal deposition process. The dielectric fill material may include, for example, silicon oxide. Excess portions of the dielectric fill material can be removed from above the horizontal plane including the top surface of the contact-level dielectric layer 280 by a planarization process such as a chemical mechanical polishing (CMP) process or a recess etch process. Each remaining portion of the dielectric fill material that fills a respective backside trench 79 constitutes an insulating backside trench fill material portion 176.

Each contiguous combination of an insulating backside trench fill material portion 176 and at least one bridge structure 73B constitutes a backside trench fill structure (73B, 176). The insulating backside trench fill material portion 176 can contact widthwise sidewalls and a bottom surface of the at least one bridge structure 73B located in a same backside trench 79. Each backside trench fill structure (73B, 176) contacts a respective sidewall of each layer within a pair of alternating stacks of insulating layers (132, 232) and electrically conductive layers (146, 246). In one embodiment, a pair of lengthwise sidewalls of each insulating backside trench fill material portion 176 can contact a pair of lengthwise sidewalls of the backside trench 79 that laterally extends along the first horizontal direction hd1.

Figure 25:
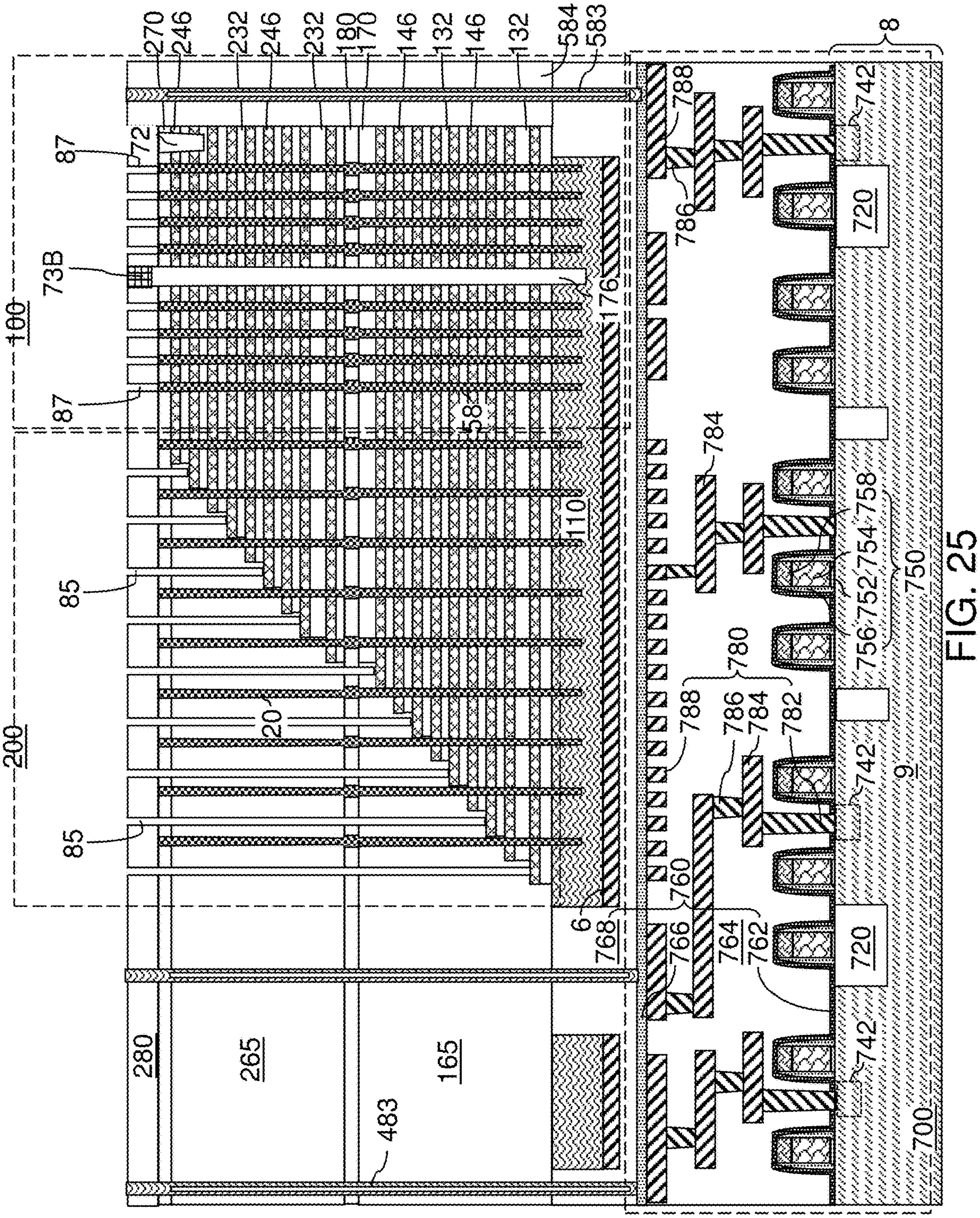
FIG. 25 is a vertical cross-sectional view of the first exemplary structure after formation of layer contact via cavities and drain contact via cavities according to an embodiment of the present disclosure.

Referring to FIG. 25, a photoresist layer (not shown) may be applied over the contact-level dielectric layer 280, and may be lithographically patterned to form various contact via openings. For example, openings for forming drain contact via structures may be formed in the memory array region 100, and openings for forming layer contact via structures may be formed in the staircase region 200. An anisotropic etch process is performed to transfer the pattern in the photoresist layer through the second and contact-level dielectric layer 280 and underlying dielectric material portions. The drain regions 63 and the electrically conductive layers (146, 246) may be used as etch stop structures. Drain contact via cavities 87 may be formed over each drain region 63, and layer contact via cavities 85 may be formed over each electrically conductive layer (146. 246) at the stepped surfaces underlying the first and second retro-stepped dielectric material portions (165, 265). The photoresist layer may be subsequently removed, for example, by ashing.

Figure 26:
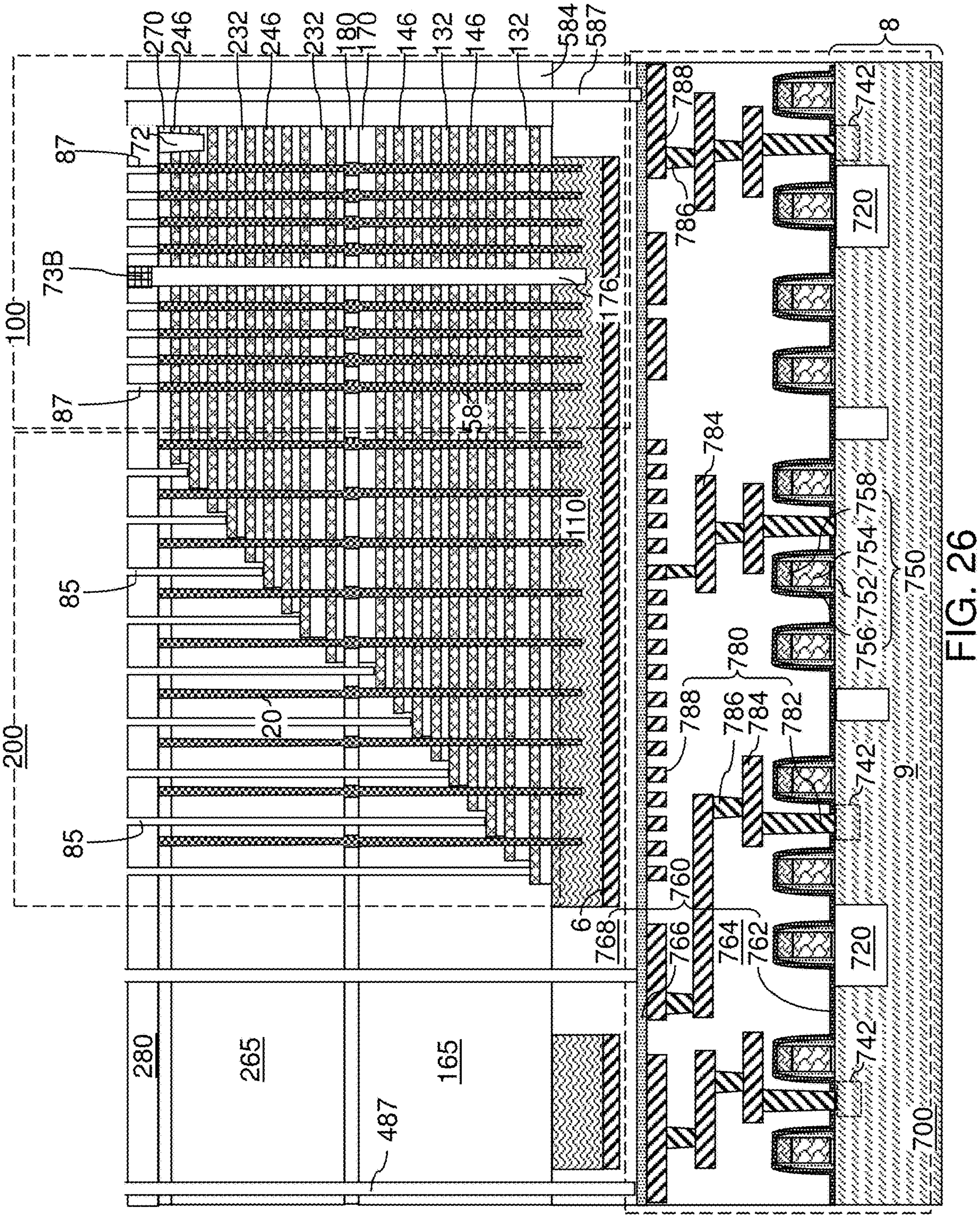
FIG. 26 is a vertical cross-sectional view of the first exemplary structure after removal of sacrificial via cavity fill structures according to an embodiment of the present disclosure.

Referring to FIG. 26, the sacrificial through-memory-level via cavity fill structures 583 and the sacrificial peripheral-region via cavity fill structures 483 can be removed selective to the dielectric materials of the retro-stepped dielectric material portions (165, 265), the contact-level dielectric layer 280, and the interconnection region dielectric fill material portions 584, and selective to the metallic material(s) of the lower-level metal interconnect structures 780. For example, a wet etch process employing TMY may be performed to remove the sacrificial through-memory-level via cavity fill structures 583 and the sacrificial peripheral-region via cavity fill structures 483. Voids are formed in the volumes of the through-memory-level via cavities 587 and the peripheral-region via cavities 487. The peripheral-region via cavities 487 may vertically extend through the contact-level dielectric layer 280, the second and first retro-stepped dielectric material portions (265, 165), and the at least one second dielectric layer 768 to top surfaces of a first subset of the lower-level metal interconnect structure 780 in the peripheral device region. The through-memory-region via cavities 587 may vertically extend through the interconnection region dielectric fill material portions 584 and the at least one second dielectric layer 768 to top surfaces of a second subset of the lower-level metal interconnect structure 780.

Figure 27A:
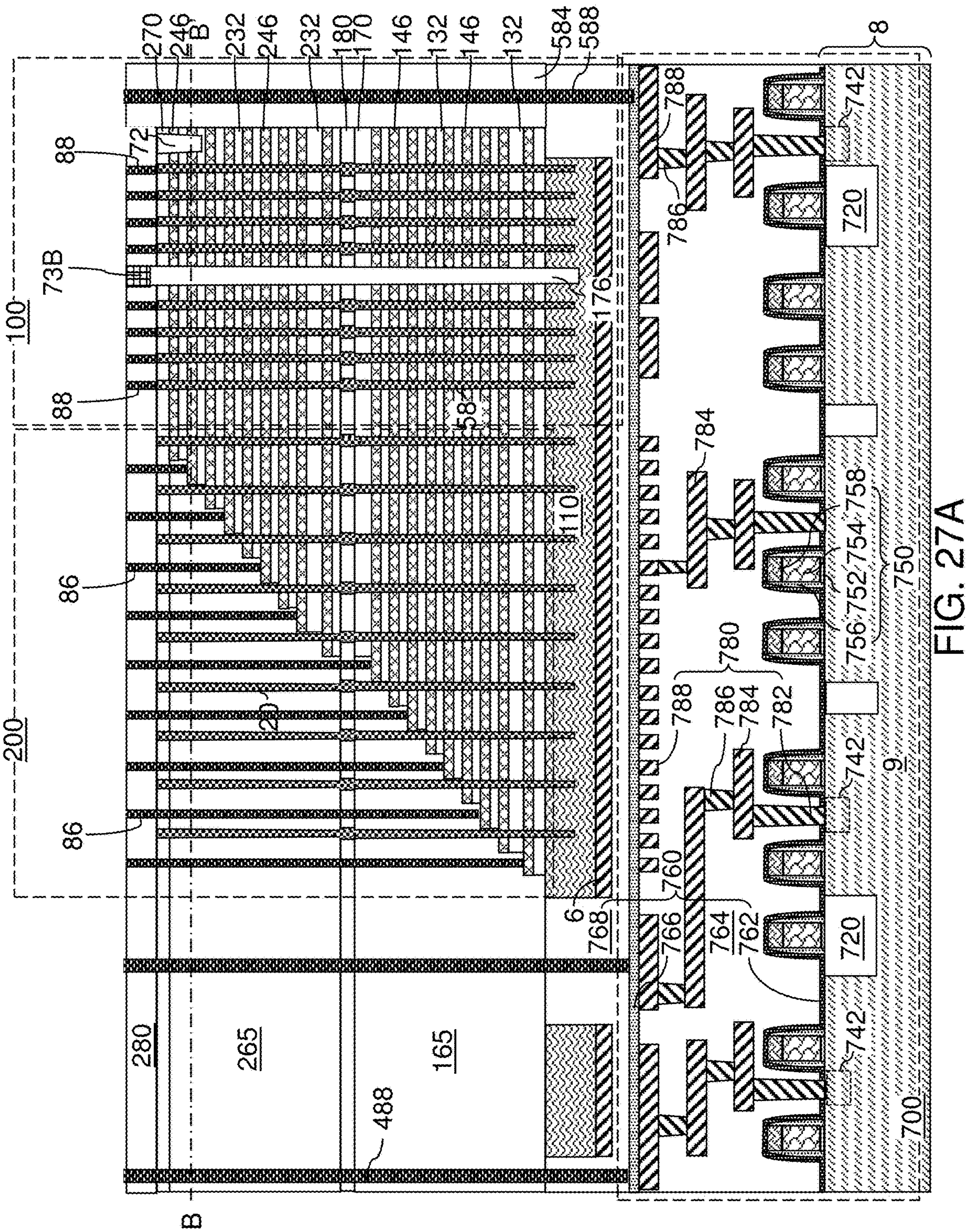
FIG. 27A is a vertical cross-sectional view of the first exemplary structure after formation of various contact via structures according to an embodiment of the present disclosure.
Figure 27B:
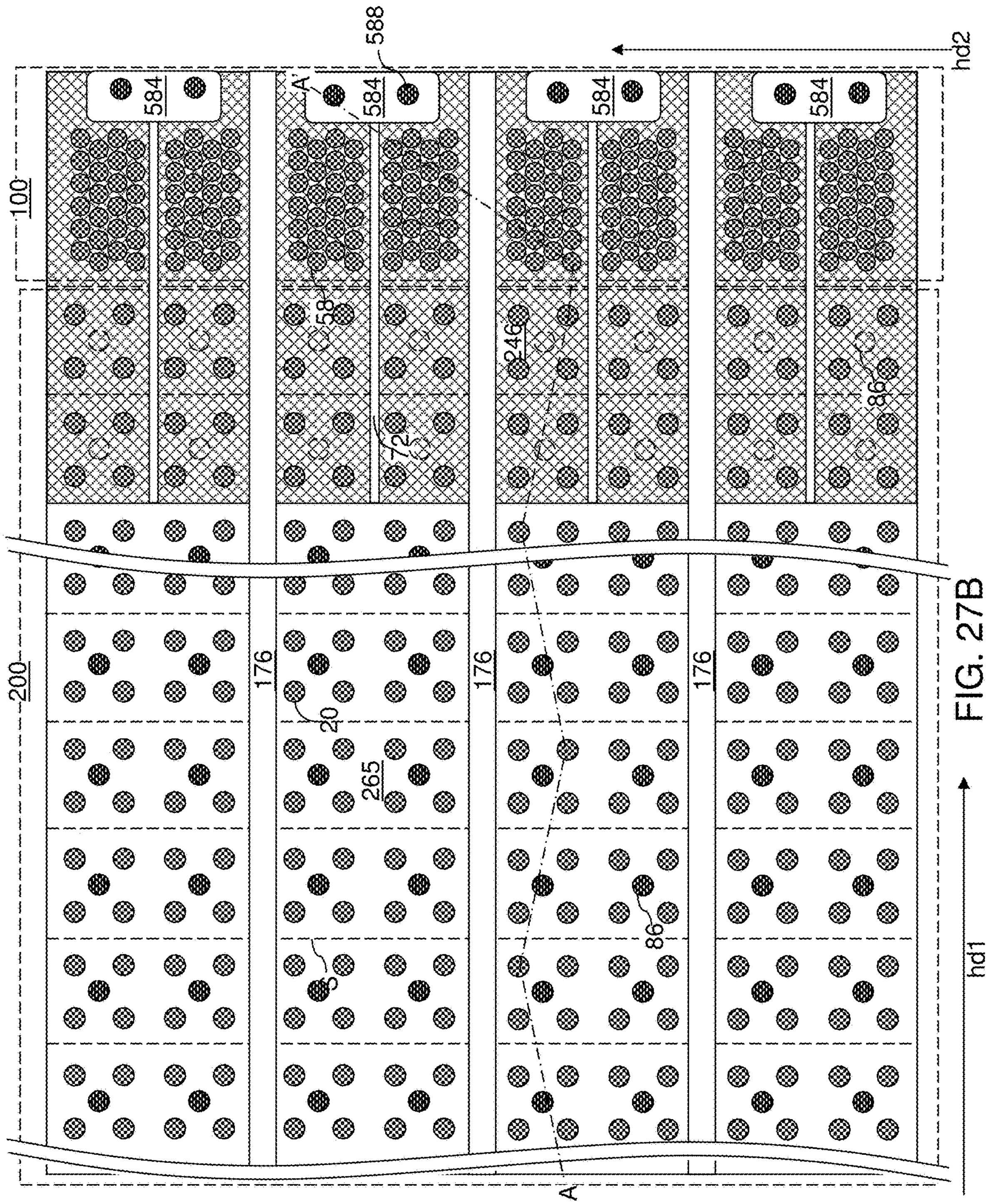
FIG. 27B is a horizontal cross-sectional view of the first exemplary structure along the vertical plane B-B' of FIG. 27A. The hinged vertical plane A-A' corresponds to the plane of the vertical cross-sectional view of FIG. 27A.

FIGS. 27A and 27B, at least one conductive material (such as at least one metallic material) may be deposited in each of the drain contact via cavities 87, the layer contact via cavities 85, the through-memory-level via cavities 587, and the peripheral-region via cavities 487. Drain contact via structures 88 are formed in the drain contact via cavities 87 and on a top surface of a respective one of the drain regions 63. Layer contact via structures 86 are formed in the layer contact via cavities 87 and on a top surface of a respective one of the electrically conductive layers (146, 246). The layer contact via structures 86 may include drain select level contact via structures that contact a subset of the second electrically conductive layers 246 that function as drain select level gate electrodes, and source select level contact via structures that contact a subset of the first electrically conductive layers 146 that function as source select level gate electrodes. Further, the layer contact via structures 86 may include word line contact via structures that contact electrically conductive layers (146, 246) that are located between the source and the drain select level gate electrodes and function as word lines for the memory stack structures 55. A peripheral-region contact via structure 488 can be formed in each of the peripheral-region via cavities 487. A through-memory-region via structure 588 can be formed in each of the through-memory-region via cavities 587.

Figure 28:
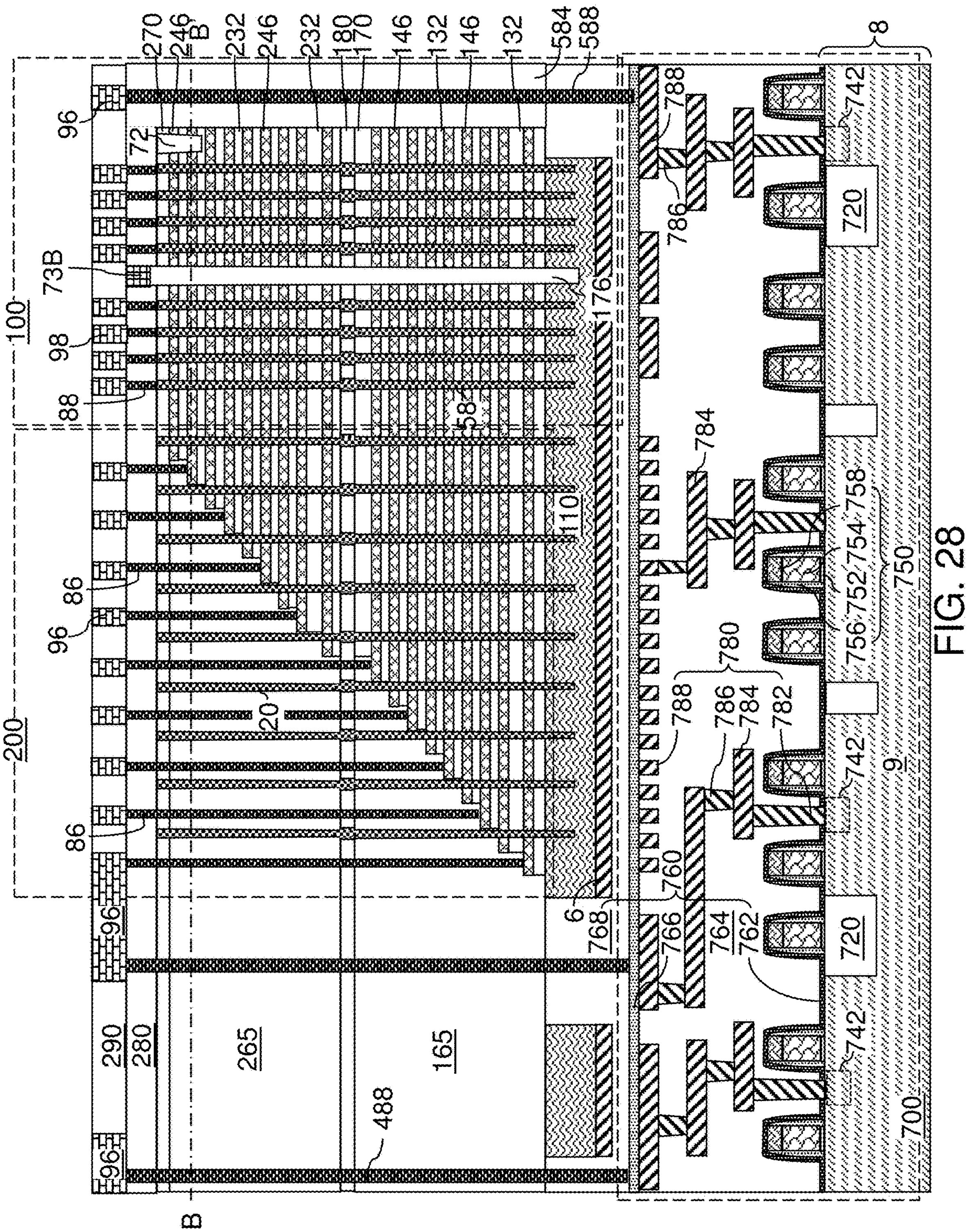
FIG. 28 is a vertical cross-sectional view of the first exemplary structure after formation of upper metal line structures according to an embodiment of the present disclosure.

Referring to FIG. 28, additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layer 280. The upper-level metal interconnect structures may include bit lines 98 contacting a respective one of the drain contact via structures 88, and interconnection line structures 96 contacting, and/or electrically connected to, at least one of the layer contact via structures 86 and/or the peripheral-region contact via structures 488 and/or the through-memory-region via structures 588. The word line contact via structures (which are provided as a subset of the layer contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Referring to FIGS. 1A-28 and according to various embodiments of the present disclosure, a three-dimensional memory device is provided, which comprises: a pair of alternating stacks of insulating layers (132, 232) and electrically conductive layers (146, 246) laterally spaced apart from each other by a backside trench 79, wherein each of the pair of alternating stacks {(132, 246), (232, 246)} and the backside trench 79 laterally extends along a first horizontal direction hd1; arrays of memory openings 49 vertically extending through a respective alternating stack {(132, 246), (232, 246)} among the pair of alternating stacks {(132, 246), (232, 246)}; arrays of memory openings fill structures 58 located in the arrays of memory openings 49, wherein each of the memory opening fill structures 58 comprises a respective vertical stack of memory elements; and a backside trench fill structure (176, 73B) located within the backside trench 79 and comprising at least one bridge structure 73B including a doped semiconductor material.

In one embodiment, the three-dimensional memory device comprises a pair of contact-level dielectric material portions (such as portions of a contact-level dielectric layer 280) overlying a respective one of the pair of alternating stacks {(132, 246), (232, 246)} and laterally spaced apart by the backside trench 79, wherein the at least one bridge structure 73B contacts respective sidewall segments of the pair of contact-level dielectric material portions. In one embodiment, the at least one bridge structure 73B comprises a respective top surface located within a horizontal plane including top surfaces of the pair of contact-level dielectric material portions. In one embodiment, each of the memory opening fill structures 58 comprises a respective vertical semiconductor channel 58 and a respective drain region 63 contacting an upper end portion of the vertical semiconductor channel 60; and top surfaces of the drain regions 63 are located at, or underneath, a horizontal plane including bottom surfaces of the pair of contact-level dielectric material portions.

In one embodiment, the doped semiconductor material comprises a boron doped semiconductor material; and the backside trench fill structure (176, 73B) comprises an insulating backside trench fill material portion 176 contacting sidewalls and a bottom surface of the at least one bridge structure 73B. In one embodiment, the backside trench fill structure (176, 73B) contacts a respective sidewall of each layer within the pair of alternating stacks {(132, 246), (232, 246)}. In one embodiment, the bottom surface of the at least one bridge structure (176, 73B) is located within a horizontal plane located above a horizontal plane including top surfaces of topmost electrically conductive layers (such as topmost second electrically conductive layers 246) within the pair of alternating stacks {(132, 246), (232, 246)}. In one embodiment, sidewalls of the insulating backside trench fill material portion 176 contacts a pair of lengthwise sidewalls of the backside trench 79 that laterally extends along the first horizontal direction hd1.

In one embodiment, the sidewalls of the at least one bridge structure 73B that contact the insulating backside trench fill material portion 176 are parallel to a second horizontal direction hd2 that is perpendicular to the first horizontal direction hd1; and the at least one bridge structure 73B comprises additional sidewalls that are parallel to the first horizontal direction hd1 and adjoined to a respective pair of sidewalls of the at least one bridge structure 73B that are parallel to the second horizontal direction hd2. In one embodiment, the three-dimensional memory device comprises a pair of contact-level dielectric material portions overlying a respective one of the pair of alternating stacks {(132, 246), (232, 246)} and laterally spaced apart by the backside trench 79, wherein the additional sidewalls of the at least one bridge structure 73B contacts respective sidewall segments of the pair of contact-level dielectric material portions.

In one embodiment, the at least one bridge structure 73B comprises a plurality of bridge structures 73B that are laterally spaced apart along the first horizontal direction hd1. In one embodiment, the plurality of bridge structures 73B comprise a periodic one-dimensional array of bridge structures 73B having a periodicity along the first horizontal direction hd1.

In one embodiment, the at least one bridge structure 73B consists essentially of boron-doped silicon or a boron-doped silicon-germanium alloy. In one embodiment, each of the memory opening fill structures 58 comprises a respective vertical semiconductor channel 60; and a source semiconductor layer (112, 114, 116) is located in contact with a sidewall of a bottom end of each of the vertical semiconductor channels 60.

The various embodiments of the present disclosure provide doped semiconductor bridge structures 73B which reduce deformation of a three-dimensional device structure during replacement of sacrificial material layers (142, 242) with electrically conductive layers (146, 246) and provide structural support to the alternating stacks. The doped semiconductor bridge structures 73B are relatively simple to form using selective doping and selective etching, which reduces the total number of process steps, which reduces process complexity and cost.

Figure 29A:
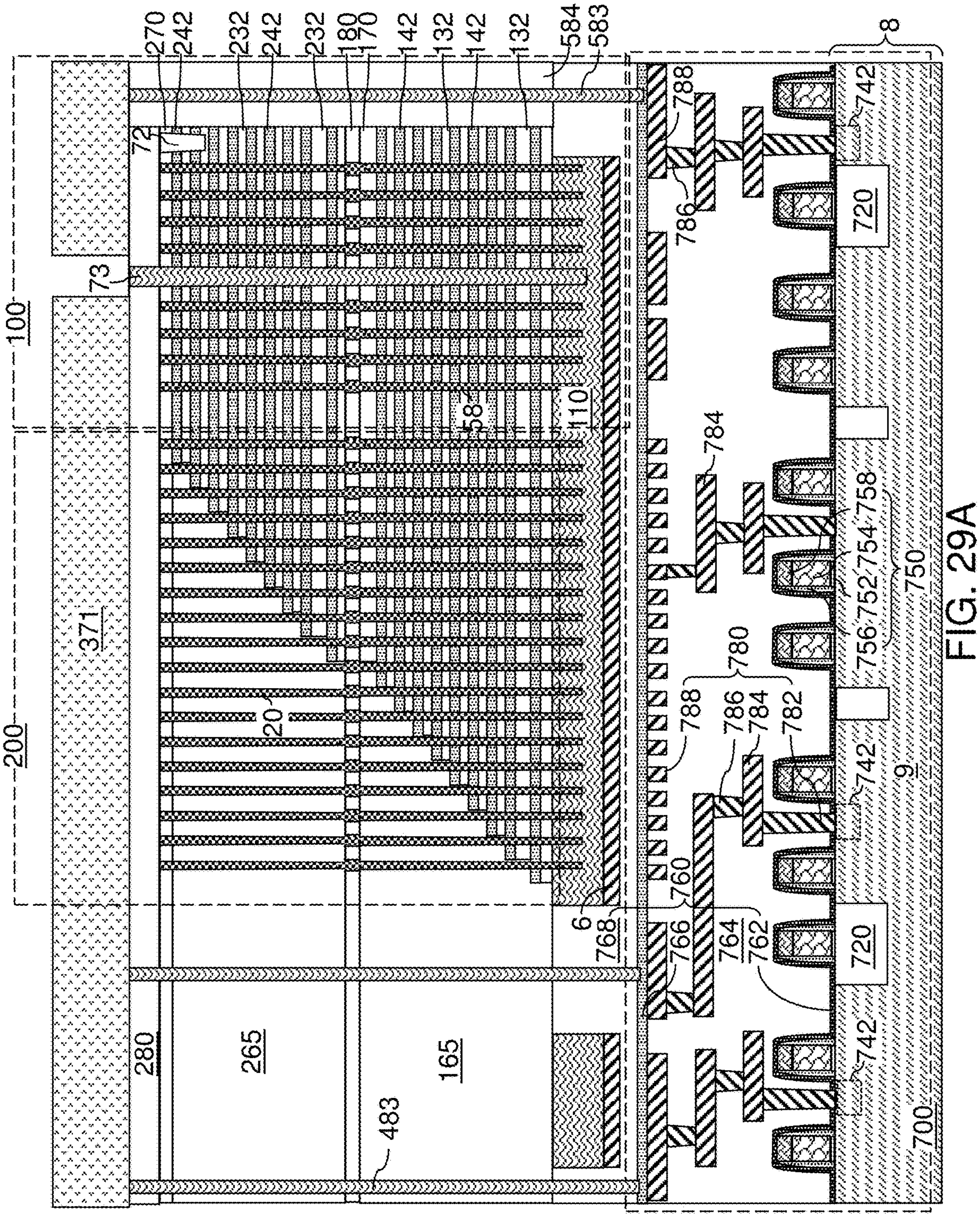
FIG. 29A is a vertical cross-sectional view of a second exemplary structure after formation of a first patterned photoresist layer according to an embodiment of the present disclosure.
Figure 29B:
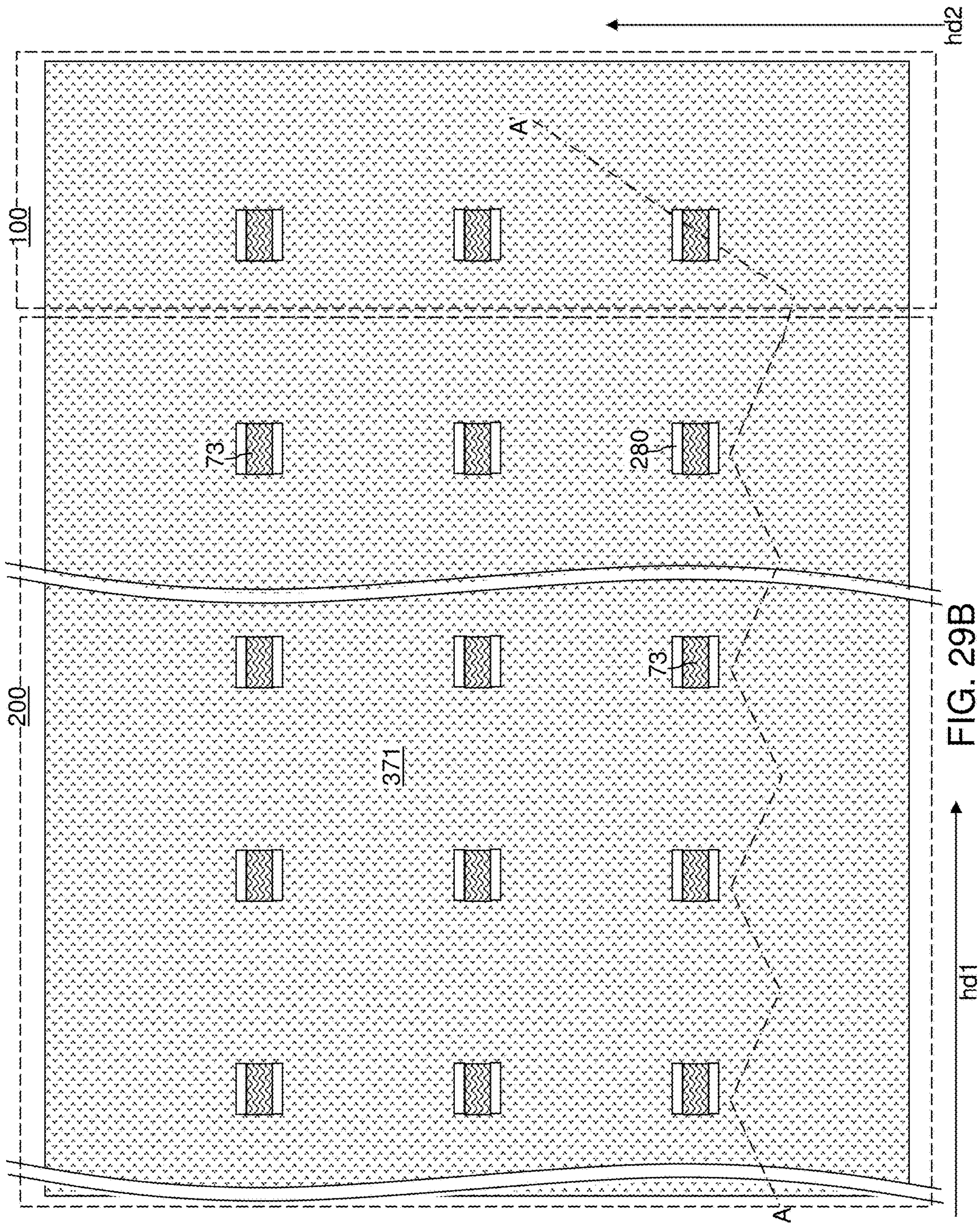
FIG. 29B is a top-down view of the second exemplary structure of FIG. 29A. The hinged vertical plane A-A' corresponds to the plane of the vertical cross-sectional view of FIG. 29A.

Referring to FIGS. 29A and 29B, a second exemplary structure according to an embodiment of the present disclosure can be the same as the first exemplary structure of FIGS. 18A and 18B.

Figure 30:
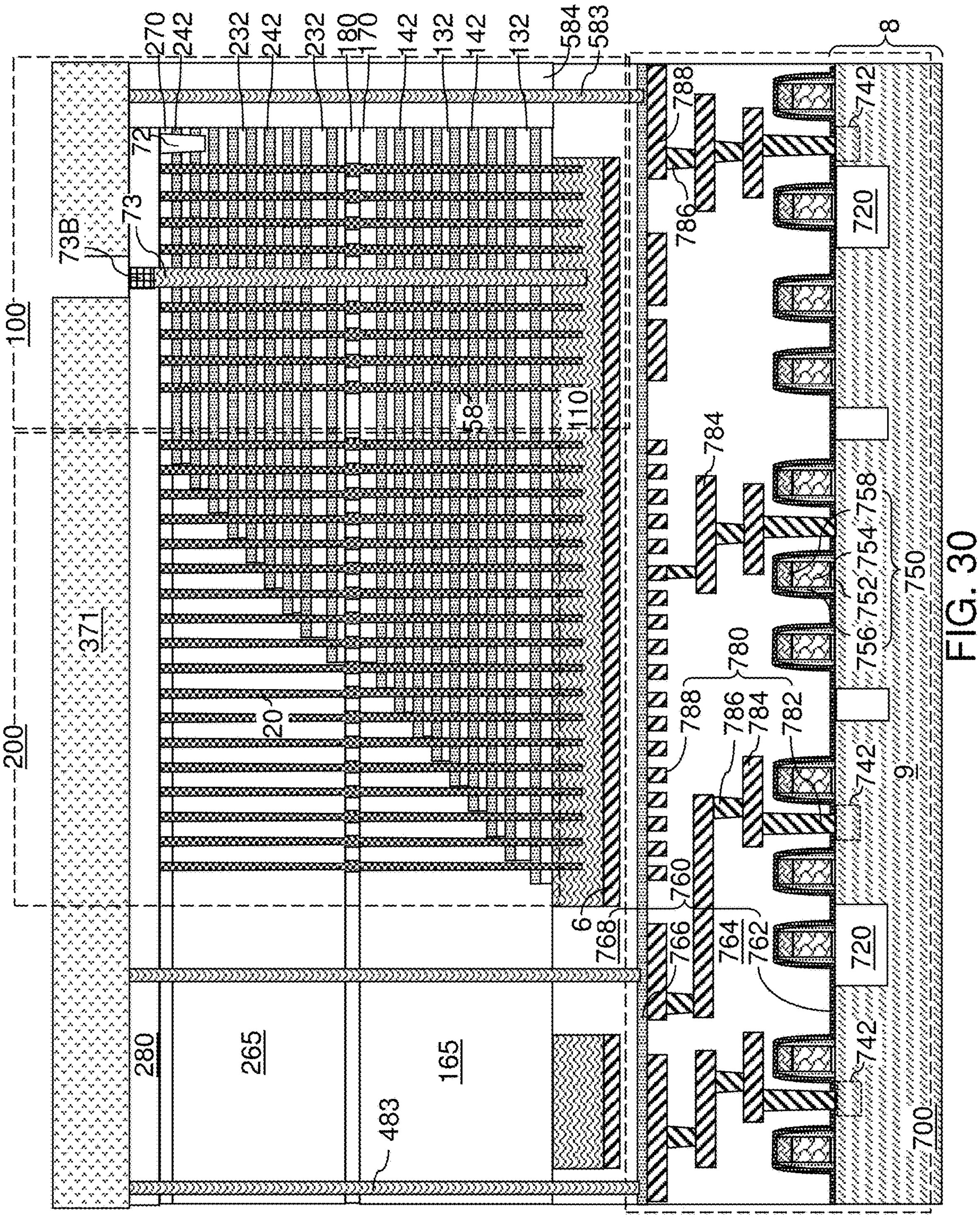
FIG. 30 is a vertical cross-sectional view of the second exemplary structure after formation of first bridge structures by a first boron implantation process according to an embodiment of the present disclosure.

Referring to FIG. 30, dopant atoms that reduce the etch rate of the undoped semiconductor material of the semiconductor backside trench fill structures 73 can be provided through the openings in the first patterned photoresist layer 371 into discrete unmasked surface portions of the semiconductor backside trench fill structures 73. The dopant atoms may be provided by ion implantation, gas phase diffusion doping or any other suitable doping method. For example, the semiconductor backside trench fill structures 73 may comprise amorphous silicon, polysilicon, an amorphous silicon germanium alloy, or a polycrystalline silicon-germanium alloy that are undoped, i.e., including electrical dopants at an atomic concentration less than $1.0\times10^{14}/cm^3$, and the dopants implanted into the discrete unmasked surface portions of the semiconductor backside trench fill structures 73 may comprise boron. In this case, a first boron implantation process can be performed to form the implanted regions of the semiconductor backside trench fill structures 73. In one embodiment, the atomic concentration of boron atoms in the implanted regions of the semiconductor backside trench fill structures 73 may be in a range from $1.0\times10^{19}/cm^3$ to $5.0\times10^{21}/cm^3$, such as $1.0\times10^{21}/cm^3$ to $5.0\times10^{21}/cm^3$.

The implanted portions of the semiconductor backside trench fill structures 73 including dopants atoms at an atomic concentration of at least $1.0\times10^{19}/cm^3$, such as at least $1.0\times10^{21}/cm^3$ are herein referred to as first bridge structures 73B, which differ in material composition from the material composition of the unimplanted portions of the semiconductor backside trench fill structures 73 by the presence of the implanted dopants. In one embodiment, the first bridge structures 73B can be formed by implantation of first boron atoms into discrete surface portions of semiconductor (e.g., silicon) backside trench fill structures 73.

Generally, at least one discrete surface portion of the semiconductor backside trench fill structure 73 can be converted into a respective set of one or more first bridge structures 73B within each of the backside trenches 79 by locally implanting the first boron atoms. In one embodiment, a set of at least one first bridge structure 73B comprising a boron-doped semiconductor material (e.g., boron doped silicon) can be formed within each of the backside trenches 79. In one embodiment, the at least one first bridge structure 73B consists essentially of boron-doped silicon or a boron-doped silicon-germanium alloy.

In one embodiment, a pair of contact-level dielectric material portions (such as a pair of portions of the contact-level dielectric layer 280 that are laterally spaced apart by a backside trench 79) can overlie a respective one of the pair of alternating stacks of insulating layers (132, 232) and spacer material layers (such as sacrificial material layers (142, 242), and can be laterally spaced apart by the backside trench 79. In this case, the at least one first bridge structure 73B may contact respective sidewall segments of the pair of contact-level dielectric material portions. In one embodiment, the at least one first bridge structure 73B comprises a respective top surface located within a horizontal plane including top surfaces of the pair of contact-level dielectric material portions (such as top surfaces of a pair of portions of the contact-level dielectric layer 280 that are laterally spaced apart by a backside trench 79). In one embodiment, each bottom surface of the at least one first bridge structure 73B may be located within a horizontal plane located above a horizontal plane including top surfaces of topmost spacer material layers (such as the topmost second sacrificial material layer 242) within the pair of alternating stacks.

In one embodiment, each first bridge structure 73B may comprise a pair of lengthwise sidewalls that contact a pair of contact-level dielectric material portions (such as two portions of the contact-level dielectric layer 280 that are laterally spaced apart along the second horizontal direction (e.g., bit line direction) hd2 by a backside trench 79) and a pair of widthwise sidewalls that laterally extend along the second horizontal direction hd2 and adjoined to the pair of lengthwise sidewalls. The widthwise sidewalls of the at least one first bridge structure 73B that contact a semiconductor backside trench fill structure 73 are parallel to the second horizontal direction hd2 that is perpendicular to the first horizontal direction (e.g., word line direction) hd1. In one embodiment, the at least one first bridge structure 73B comprises a respective lengthwise sidewalls that are parallel to the first horizontal direction hd1 and adjoined to a respective pair of widthwise sidewalls that are parallel to the second horizontal direction hd2.

In one embodiment, the plurality of first bridge structures 73B may be formed such that the plurality of first bridge structures 73B comprises a periodic one-dimensional array of first bridge structures 73B having a periodicity along the first horizontal direction hd1. The first patterned photoresist layer 371 can be subsequently removed, for example, by ashing.

Generally, first discrete surface portions of each semiconductor backside trench fill structure 73 can be converted into the first bridge structures 73B by implanting first boron atoms into the first discrete surface portions of the semiconductor backside trench fill structure 73. In one embodiment, first bridge structures 73B comprising a first doped semiconductor material are formed within each of the backside trenches 79 at a first vertical distance d1 from a horizontal plane including a top surface of the substrate 8. In one embodiment, a row of first bridge structures 73B can be arranged along the first horizontal direction hd1 at an upper portion of each of the backside trenches 79, and can be embedded within a remaining portion of a respective one of the semiconductor backside trench fill structures 73.

In one embodiment, each backside trench 79 can be located between a pair of alternating stacks (32, 42). In this case, a row of first bridge structures 73B within the backside trench 79 can be located above a horizontal plane including topmost surfaces of the pair of alternating stacks (32, 42). A pair of contact-level dielectric material portions (such as portions of the contact-level dielectric layer 280) can be located above a respective alternating stack within the pair of alternating stacks (32, 42). Each first bridge structure 73B within the row of first bridge structures 73 has a top surface located within a horizontal plane including top surfaces of the pair of contact-level dielectric material portions.

Figure 31A:
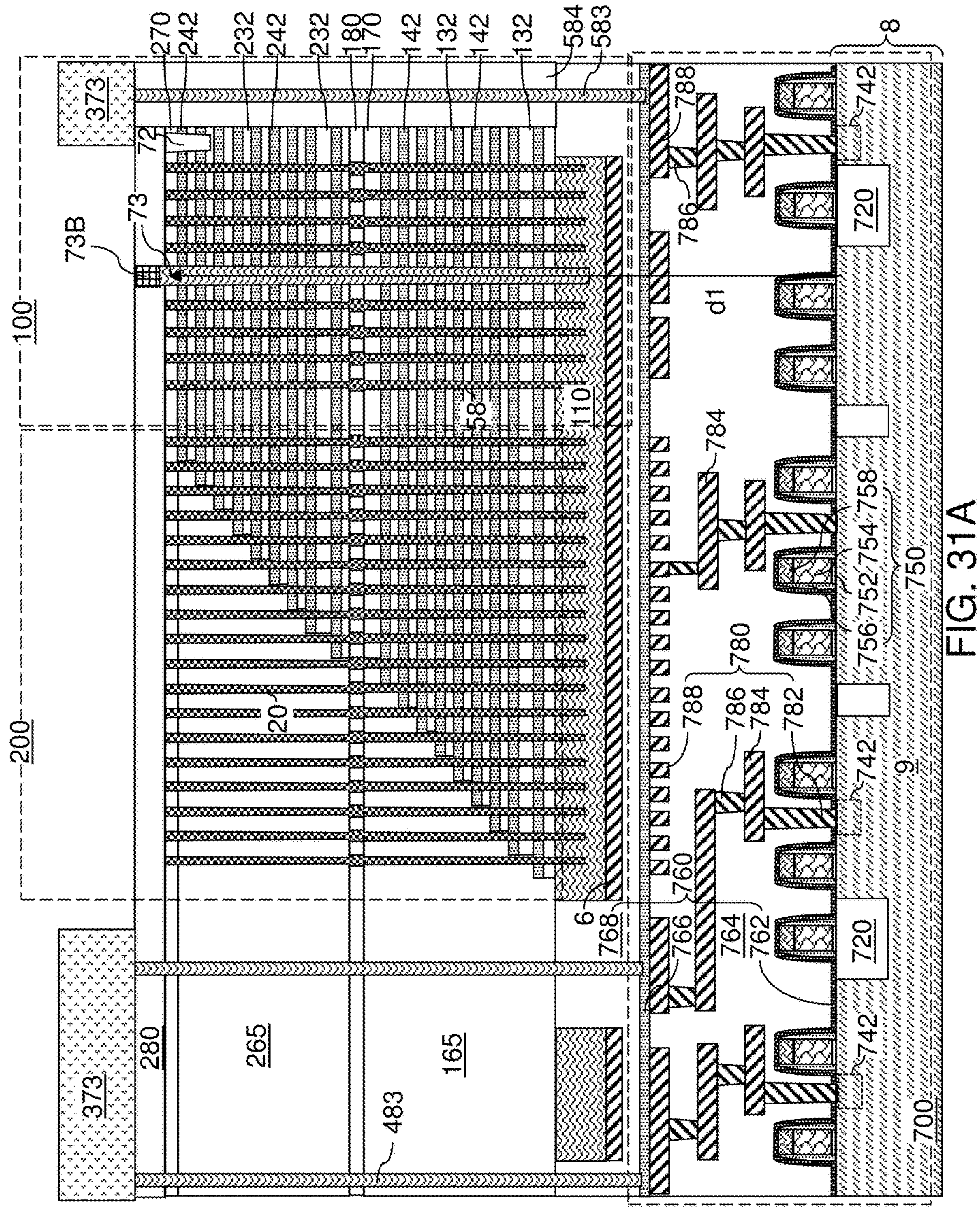
FIG. 31A is a vertical cross-sectional view of the second exemplary structure after formation of a first block-level photoresist layer according to an embodiment of the present disclosure.
Figure 31B:
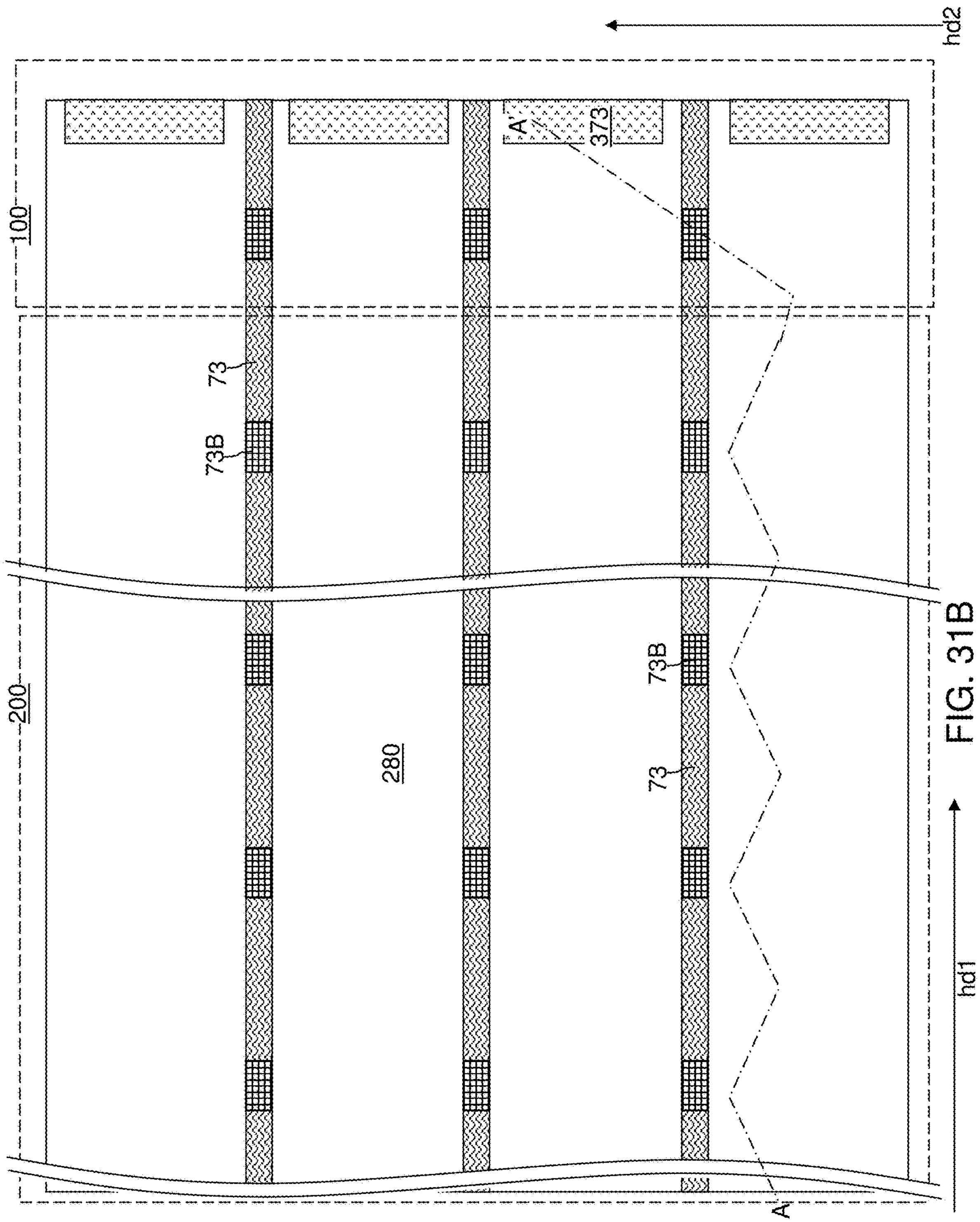
FIG. 31B is a top-down view of the second exemplary structure of FIG. 31A. The hinged vertical plane A-A' corresponds to the plane of the vertical cross-sectional view of FIG. 31A.

Referring to FIGS. 31A and 31B, the first photoresist layer 371 can be removed, for example, by ashing. Another photoresist layer, which is herein referred to as a first block-level photoresist layer 373, can be applied over the second exemplary structure. The first block-level photoresist layer 373 can be lithographically patterned to cover the sacrificial through-memory-level via cavity fill structures 583 and the sacrificial peripheral-region via cavity fill structures 483 without covering the physically exposed top surfaces of the semiconductor backside trench fill structures 73.

Figure 32A:
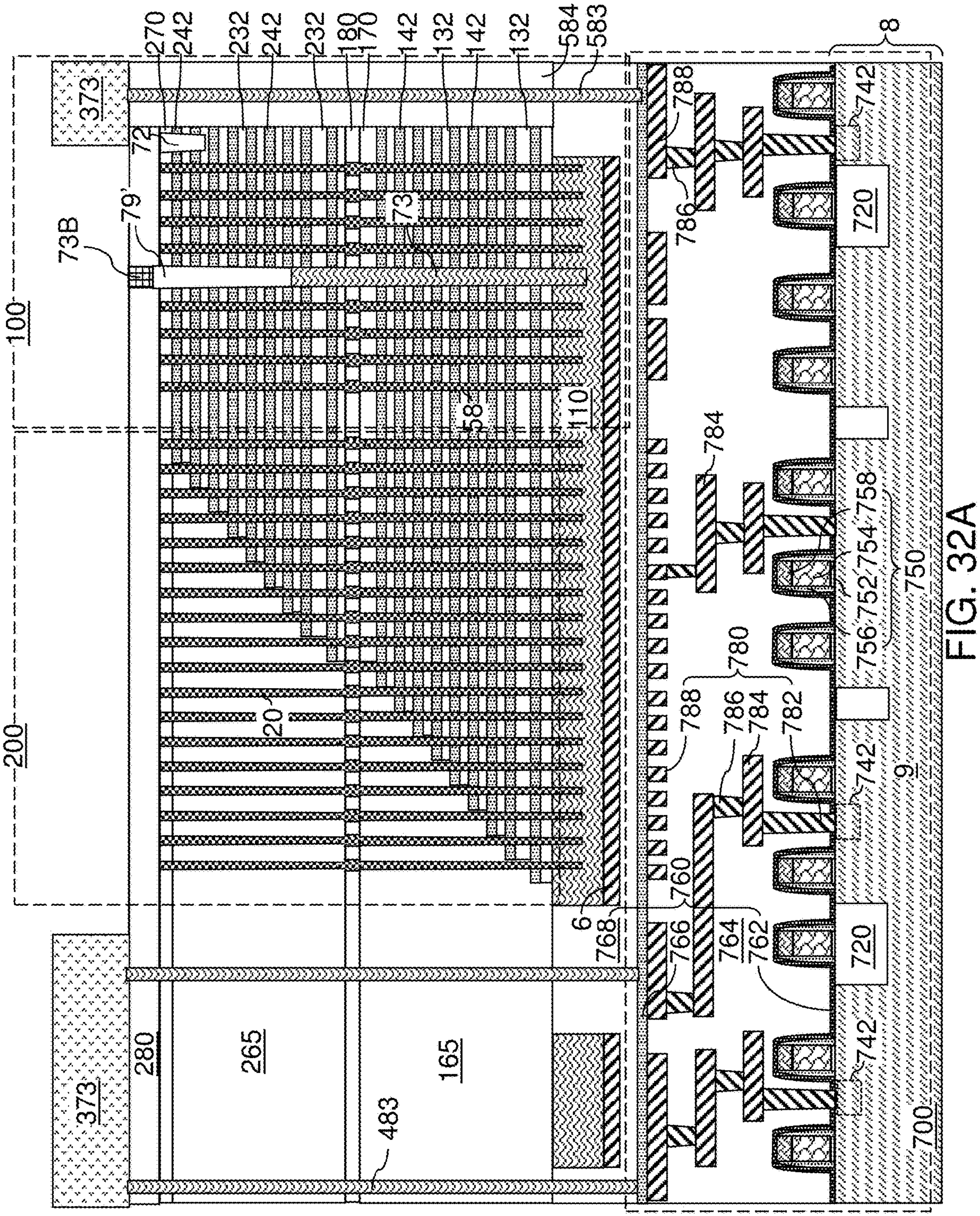
FIG. 32A is a vertical cross-sectional view of the second exemplary structure after selectively recessing undoped portions of the semiconductor backside trench fill structures relative to the first bridge structures according to an embodiment of the present disclosure.
Figure 32B:
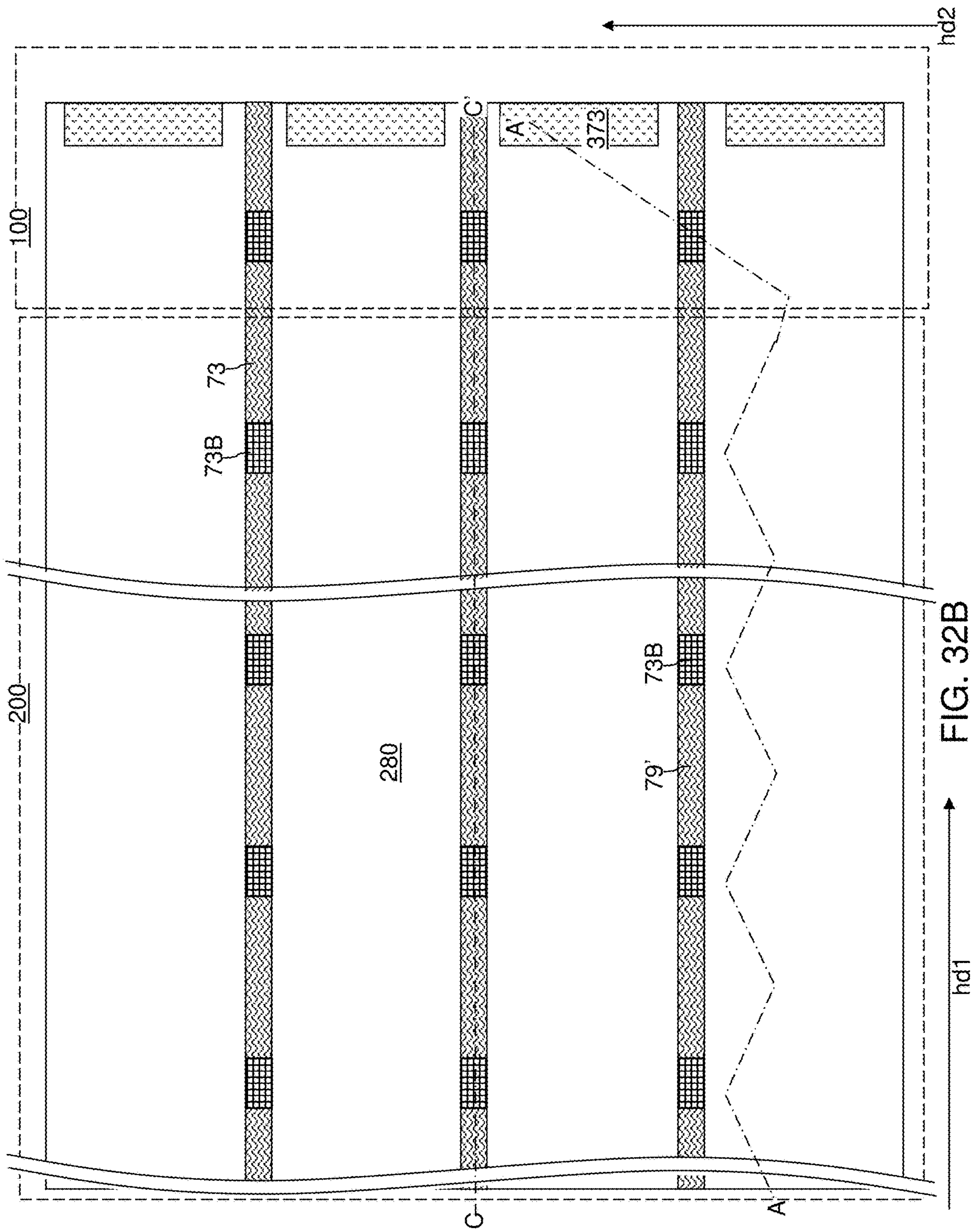
FIG. 32B is a top-down view of the second exemplary structure of FIG. 32A. The hinged vertical plane A-A' corresponds to the plane of the vertical cross-sectional view of FIG. 32A.
Figure 32C:
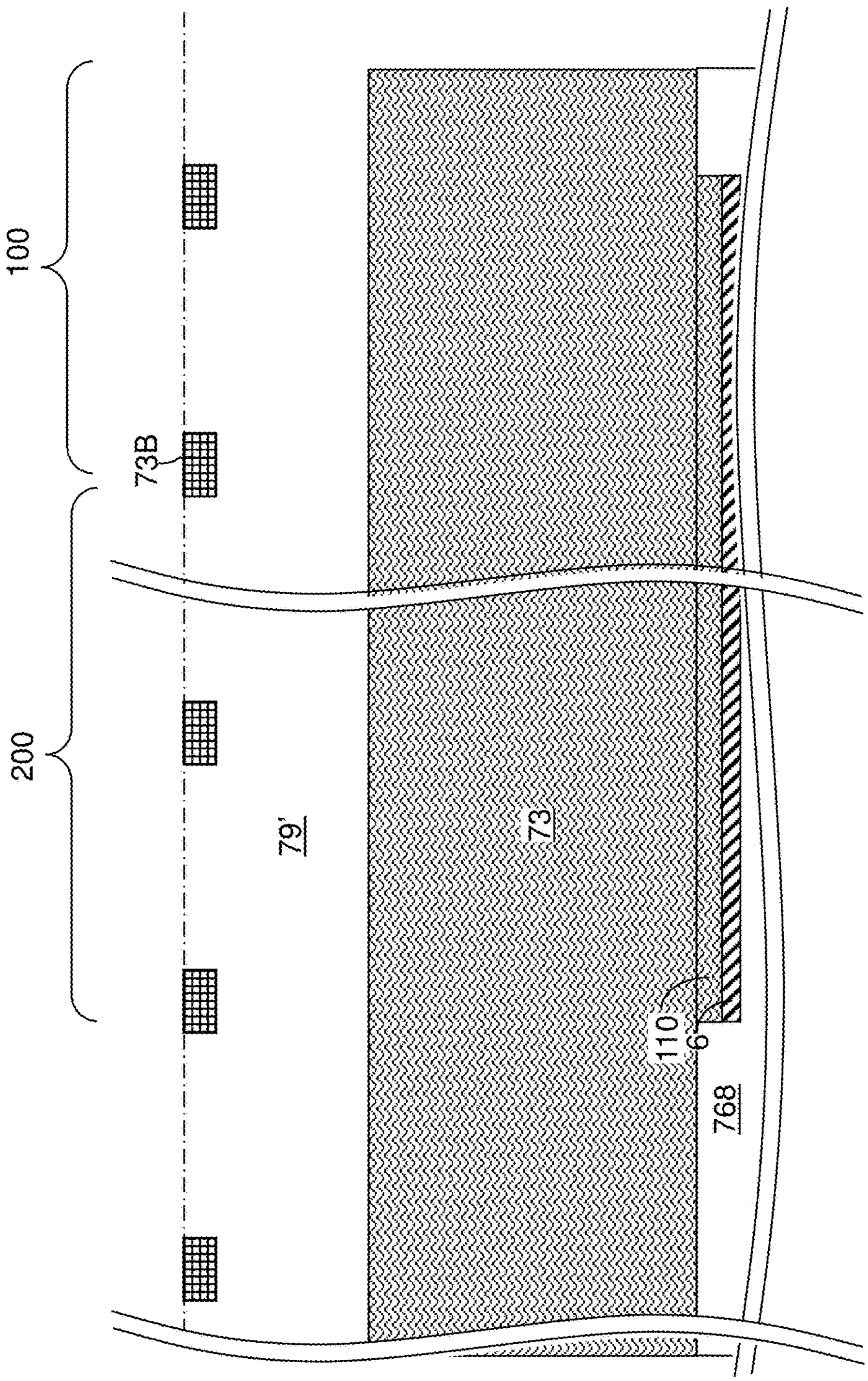
FIG. 32C is a vertical cross-sectional view of the second exemplary structure along the vertical plane C-C' of FIG. 32B.

Referring to FIGS. 32A-32C, a timed first isotropic etch process is performed. Specifically, an etchant that etches the material of the semiconductor backside trench fill structures 73 selective to the material of the first bridge structures 73B can be applied to the second exemplary structure during the first isotropic etch process. For example, a wet etch process employing TMY can be performed to etch the material of the semiconductor backside trench fill structures 73 selective to the material of the first bridge structures 73B. For example, the semiconductor backside trench fill structures 73 may comprise an undoped semiconductor material such as undoped amorphous silicon, undoped polysilicon, an undoped amorphous silicon germanium alloy, or an undoped polycrystalline silicon-germanium, the first bridge structures 73B may comprise a doped semiconductor material including boron atoms at an atomic concentration in a range from $1.0\times10^{19}/cm^3$ to $5.0\times10^{21}/cm^3$, and the etch process may comprise a wet etch process employing TMY. Backside cavities 79' are formed in volumes from which the semiconductor backside trench fill structures 73 are etched.

Generally, the semiconductor backside trench fill structures 73 (e.g., the upper portions of the semiconductor backside trench fill structures 73 as formed at the processing steps of FIGS. 17A and 17B that are not implanted by the boron atoms) can be removed selective to the sets of at least one first bridge structure 73B by performing a timed first selective isotropic etch process. In one embodiment, the first selective isotropic etch process comprises a wet etch process employing trimethyl-2 hydroxyethyl ammonium hydroxide (TMY). The first selective isotropic etch process etches portions of the semiconductor backside trench fill structures 73 that are not doped with the first boron atoms selective to the first bridge structures 73B.

Backside cavities 79' are formed in volumes from which the upper portions of the semiconductor backside trench fill structures 73 are etched by the first selective isotropic etch process. The duration of the first selective isotropic etch process can be selected such that a top surface of the remaining portion of each semiconductor backside trench fill structure 73 can be formed between a horizontal plane including topmost surfaces of the plurality of alternating stacks (32, 42) and a horizontal plane including bottommost surfaces of the plurality of alternating stacks (32, 42). In a non-limiting illustrative example, the top surface of the remaining portion of each semiconductor backside trench fill structure 73 can be formed about one fourth to one third of the thickness of the alternating stacks (32, 42) from the horizontal plane including the topmost surfaces of the alternating stacks (32, 42). Generally, the set of at least one bridge structure 73B can overlie a respective backside cavity 79' within each of the backside trenches 79. Each backside cavity 79' overlies a remaining middle and lower portion of a respective one of the semiconductor backside trench fill structures 73. The first block-level photoresist layer 373 can be subsequently removed, for example, by ashing.

Figure 33A:
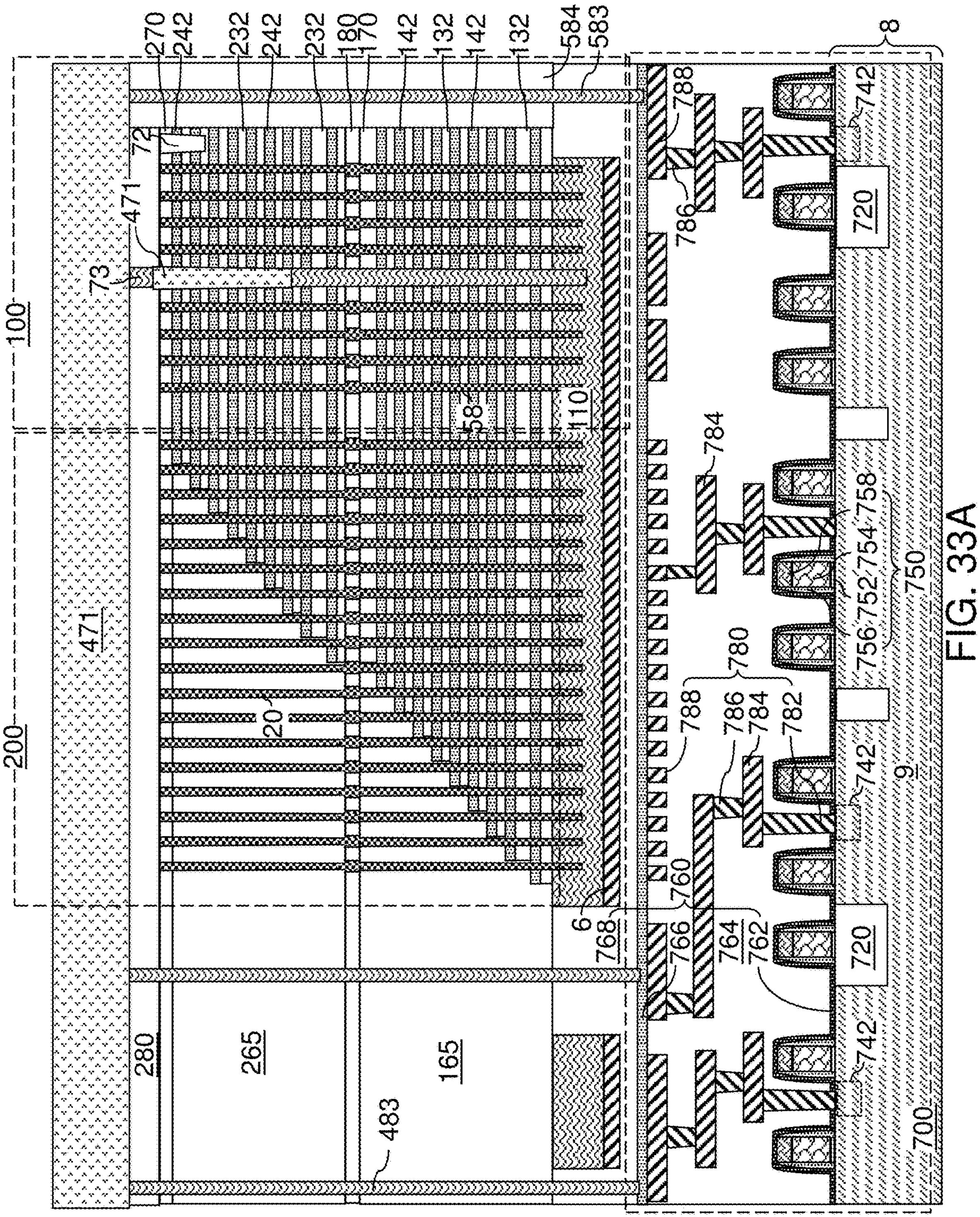
FIG. 33A is a vertical cross-sectional view of the second exemplary structure after formation of a second patterned photoresist layer according to an embodiment of the present disclosure.
Figure 33B:
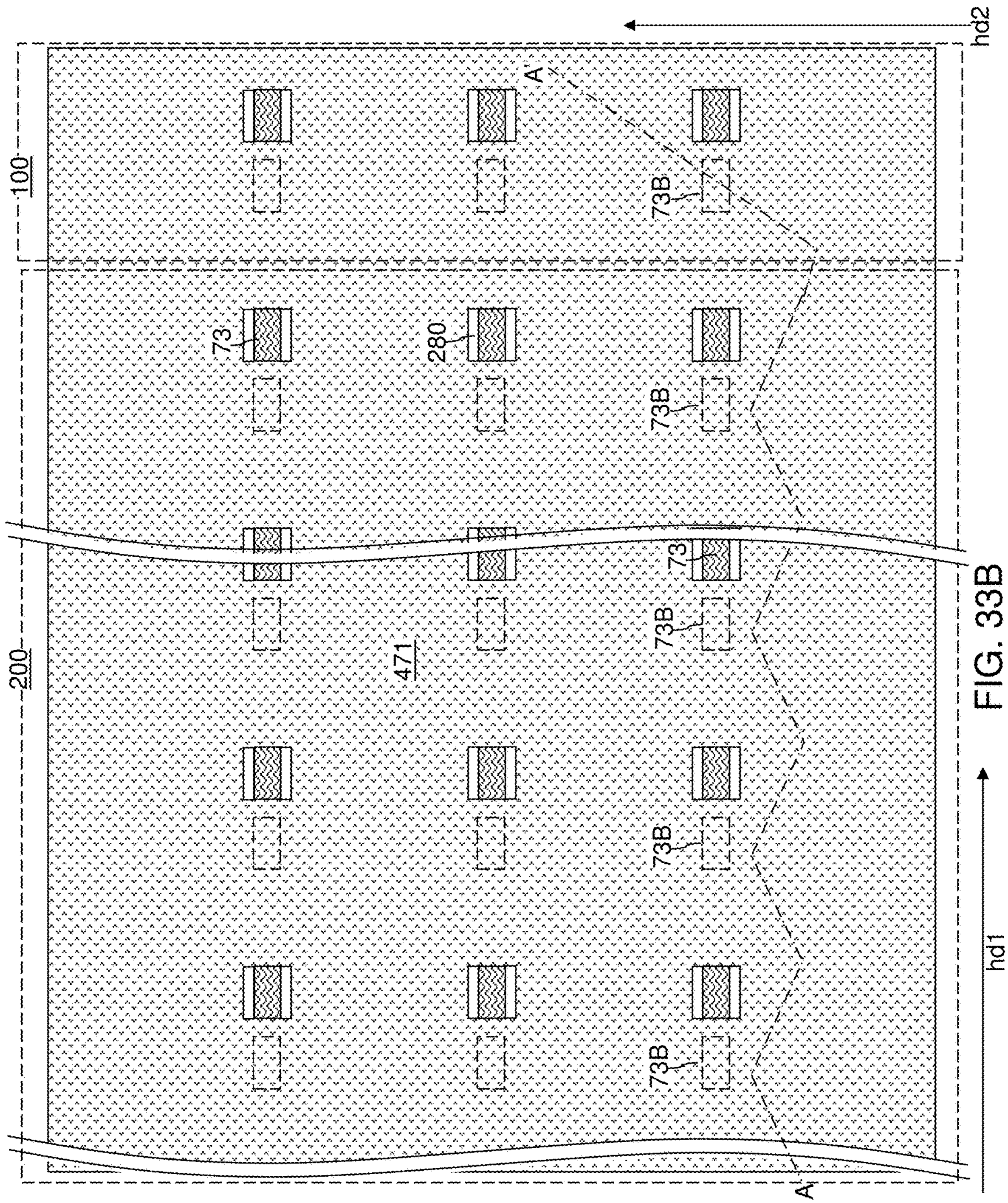
FIG. 33B is a top-down view of the second exemplary structure of FIG. 33A. The hinged vertical plane A-A' corresponds to the plane of the vertical cross-sectional view of FIG. 33A.

Referring to FIGS. 33A and 33B, a second photoresist layer 471 can be applied over the contact-level dielectric layer 280, and can be lithographically patterned to form an array of openings over discrete areas of the semiconductor backside trench fill structures 73. The array of openings in the second patterned photoresist layer 471 may comprise rows of rectangular openings arranged with a periodicity along the first horizontal direction hd1. In one embodiment, the rectangular openings in the second patterned photoresist layer 471 may be laterally offset from the first bridge structures 73B along the first horizontal direction hd1 such that areas of the rectangular openings in the second patterned photoresist layer 471 do not overlap with the areas of the first bridge structures 73B in a plan view. In one embodiment, the periodicity of the rectangular openings over each semiconductor backside trench fill structure 73 may be in a range from 3 times the width of the underlying semiconductor backside trench fill structure 73 to 100 times the width of the underlying semiconductor backside trench fill structure 73, and/or may be in a range from 6 times the width of the underlying semiconductor backside trench fill structure 73 to 50 times the width of the underlying semiconductor backside trench fill structure 73. The length of each opening in the second patterned photoresist layer 471 may be in a range from 0.5 times the width of the underlying semiconductor backside trench fill structure 73 to 5 times the width of the underlying semiconductor backside trench fill structure 73, and/or may be in a range from 1 times the width of the underlying semiconductor backside trench fill structure 73 to 2 times the width of the underlying semiconductor backside trench fill structure 73. In one embodiment, a two-dimensional periodic array of openings can be formed in the second patterned photoresist layer 471 such that a top surface of a semiconductor backside trench fill structure 73 is physically exposed at the bottom each of opening through the second patterned photoresist layer 471. The sacrificial through-memory-level via cavity fill structures 583 and the sacrificial peripheral-region via cavity fill structures 483 are covered with the second patterned photoresist layer 471.

Figure 34A:
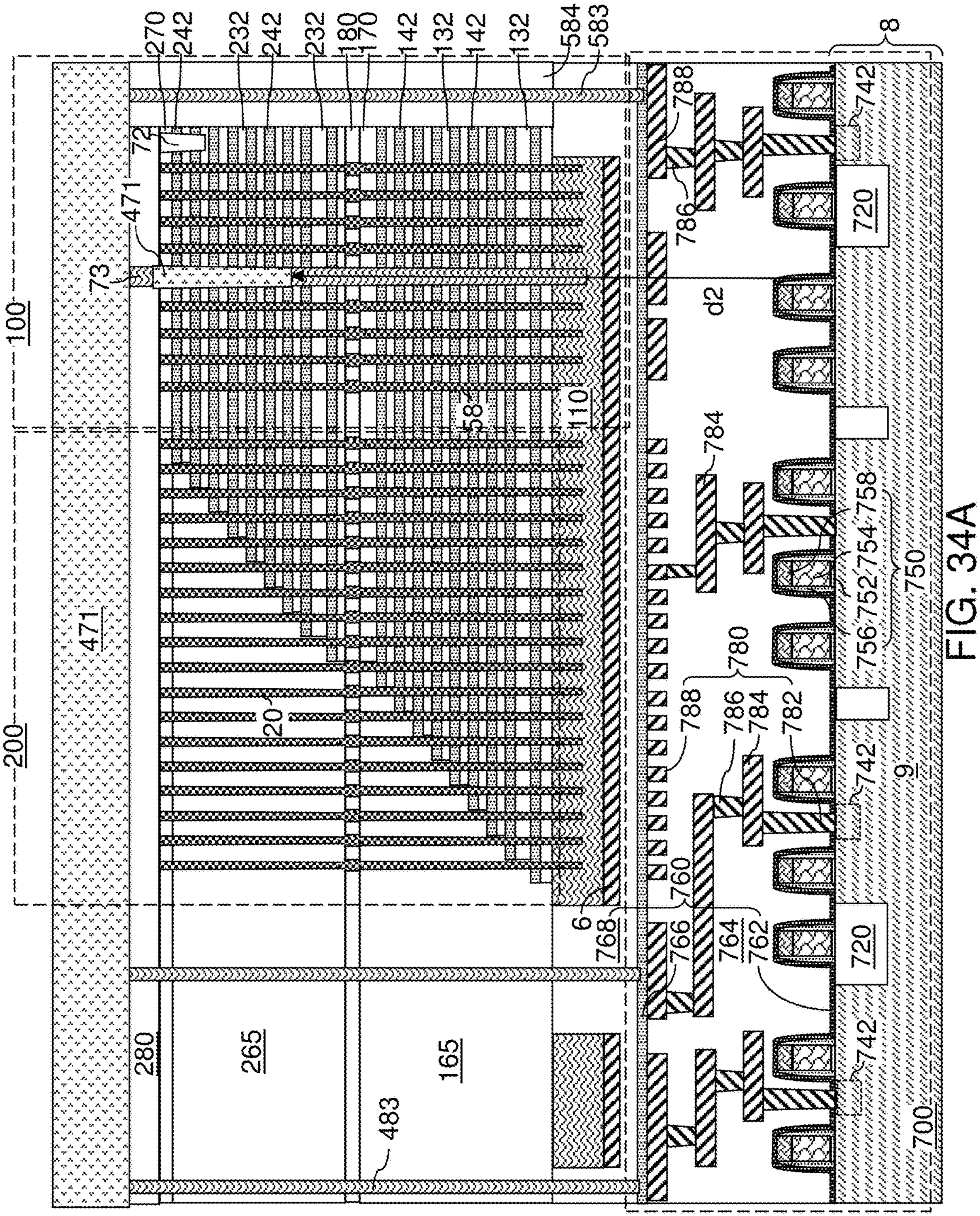
FIG. 34A is a vertical cross-sectional view of the second exemplary structure after formation of second bridge structures by a second boron implantation process according to an embodiment of the present disclosure.
Figure 34B:
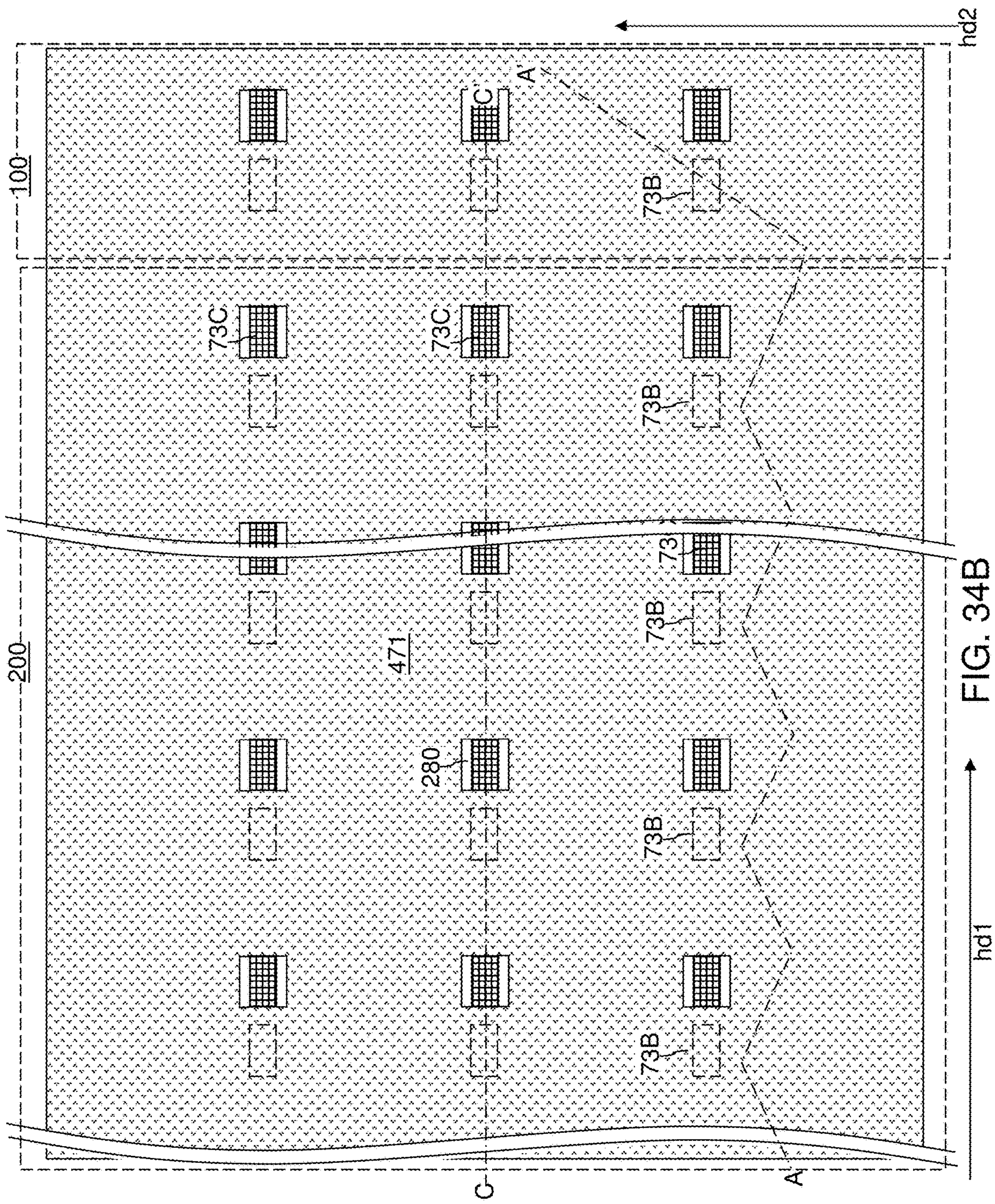
FIG. 34B is a top-down view of the second exemplary structure of FIG. 34A. The hinged vertical plane A-A' corresponds to the plane of the vertical cross-sectional view of FIG. 34A.
Figure 34C:
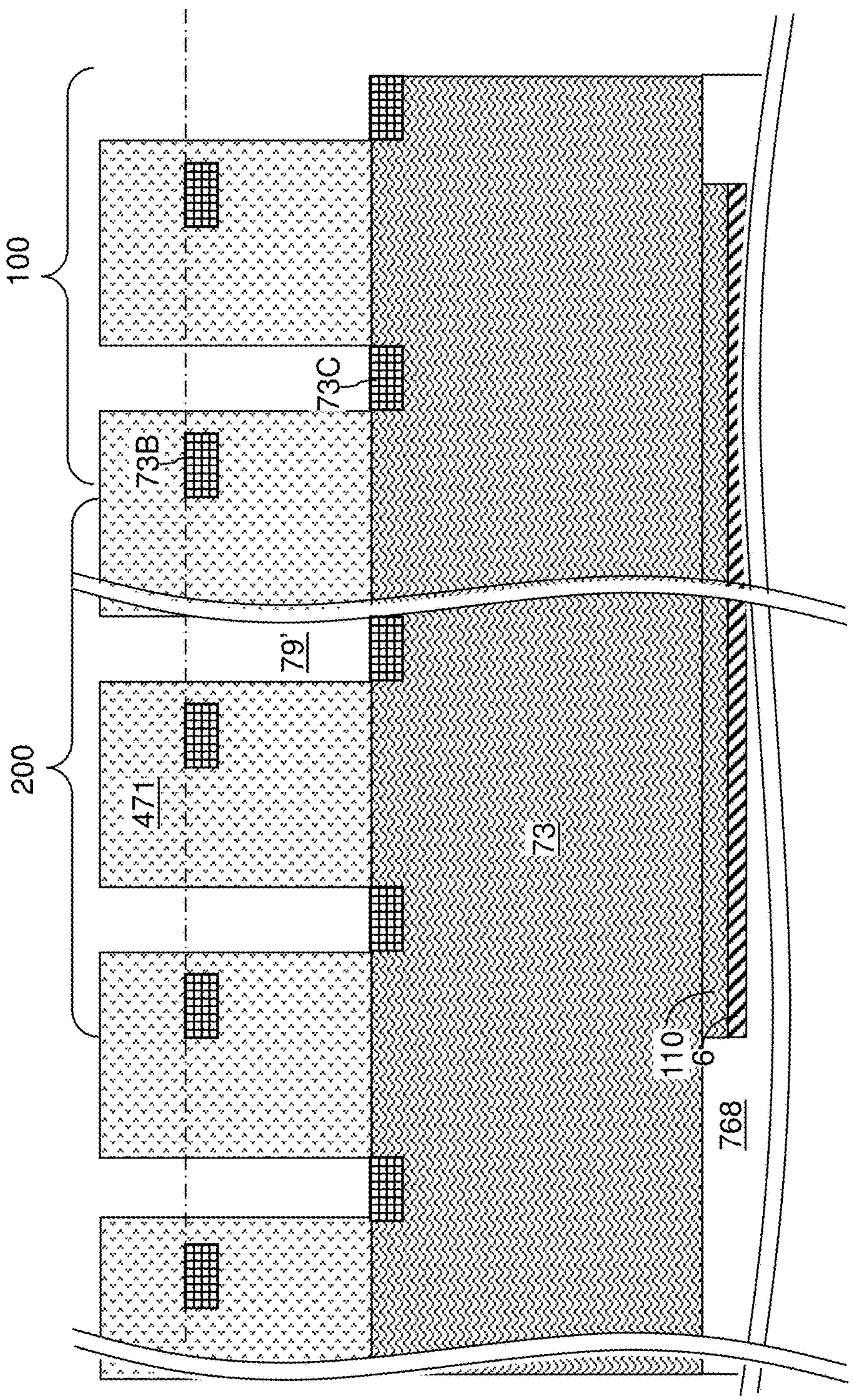
FIG. 34C is a vertical cross-sectional view of the second exemplary structure along the vertical plane C-C' of FIG. 34B.

Referring to FIGS. 34A-34C, dopant atoms that reduce the etch rate of the undoped semiconductor material of the semiconductor backside trench fill structures 73 can be provided through the openings in the second patterned photoresist layer 471 into discrete unmasked surface portions of the semiconductor backside trench fill structures 73. The dopant atoms may be provided by ion implantation, gas phase diffusion doping or any other suitable doping method. A second boron implantation process can be performed to form the implanted regions of the semiconductor backside trench fill structures 73. In one embodiment, the atomic concentration of boron atoms in the implanted regions of the semiconductor backside trench fill structures 73 may be in a range from $1.0\times10^{19}/cm^3$ to $5.0\times10^{21}/cm^3$, such as $1.0\times10^{21}/cm^3$ to $5.0\times10^{21}/cm^3$.

The implanted portions of the semiconductor backside trench fill structures 73 including dopants atoms at an atomic concentration of at least $1.0\times10^{19}/cm^3$, such as at least $1.0\times10^{21}/cm^3$ are herein referred to as second bridge structures 73C, which differ in material composition from the material composition of the unimplanted portions of the semiconductor backside trench fill structures 73 by the presence of the implanted dopants. In one embodiment, the second bridge structures 73C can be formed by implantation of second boron atoms into discrete surface portions of semiconductor (e.g., silicon) backside trench fill structures 73.

Generally, at least one discrete surface portion of the remaining semiconductor backside trench fill structure 73 can be converted into a respective set of one or more second bridge structures 73C within each of the backside trenches 79 by locally implanting the second boron atoms. In one embodiment, a set of at least one second bridge structure 73C comprising a boron-doped semiconductor material (e.g., boron doped silicon) can be formed within each of the backside trenches 79. In one embodiment, the at least one second bridge structure 73C consists essentially of boron-doped silicon or a boron-doped silicon-germanium alloy.

In one embodiment, the plurality of second bridge structures 73C may be formed such that the plurality of second bridge structures 73C comprises a periodic one-dimensional array of second bridge structures 73C having a periodicity along the first horizontal direction hd1. The second patterned photoresist layer 471 can be subsequently removed, for example, by ashing.

Generally, discrete surface portions of each remaining portion of the semiconductor backside trench fill structures 73 can be converted into the second bridge structures 73C by implanting second boron atoms into unmasked surface regions of the remaining portions of the semiconductor backside trench fill structures 73. In one embodiment, second bridge structures 73C comprising a second doped semiconductor material are formed within each of the backside trenches 79 at a second vertical distance d2 from a horizontal plane including a top surface of the substrate 8. The second vertical distance d2 is less than the first vertical distance d1. In one embodiment, a row of second bridge structures 73C can be arranged along the first horizontal direction hd1 within each of the backside trenches 79, and can be embedded within a remaining portion of a respective one of the semiconductor backside trench fill structures 73.

In one embodiment, each backside trench 79 can be located between a pair of alternating stacks (32, 42). In one embodiment, a row of first bridge structures 73B can be arranged along the first horizontal direction hd1 and can be located at a first vertical distance d1 from a horizontal plane including a top surface of the substrate 8, and a row of second bridge structures 73C can be arranged along the first horizontal direction hd1 and can be located at a second vertical distance d2 from the horizontal plane including the top surface of the substrate 8. The second vertical distance d2 is different from the first vertical distance d1. In one embodiment, the second bridge structures 73C are laterally offset from the first bridge structures 73B along the first horizontal direction hd1 such that the second bridge structures 73C do not have an areal overlap with the first bridge structures 73B. In one embodiment, the first bridge structures 73B are located above a horizontal plane including topmost surfaces of the alternating stacks (32, 42), and the second bridge structures 73C are located below the horizontal plane including the topmost surfaces of the alternating stacks (32, 42).

Figure 35A:
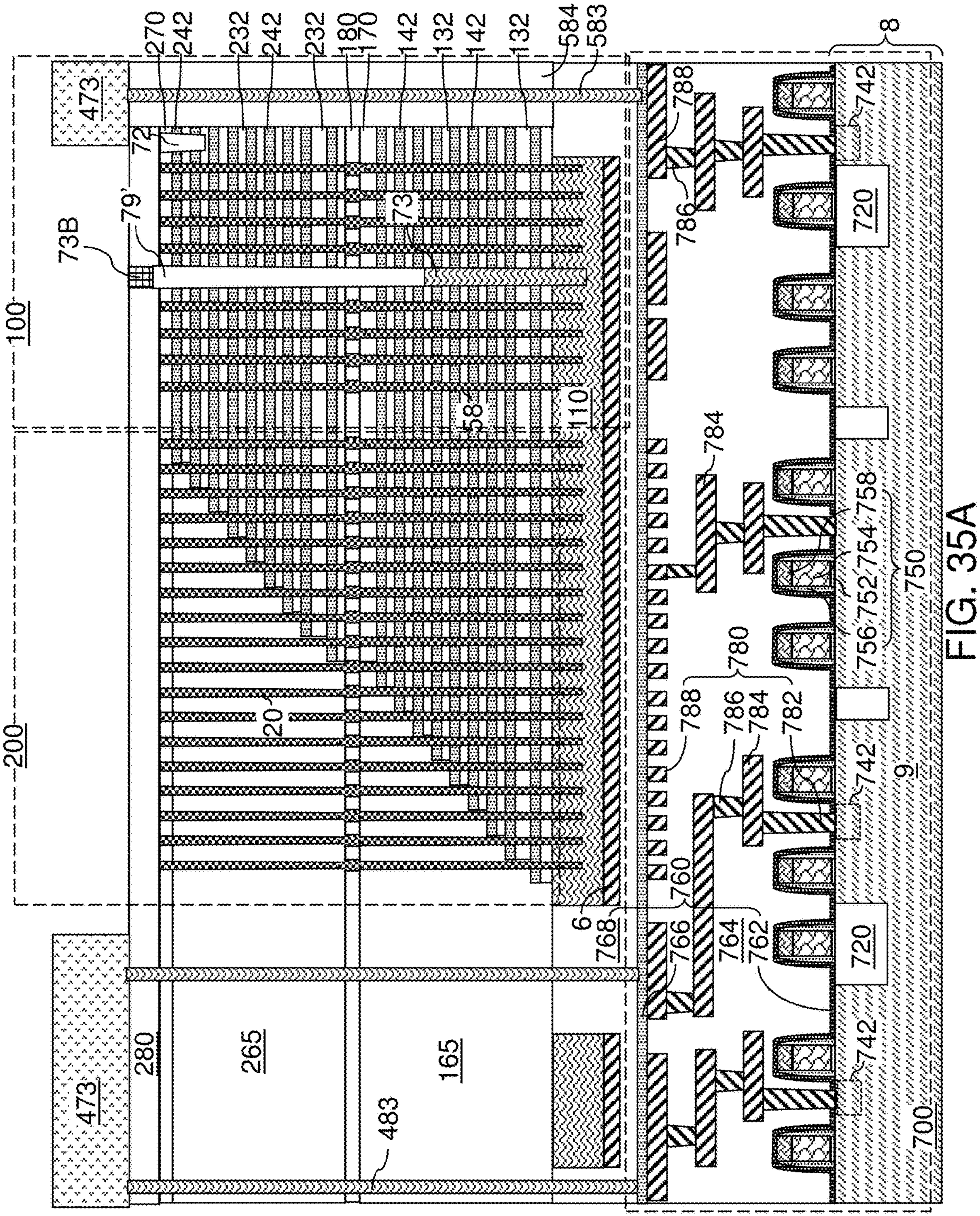
FIG. 35A is a vertical cross-sectional view of the second exemplary structure after formation of a second block-level photoresist layer and selectively recessing undoped portions of the semiconductor backside trench fill structures relative to the first and second bridge structures according to an embodiment of the present disclosure.
Figure 35B:
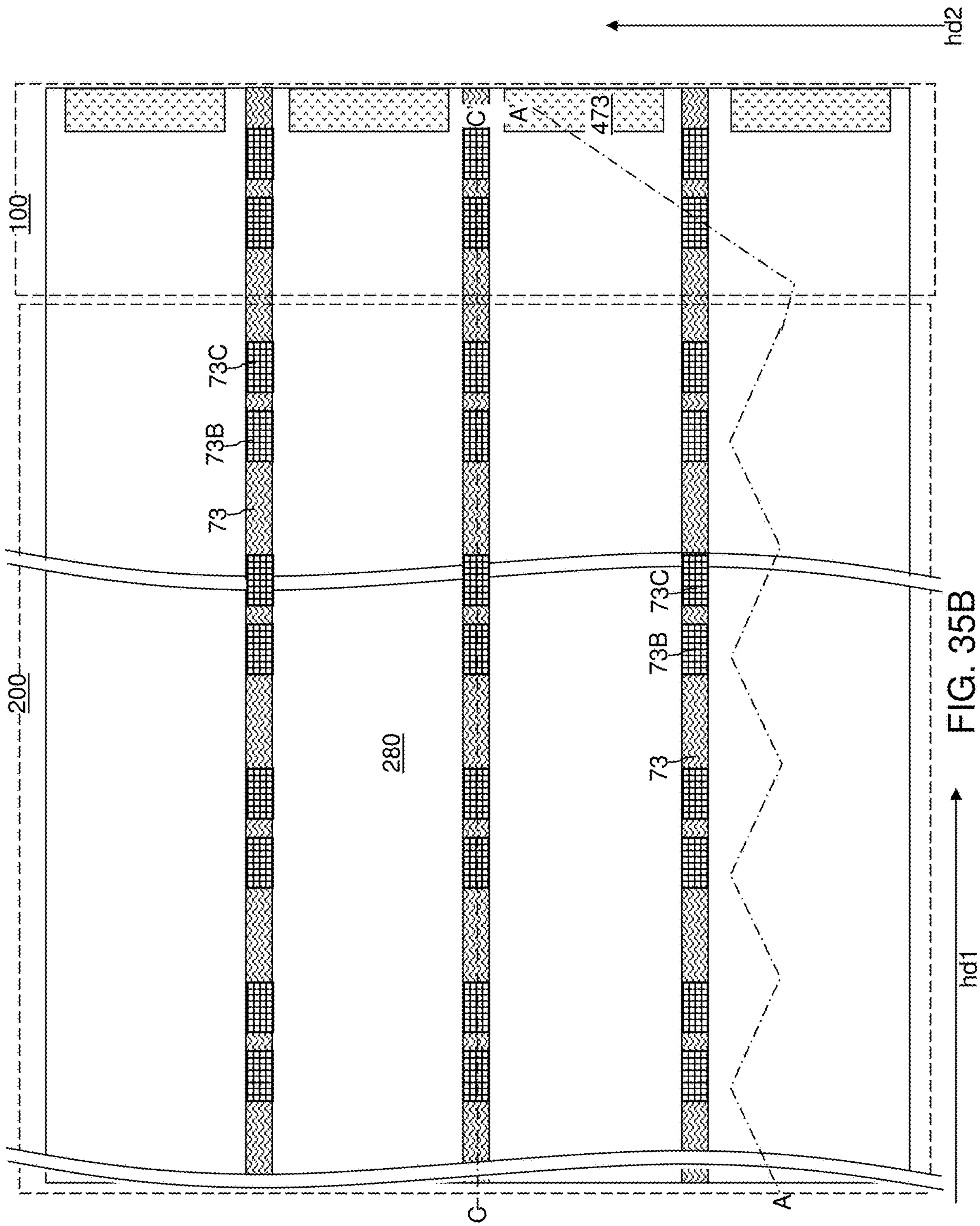
FIG. 35B is a top-down view of the second exemplary structure of FIG. 35A. The hinged vertical plane A-A' corresponds to the plane of the vertical cross-sectional view of FIG. 35A.
Figure 35C:
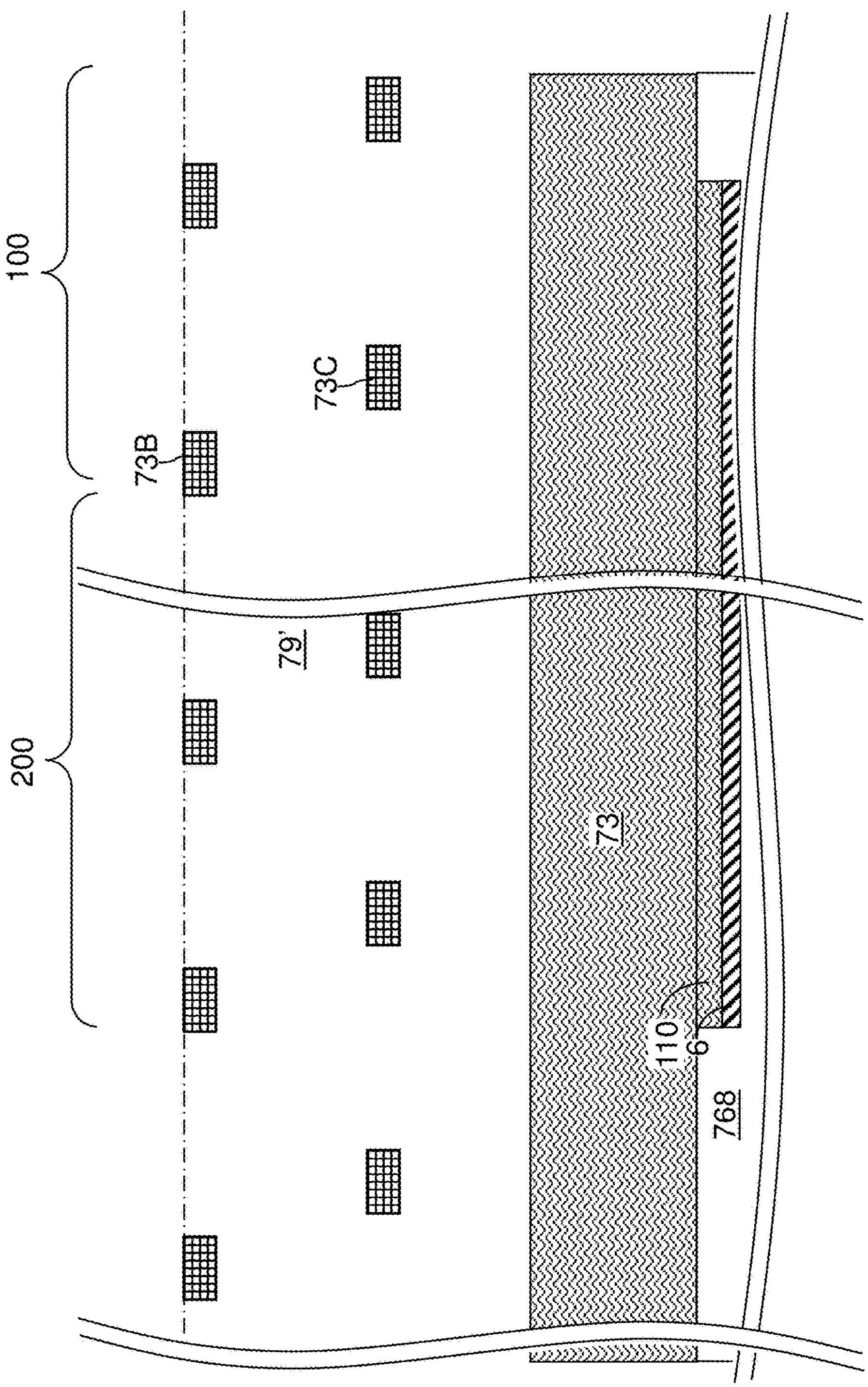
FIG. 35C is a vertical cross-sectional view of the second exemplary structure along the vertical plane C-C' of FIG. 35B.

Referring to FIGS. 35A-35C, the second photoresist layer 471 can be removed, for example, by ashing. Another photoresist layer, which is herein referred to as a second block-level photoresist layer 473, can be applied over the second exemplary structure. The second block-level photoresist layer 473 can be lithographically patterned to cover the sacrificial through-memory-level via cavity fill structures 583 and the sacrificial peripheral-region via cavity fill structures 483 without covering the physically exposed top surfaces of the semiconductor backside trench fill structures 73.

A second isotropic etch process is performed. Specifically, an etchant that etches the material of the semiconductor backside trench fill structures 73 selective to the material of the first bridge structures 73B and the second bridge structures 73C can be applied to the second exemplary structure during the second isotropic etch process. For example, a wet etch process employing TMY can be performed to etch the material of the semiconductor backside trench fill structures 73 selective to the materials of the first bridge structures 73B and the second bridge structures 73C. For example, the semiconductor backside trench fill structures 73 may comprise an undoped semiconductor material, such as undoped amorphous silicon, undoped polysilicon, an undoped amorphous silicon germanium alloy, or an undoped polycrystalline silicon-germanium, the second bridge structures 73C may comprise a doped semiconductor material including boron atoms at an atomic concentration in a range from $1.0\times10^{19}/cm^3$ to $5.0\times10^{21}/cm^3$, and the etch process may comprise a wet etch process employing TMY. Backside cavities 79' are vertically extended by the second isotropic etch process.

Generally, the semiconductor backside trench fill structures 73 (e.g., the portions of the semiconductor backside trench fill structures 73 as formed at the processing steps of FIGS. 17A and 17B that are not implanted by the boron atoms) can be removed selective to the first bridge structures 73B and the second bridge structures 73C by performing a second selective isotropic etch process. In one embodiment, the second selective isotropic etch process comprises a wet etch process employing trimethyl-2 hydroxyethyl ammonium hydroxide (TMY). The second selective isotropic etch process etches portions of the semiconductor backside trench fill structures 73 that are not doped with the second boron atoms selective to the first bridge structures 73B and the second bridge structures 73C.

Backside cavities 79' are formed in volumes from which portions of the semiconductor backside trench fill structures 73 are etched by the second selective isotropic etch process. The duration of the second selective isotropic etch process can be selected such that a top surface of the remaining portion of each semiconductor backside trench fill structure 73 can be formed between a horizontal plane including topmost surfaces of the plurality of alternating stacks (32, 42) and a horizontal plane including bottommost surfaces of the plurality of alternating stacks (32, 42). In a non-limiting illustrative example, the top surface of the remaining portion of each semiconductor backside trench fill structure 73 can be formed about one half of the thickness of the alternating stacks (32, 42) from the horizontal plane including the topmost surfaces of the alternating stacks (32, 42). Generally, a set of at least one bridge structure (73B, 73C) can overlie a respective backside cavity 79' within each of the backside trenches 79. Each backside cavity 79' overlies a remaining portion of a respective one of the semiconductor backside trench fill structures 73. The second block-level photoresist layer 473 can be subsequently removed, for example, by ashing.

Figure 36A:
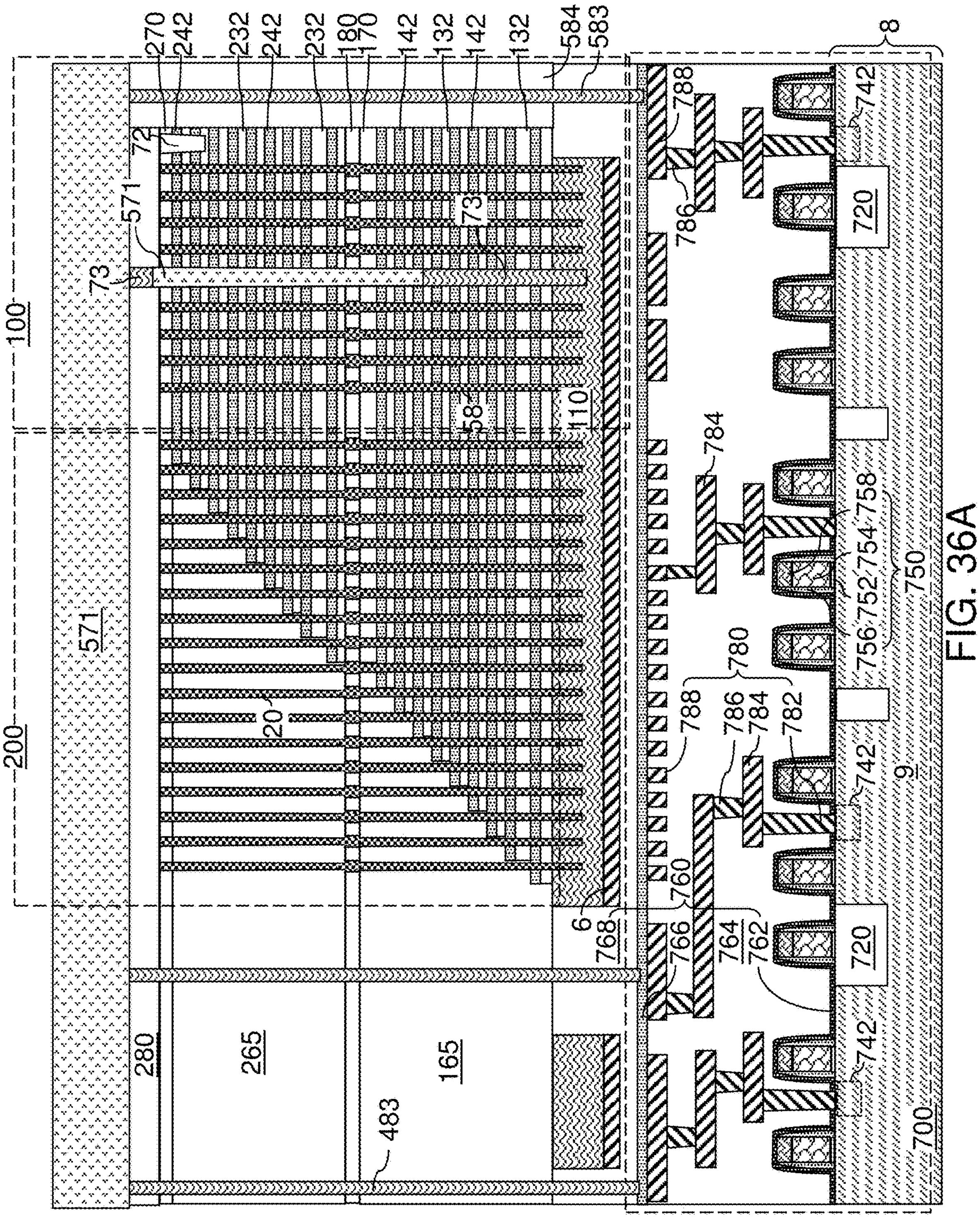
FIG. 36A is a vertical cross-sectional view of the second exemplary structure after formation of a third patterned photoresist layer according to an embodiment of the present disclosure.
Figure 36B:
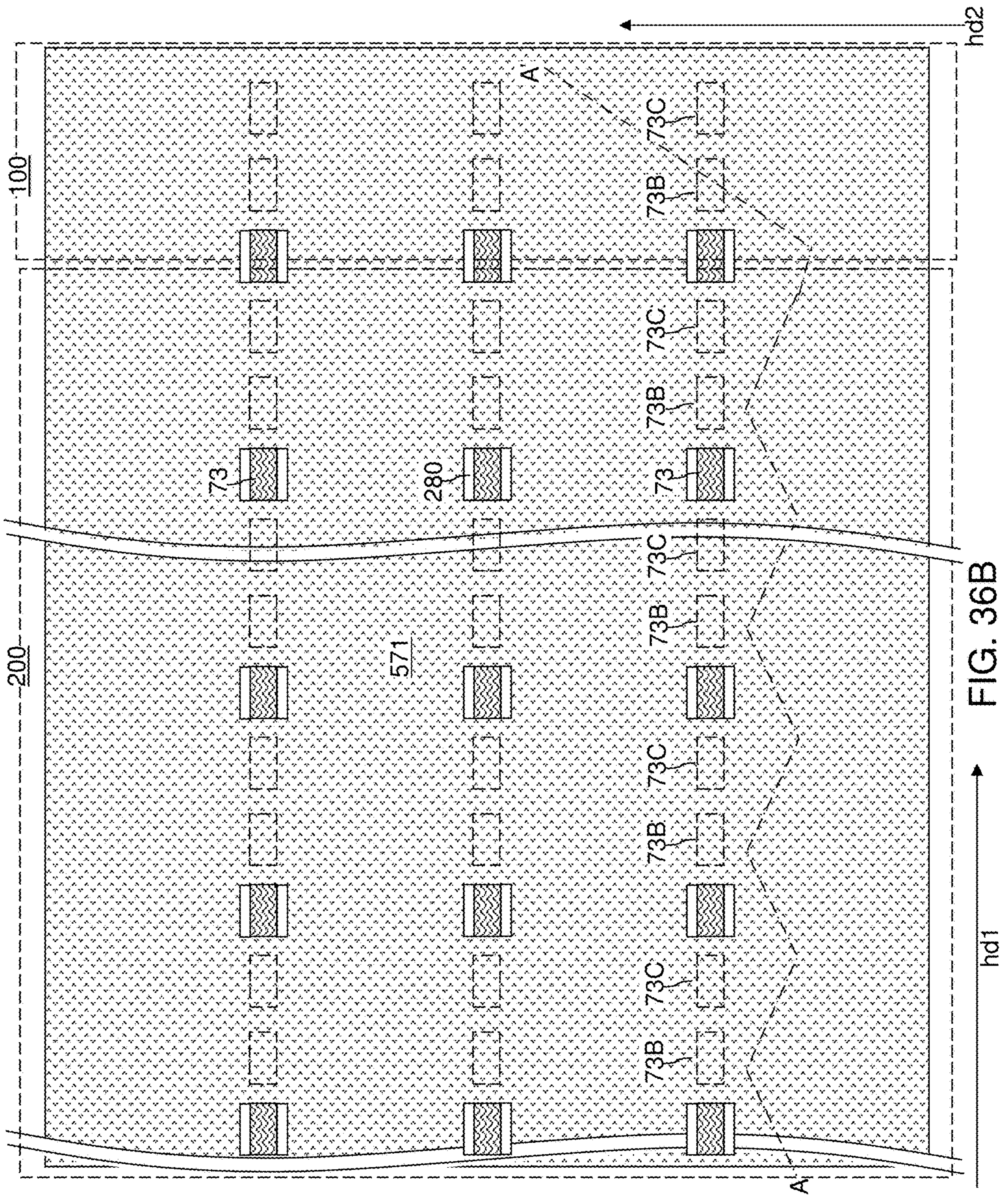
FIG. 36B is a top-down view of the second exemplary structure of FIG. 36A. The hinged vertical plane A-A' corresponds to the plane of the vertical cross-sectional view of FIG. 36A.

Referring to FIGS. 36A and 36B, a third photoresist layer 571 can be applied over the contact-level dielectric layer 280, and can be lithographically patterned to form an array of openings over discrete areas of the semiconductor backside trench fill structures 73. The array of openings in the third patterned photoresist layer 571 may comprise rows of rectangular openings arranged with a periodicity along the first horizontal direction hd1. In one embodiment, the rectangular openings in the third patterned photoresist layer 571 may be laterally offset from the first bridge structures 73B and the second bridge structures 73C such that areas of the rectangular openings in the third patterned photoresist layer 571 do not overlap with the areas of the first bridge structures 73B or the second bridge structures 73C in a plan view. In one embodiment, the periodicity of the rectangular openings over each semiconductor backside trench fill structure 73 may be in a range from 3 times the width of the underlying semiconductor backside trench fill structure 73 to 100 times the width of the underlying semiconductor backside trench fill structure 73, and/or may be in a range from 6 times the width of the underlying semiconductor backside trench fill structure 73 to 50 times the width of the underlying semiconductor backside trench fill structure 73. The length of each opening in the third patterned photoresist layer 571 may be in a range from 0.5 times the width of the underlying semiconductor backside trench fill structure 73 to 5 times the width of the underlying semiconductor backside trench fill structure 73, and/or may be in a range from 1 times the width of the underlying semiconductor backside trench fill structure 73 to 2 times the width of the underlying semiconductor backside trench fill structure 73. In one embodiment, a two-dimensional periodic array of openings can be formed in the third patterned photoresist layer 571 such that a top surface of a semiconductor backside trench fill structure 73 is physically exposed at the bottom each of opening through the third patterned photoresist layer 571. The sacrificial through-memory-level via cavity fill structures 583 and the sacrificial peripheral-region via cavity fill structures 583 are covered with the third patterned photoresist layer 571.

Figure 37A:
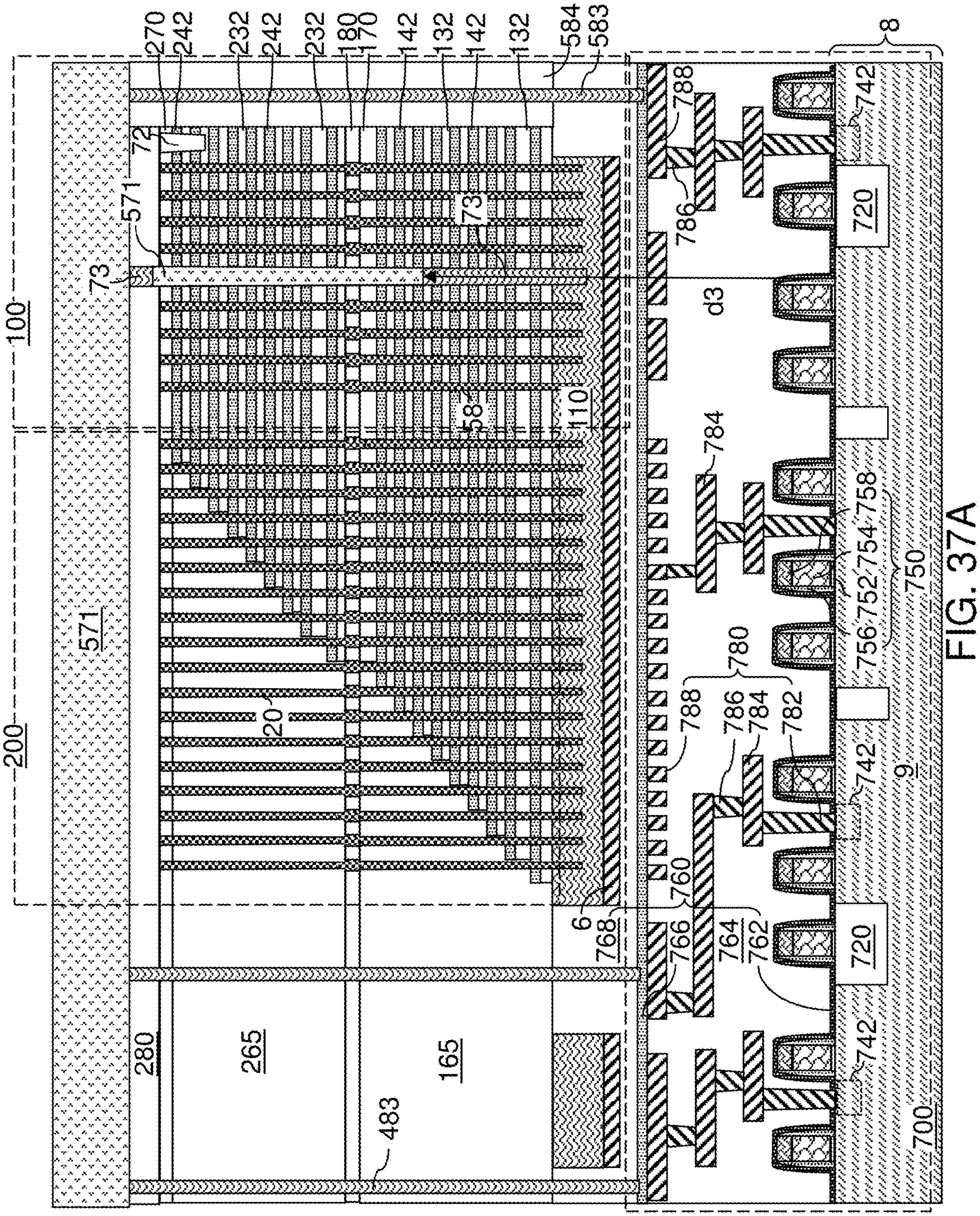
FIG. 37A is a vertical cross-sectional view of the second exemplary structure after formation of third bridge structures by a third boron implantation process according to an embodiment of the present disclosure.
Figure 37B:
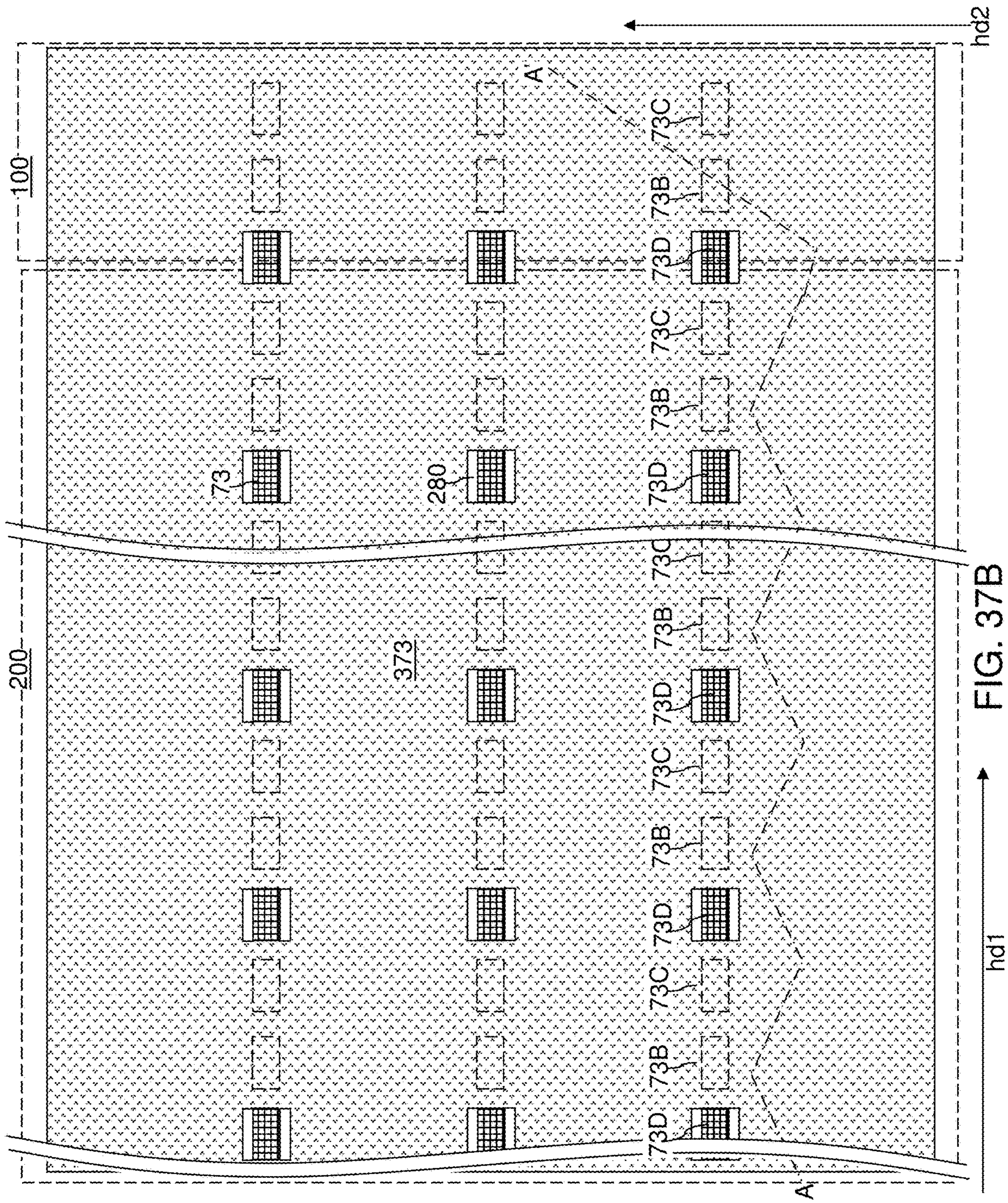
FIG. 37B is a top-down view of the second exemplary structure of FIG. 37A. The hinged vertical plane A-A' corresponds to the plane of the vertical cross-sectional view of FIG. 37A.
Figure 37C:
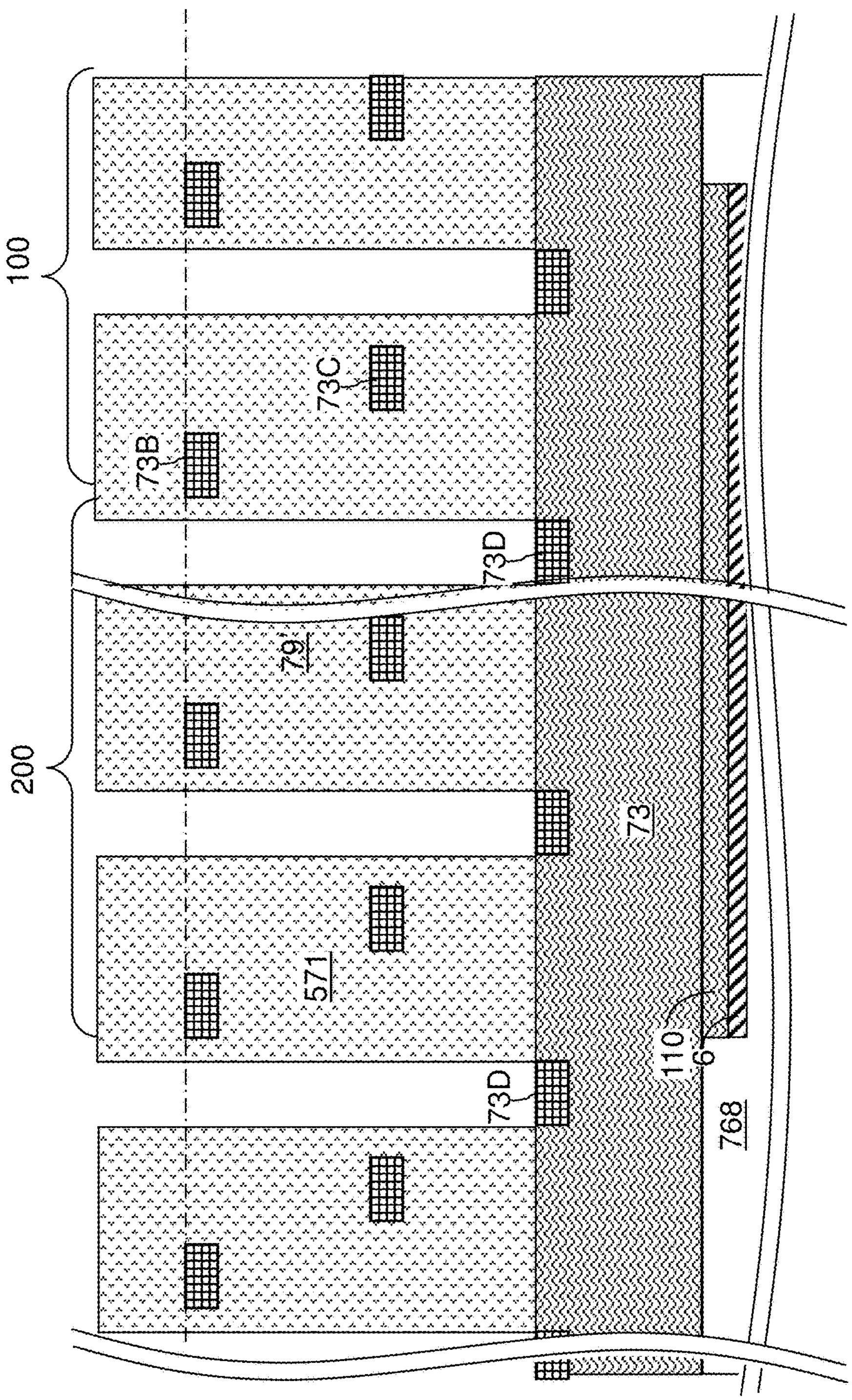
FIG. 37C is a vertical cross-sectional view of the second exemplary structure along the vertical plane C-C' of FIG. 37B.

Referring to FIGS. 37A-37C, dopant atoms that reduce the etch rate of the undoped semiconductor material of the semiconductor backside trench fill structures 73 can be provided through the openings in the third patterned photoresist layer 571 into discrete unmasked surface portions of the semiconductor backside trench fill structures 73. The dopant atoms may be provided by ion implantation, gas phase diffusion doping or any other suitable doping method. A third boron implantation process can be performed to form the implanted regions of the semiconductor backside trench fill structures 73. In one embodiment, the atomic concentration of boron atoms in the implanted regions of the semiconductor backside trench fill structures 73 may be in a range from $1.0\times10^{19}/cm^3$ to $5.0\times10^{21}/cm^3$, such as from $1.0\times10^{21}/cm^3$ to $5.0\times10^{21}/cm^3$.

The implanted portions of the semiconductor backside trench fill structures 73 including dopants atoms at an atomic concentration of at least $1.0\times10^{19}/cm^3$, such as at least $1.0\times10^{21}/cm^3$ are herein referred to as third bridge structures 73D, which differ in material composition from the material composition of the unimplanted portions of the semiconductor backside trench fill structures 73 by the presence of the implanted dopants. In one embodiment, the third bridge structures 73D can be formed by implantation of third boron atoms into discrete surface portions of semiconductor (e.g., silicon) backside trench fill structures 73.

Generally, at least one discrete surface portion of the semiconductor backside trench fill structure 73 can be converted into a respective set of one or more third bridge structures 73D within each of the backside trenches 79 by locally implanting the third boron atoms. In one embodiment, a set of at least one third bridge structure 73D comprising a boron-doped semiconductor material (e.g., boron doped silicon) can be formed within each of the backside trenches 79. In one embodiment, the at least one third bridge structure 73D consists essentially of boron-doped silicon or a boron-doped silicon-germanium alloy.

In one embodiment, the plurality of third bridge structures 73D may be formed such that the plurality of third bridge structures 73D comprises a periodic one-dimensional array of third bridge structures 73D having a periodicity along the first horizontal direction hd1. The third patterned photoresist layer 571 can be subsequently removed, for example, by ashing.

Generally, discrete surface portions of each remaining portion of the semiconductor backside trench fill structures 73 can be converted into the third bridge structures 73D by implanting third boron atoms into unmasked surface regions of the remaining portions of the semiconductor backside trench fill structures 73. In one embodiment, third bridge structures 73D comprising a third doped semiconductor material are formed within each of the backside trenches 79 at a third vertical distance d3 from a horizontal plane including a top surface of the substrate 8. The third vertical distance d3 is less than the first vertical distance d1 and is less than the second vertical distance d2. In one embodiment, a row of third bridge structures 73D can be arranged along the first horizontal direction hd1 within each of the backside trenches 79, and can be embedded within a remaining portion of a respective one of the semiconductor backside trench fill structures 73.

In one embodiment, each backside trench 79 can be located between a pair of alternating stacks (32, 42). In one embodiment, a row of first bridge structures 73B can be arranged along the first horizontal direction hd1 and can be located at a first vertical distance d1 from a horizontal plane including a top surface of the substrate 8, a row of second bridge structures 73C can be arranged along the first horizontal direction hd1 and can be located at a second vertical distance d2 from a horizontal plane including a top surface of the substrate 8, and a row of third bridge structures 73D can be arranged along the first horizontal direction hd1 and can be located at a third vertical distance d3 from the horizontal plane including the top surface of the substrate 8. The third vertical distance d3 is different from (e.g., smaller than) the first vertical distance d1 and from the second vertical distance d2. In one embodiment, the third bridge structures 73D are laterally offset from the first bridge structures 73B and from the second bridge structures 73C along the first horizontal direction hd1 such that the third bridge structures 73D do not have an areal overlap with the first bridge structures 73B or with the second bridge structures 73C. In one embodiment, the first bridge structures 73B are located above a horizontal plane including topmost surfaces of the alternating stacks (32, 42), and the second bridge structures 73C and the third bridge structures 73D are located below the horizontal plane including the topmost surfaces of the alternating stacks (32, 42).

Figure 38A:
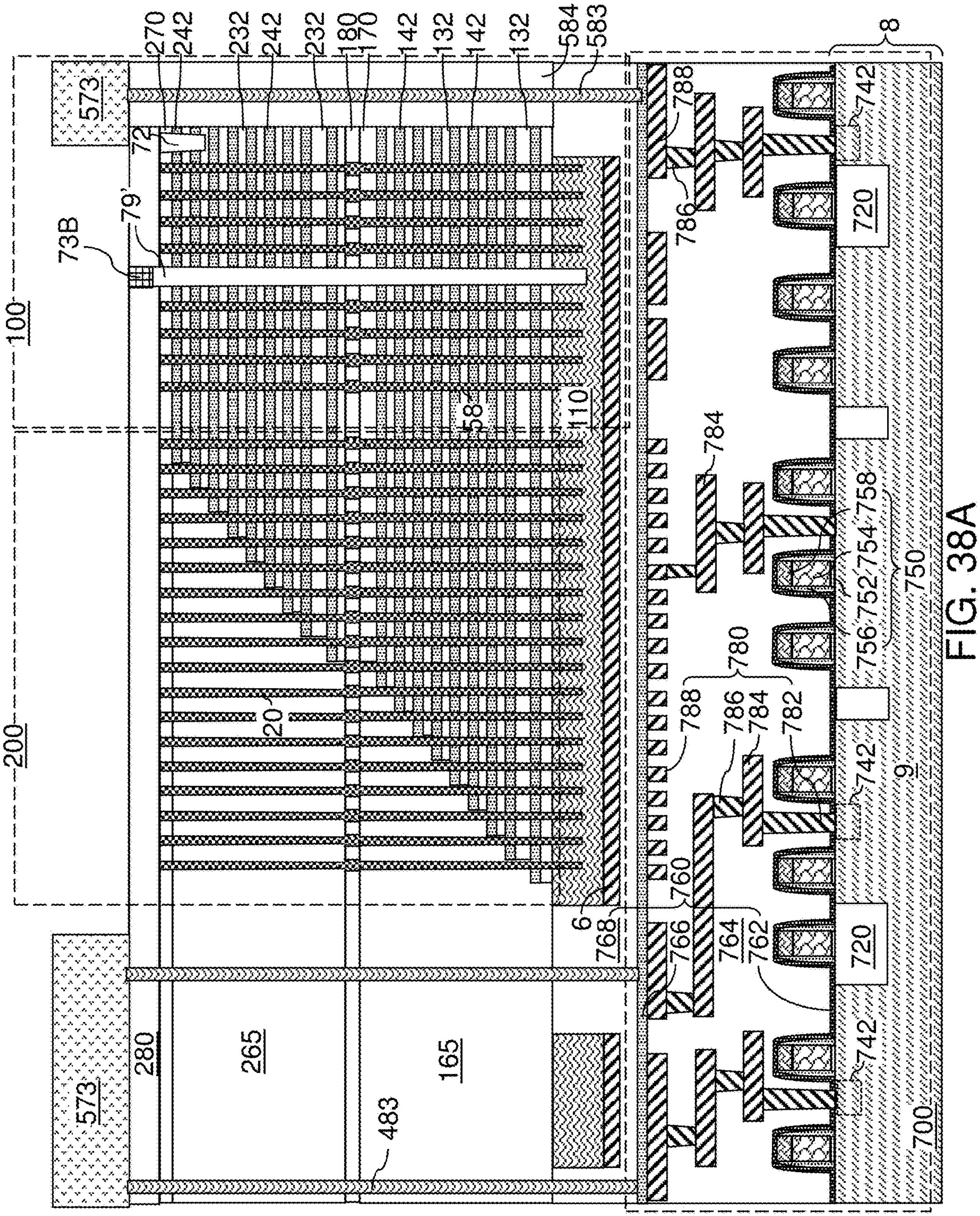
FIG. 38A is a vertical cross-sectional view of the second exemplary structure after formation of a third block-level photoresist layer and removing undoped portions of the semiconductor backside trench fill structures relative to the first, second, and third bridge structures according to an embodiment of the present disclosure.
Figure 38B:
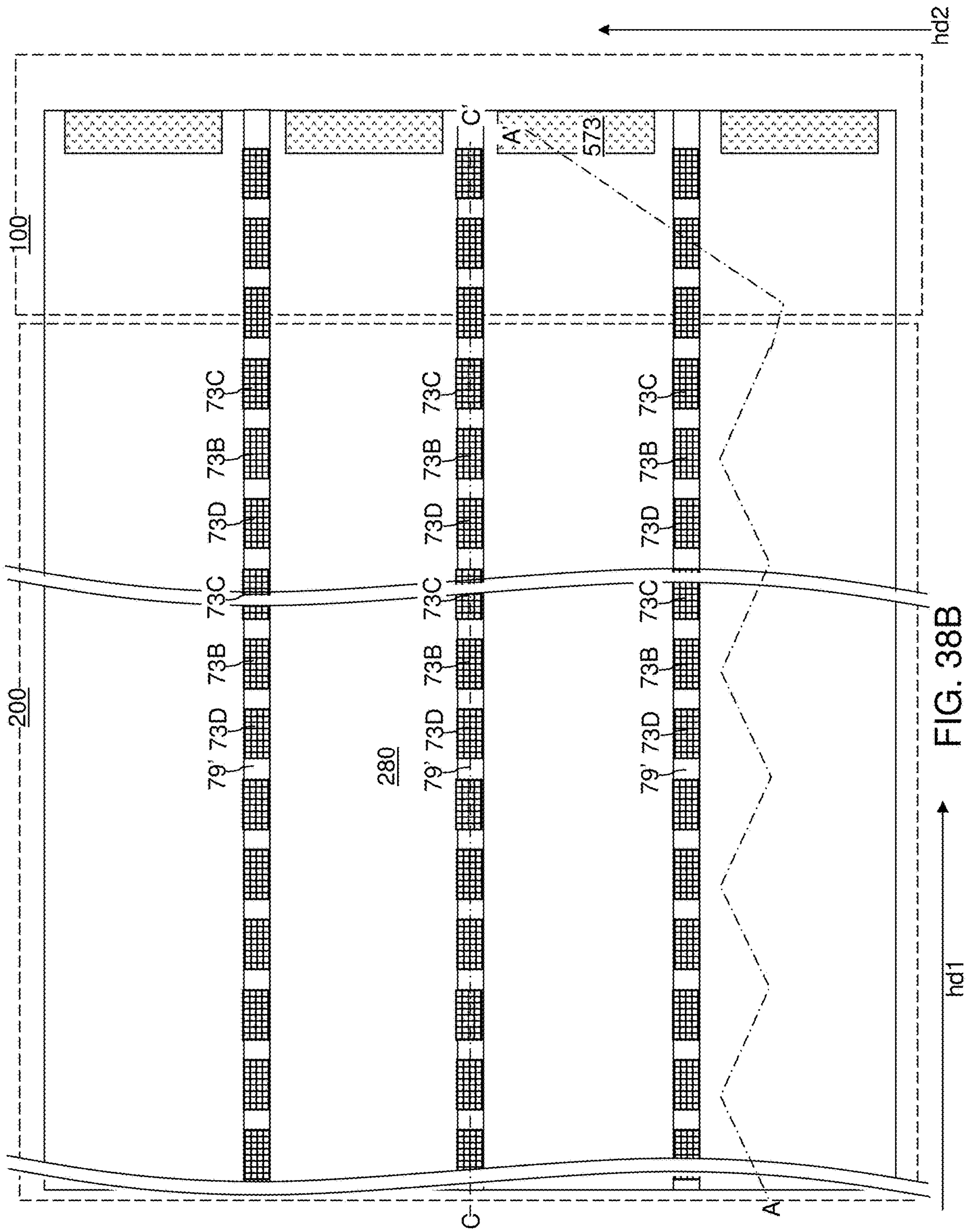
FIG. 38B is a top-down view of the second exemplary structure of FIG. 38A. The hinged vertical plane A-A' corresponds to the plane of the vertical cross-sectional view of FIG. 38A.
Figure 38C:
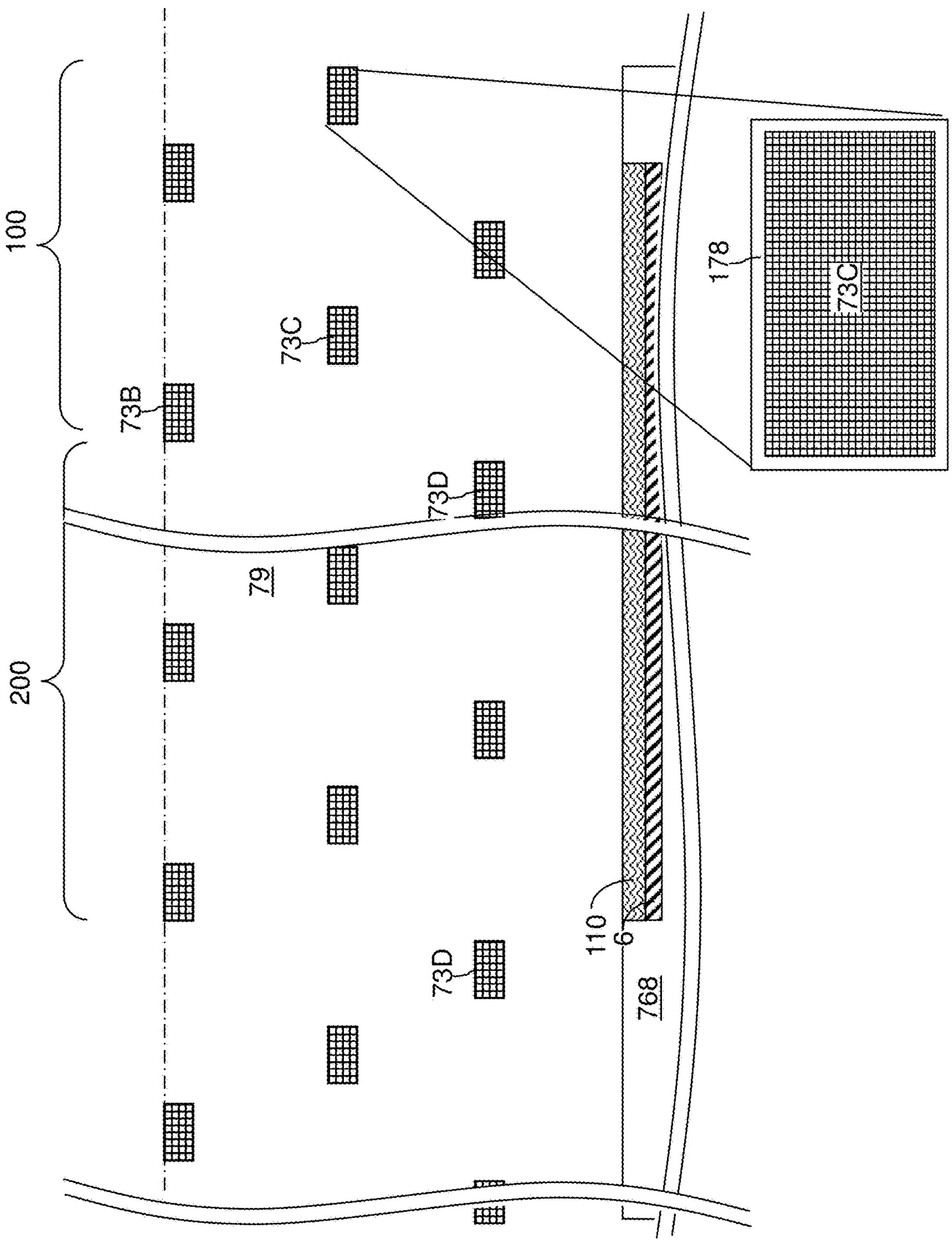
FIG. 38C is a vertical cross-sectional view of the second exemplary structure along the vertical plane C-C' of FIG. 38B.

Referring to FIGS. 38A-38C, the third photoresist layer 571 can be removed, for example, by ashing. Another photoresist layer, which is herein referred to as a third block-level photoresist layer 573, can be applied over the third exemplary structure. The third block-level photoresist layer 573 can be lithographically patterned to cover the sacrificial through-memory-level via cavity fill structures 583 and the sacrificial peripheral-region via cavity fill structures 583 without covering the physically exposed top surfaces of the semiconductor backside trench fill structures 73.

A third isotropic etch process is performed. Specifically, an etchant that etches the material of the semiconductor backside trench fill structures 73 selective to the material of the first bridge structures 73B, the second bridge structures 73C, and the third bridge structures 73D can be applied to the third exemplary structure during the third isotropic etch process. For example, a wet etch process employing TMY can be performed to etch the material of the semiconductor backside trench fill structures 73 selective to the materials of the first bridge structures 73B, the second bridge structures 73C and the third bridge structures 73D. For example, the semiconductor backside trench fill structures 73 may comprise an undoped semiconductor material such as undoped amorphous silicon, undoped polysilicon, an undoped amorphous silicon germanium alloy, or an undoped polycrystalline silicon-germanium, the third bridge structures 73D may comprise a doped semiconductor material including boron atoms at an atomic concentration in a range from $1.0\times10^{19}/cm^3$ to $5.0\times10^{21}/cm^3$, such as $1.0\times10^{21}/cm^3$ to $5.0\times10^{21}/cm^3$, and the etch process may comprise a wet etch process employing TMY. Backside cavities 79' are vertically extended by the third isotropic etch process.

Generally, the semiconductor backside trench fill structures 73 (e.g., the portions of the semiconductor backside trench fill structures 73 as formed at the processing steps of FIGS. 17A and 17B that are not implanted by the boron atoms) can be removed selective to the first bridge structures 73B, the second bridge structures 73C, and the third bridge structures 73D by performing a third selective isotropic etch process. In one embodiment, the third selective isotropic etch process comprises a wet etch process employing trimethyl-2 hydroxyethyl ammonium hydroxide (TMY). The third selective isotropic etch process etches remaining portions of the semiconductor backside trench fill structures 73.

Backside cavities 79' are formed in volumes from which portions of the semiconductor backside trench fill structures 73 are removed. Generally, a set of at least one bridge structure (73B, 73C, 73D) can overlie a respective backside cavity 79' within each of the backside trenches 79. The third block-level photoresist layer 573 can be subsequently removed, for example, by ashing.

Subsequently, an optional thermal or plasma oxidation process can be performed to oxidize at least physically exposed surface portions of each of the bridge structures (73B, 73C, 73D) if the bridge structures comprise a semiconductor material. For a timed oxidation dielectric semiconductor oxide liners 178 are formed by conversion of physically exposed surfaces of the bridge structures (73B, 73C, 73D) into dielectric semiconductor oxide portions. For example, for silicon bridge structures, the semiconductor oxide liners 178 comprise boron doped silicon oxide (e.g., borosilicate glass) liners. The thickness of the dielectric semiconductor oxide liners 178 may be in a range from 1 nm to 20 nm, such as from 2 nm to 10 nm, although lesser and greater thicknesses may also be employed. In one embodiment, each of the plurality of bridge structures (73B, 73C, 73D) can be embedded within a respective dielectric semiconductor oxide liner 178. In one embodiment, the respective dielectric semiconductor oxide liner 178 has a uniform thickness, and comprises a dielectric oxide of the doped semiconductor material. Alternatively, the duration of the oxidation may be extended such that the entire volume of the bridge structures is converted to a dielectric semiconductor oxide, such as boron doped silicon oxide (e.g., borosilicate glass).

While the above embodiment comprises three types of bridge structures (73B, 73C, 73D) located at three different vertical distances (d1, d2, d3) from a horizontal plane including a top surface of the substrate 8, embodiments are expressly contemplated herein in which two types of bridge structures are formed at two different vertical distances from the horizontal plane, or four or more types of bridge structures are formed at four or more different vertical distances from the horizontal plane.

Figure 39A:
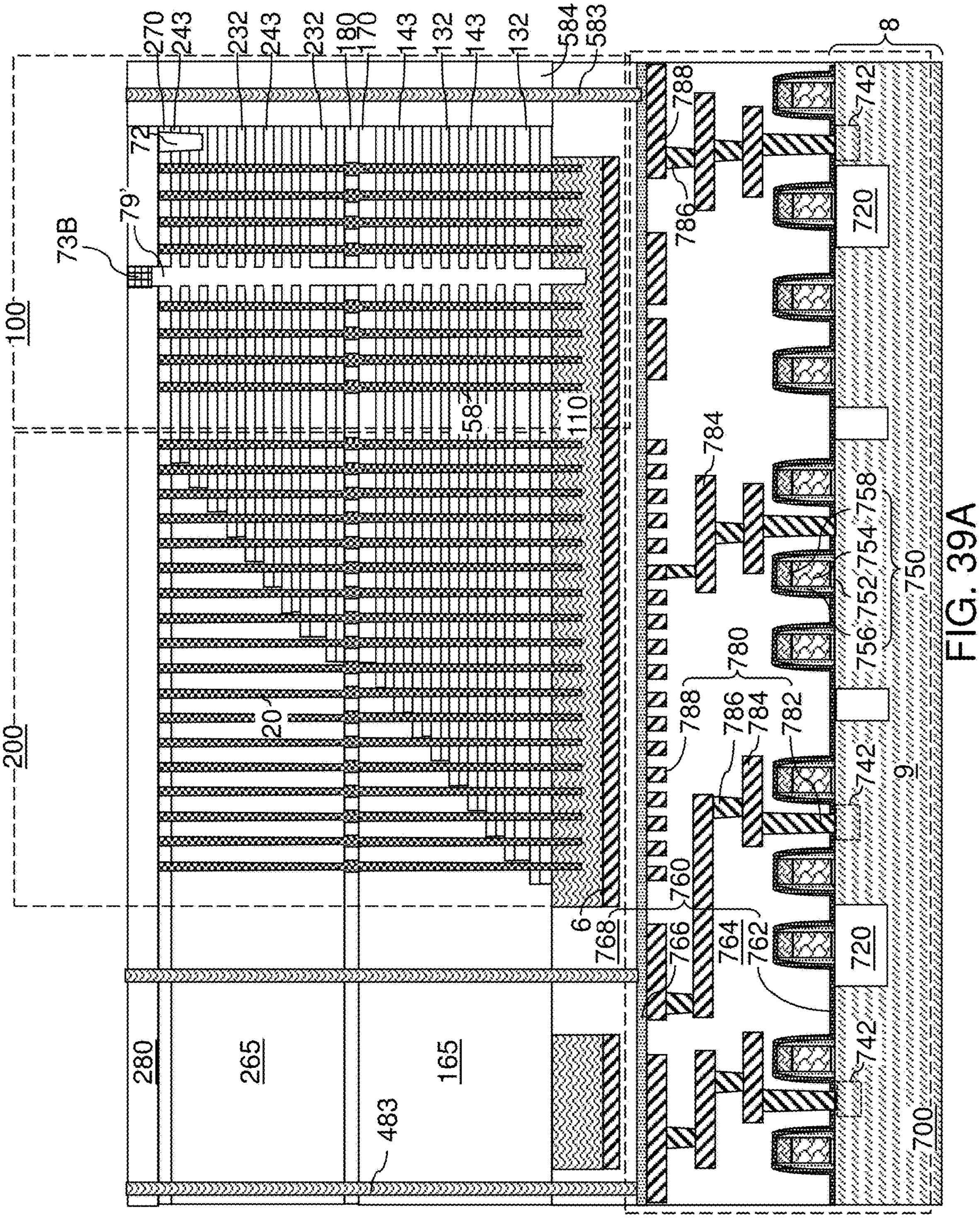
FIG. 39A is a vertical cross-sectional view of the second exemplary structure after formation of backside recesses according to an embodiment of the present disclosure.
Figure 39B:
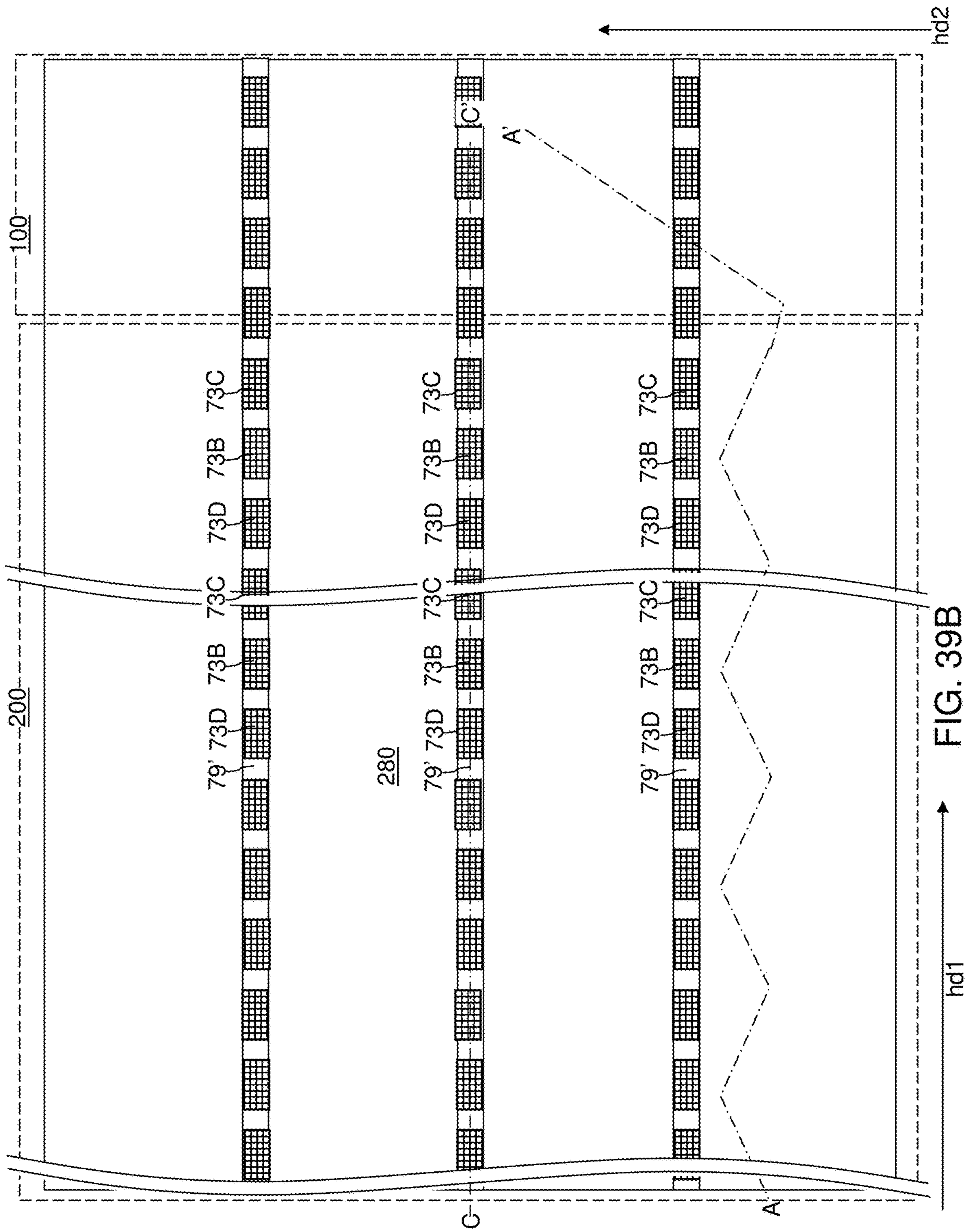
FIG. 39B is a top-down view of the second exemplary structure of FIG. 39A. The hinged vertical plane A-A' corresponds to the plane of the vertical cross-sectional view of FIG. 39A.
Figure 39C:
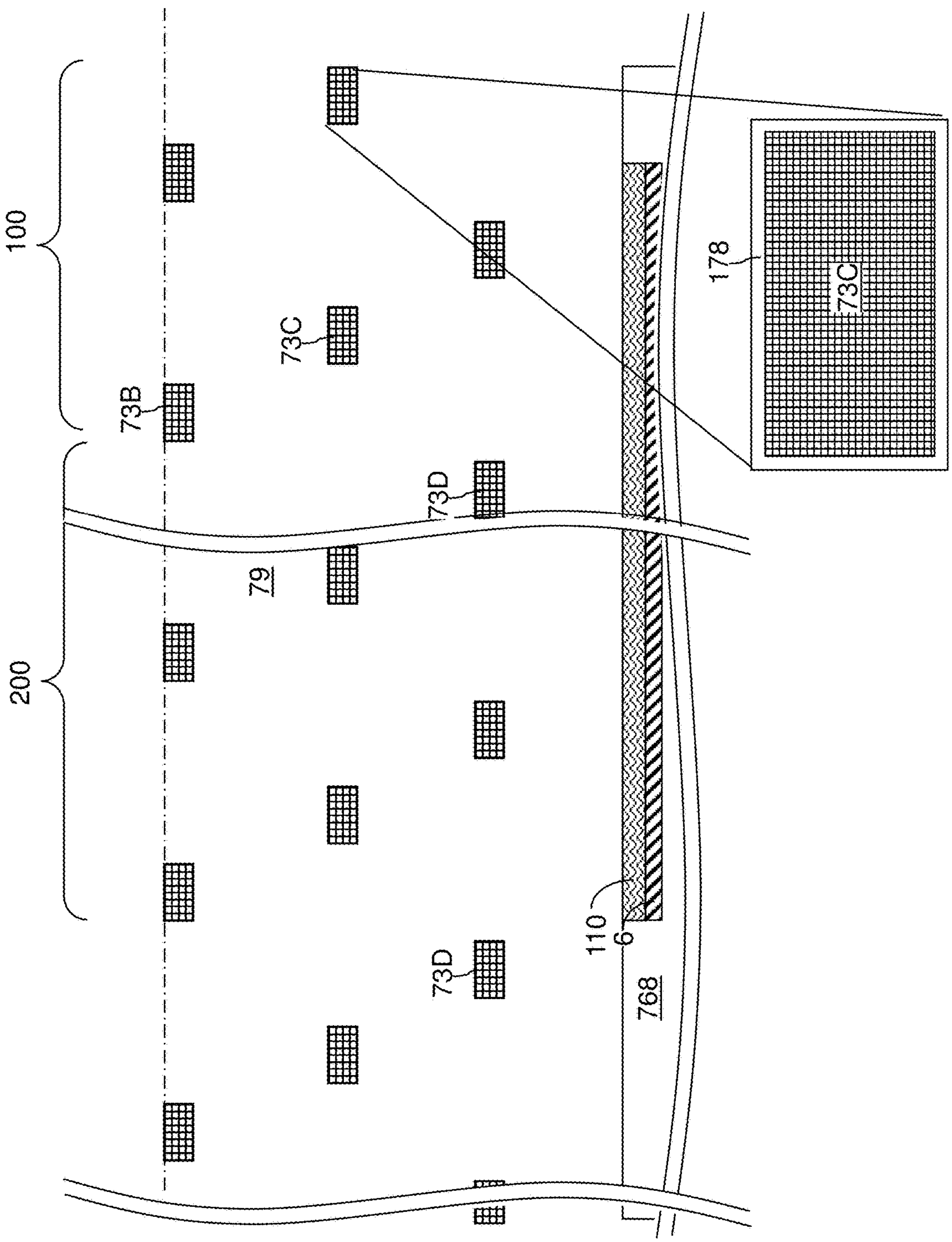
FIG. 39C is a vertical cross-sectional view of the second exemplary structure along the vertical plane C-C' of FIG. 39B.

Referring to FIGS. 39A-39C, the processing steps of FIG. 22 can be performed to form backside recesses (143, 243).

Figure 40A:
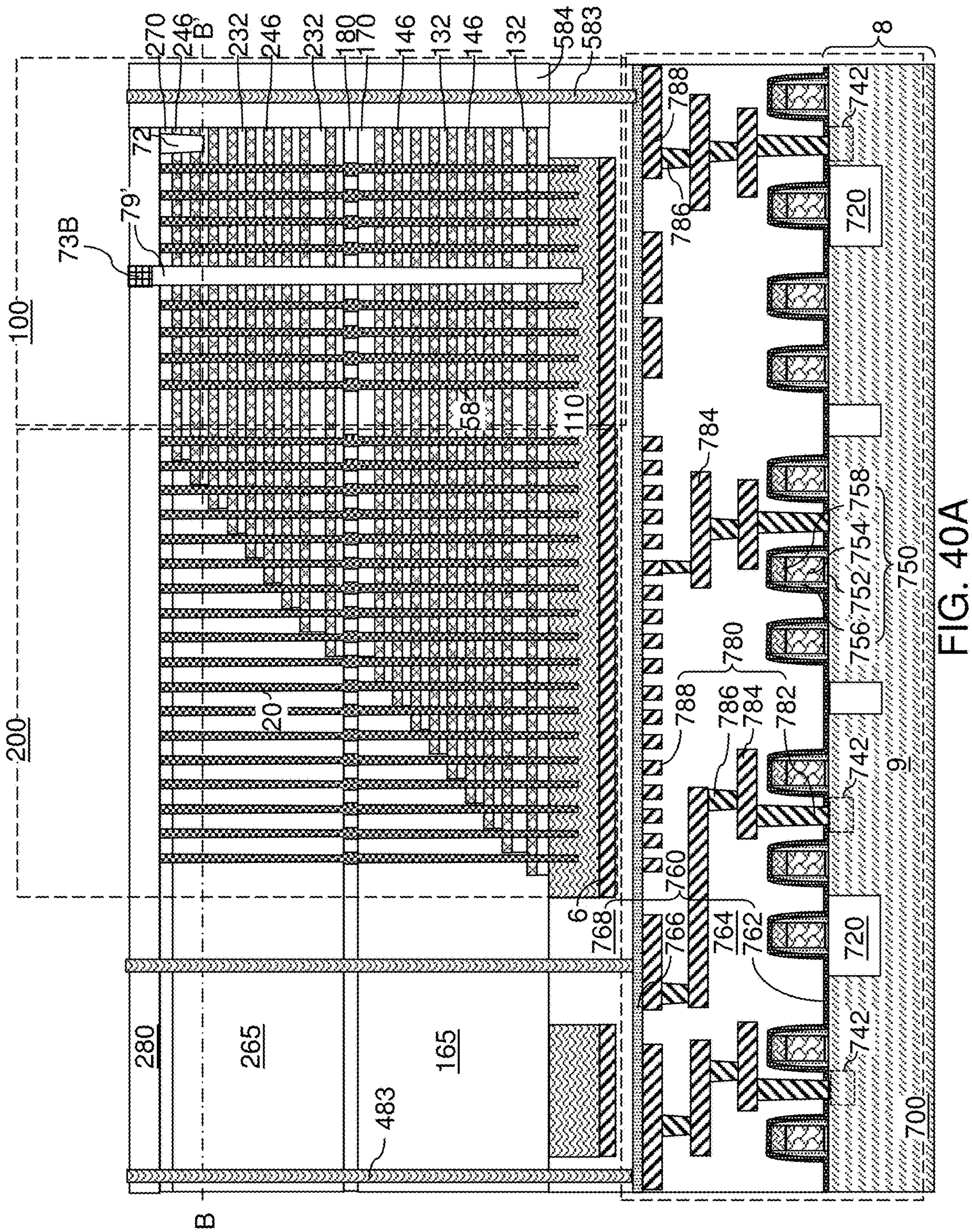
FIG. 40A is a vertical cross-sectional view of the second exemplary structure after formation of electrically conductive layers according to an embodiment of the present disclosure.
Figure 40B:
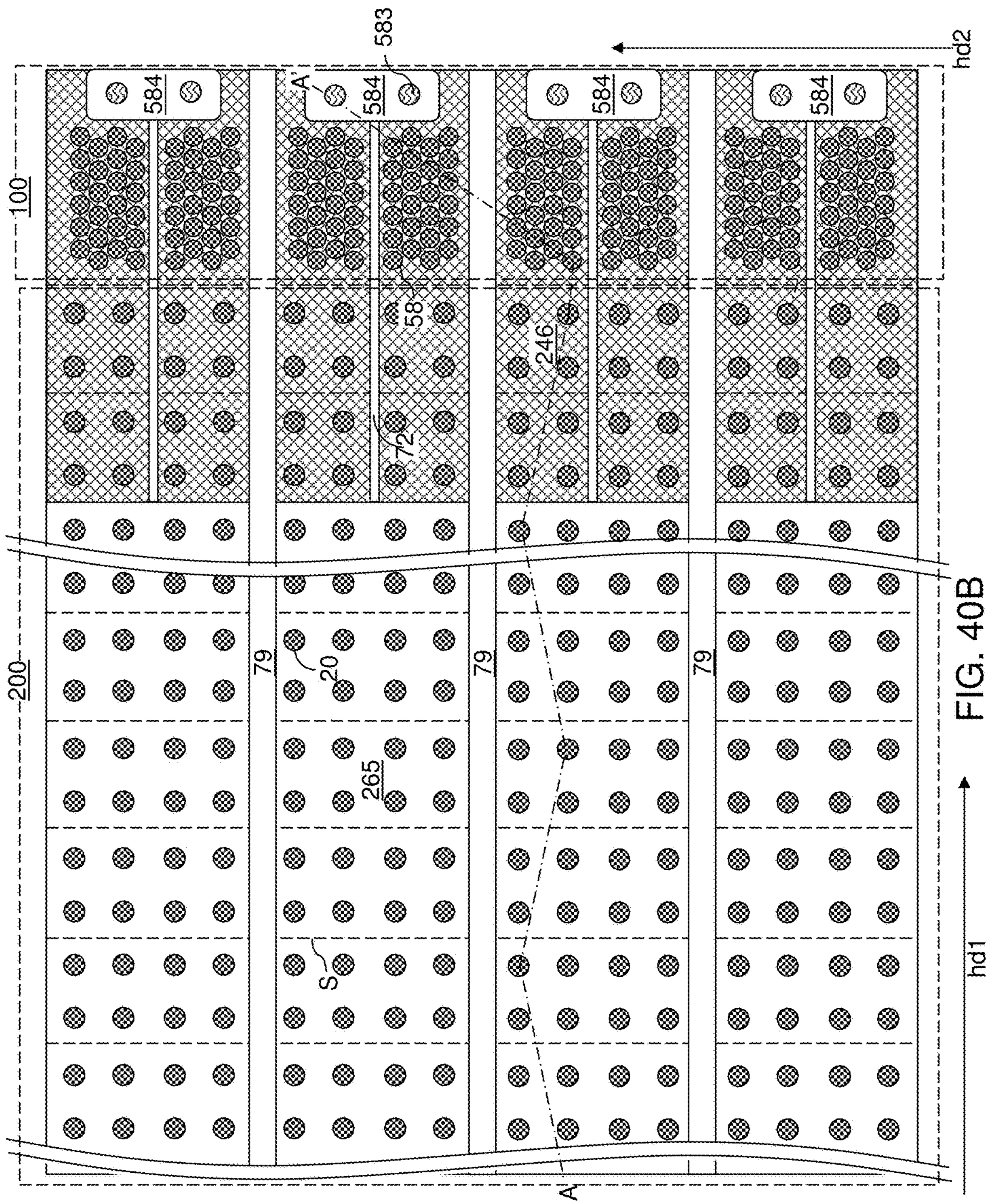
FIG. 40B is a horizontal cross-sectional view of the second exemplary structure along the horizontal plane B-B' of FIG. 40A. The hinged vertical plane A-A' corresponds to the plane of the vertical cross-sectional view of FIG. 40A.
Figure 40C:
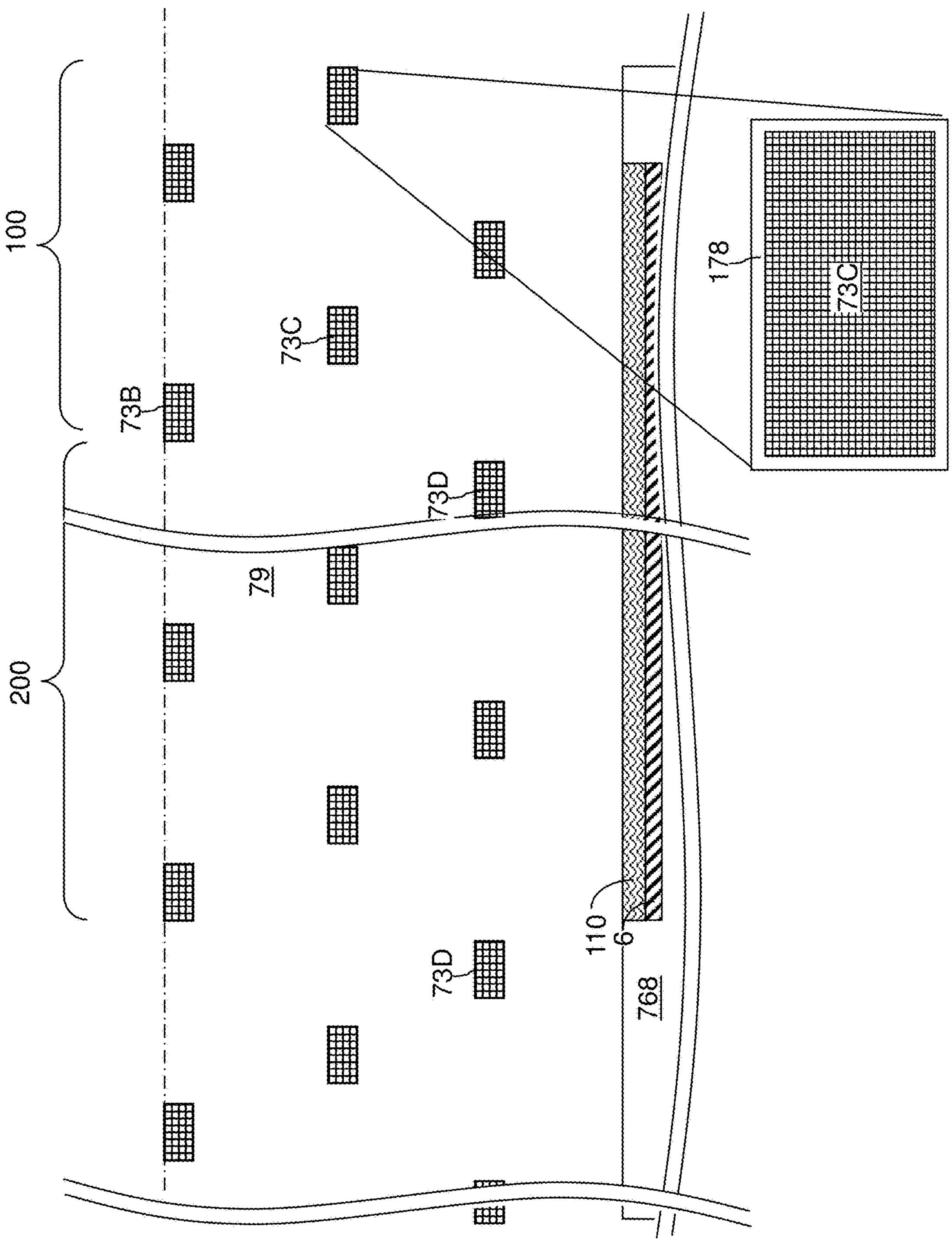
FIG. 40C is a vertical cross-sectional view of the second exemplary structure along the vertical plane C-C' of FIG. 40B.
Figure 41A:
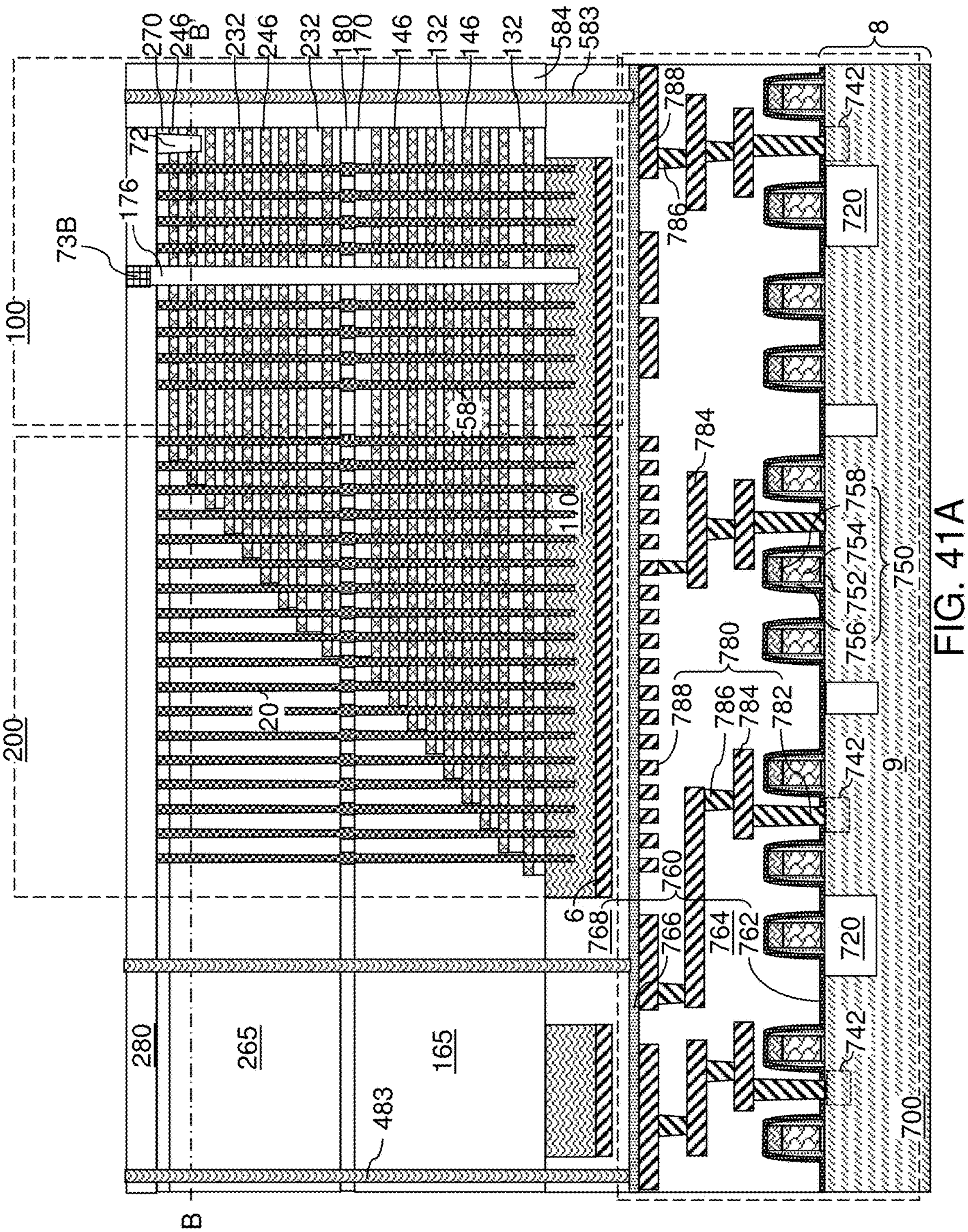
FIG. 41A is a vertical cross-sectional view of the second exemplary structure after formation of backside trench fill structures in the backside trenches according to an embodiment of the present disclosure.
Figure 41B:
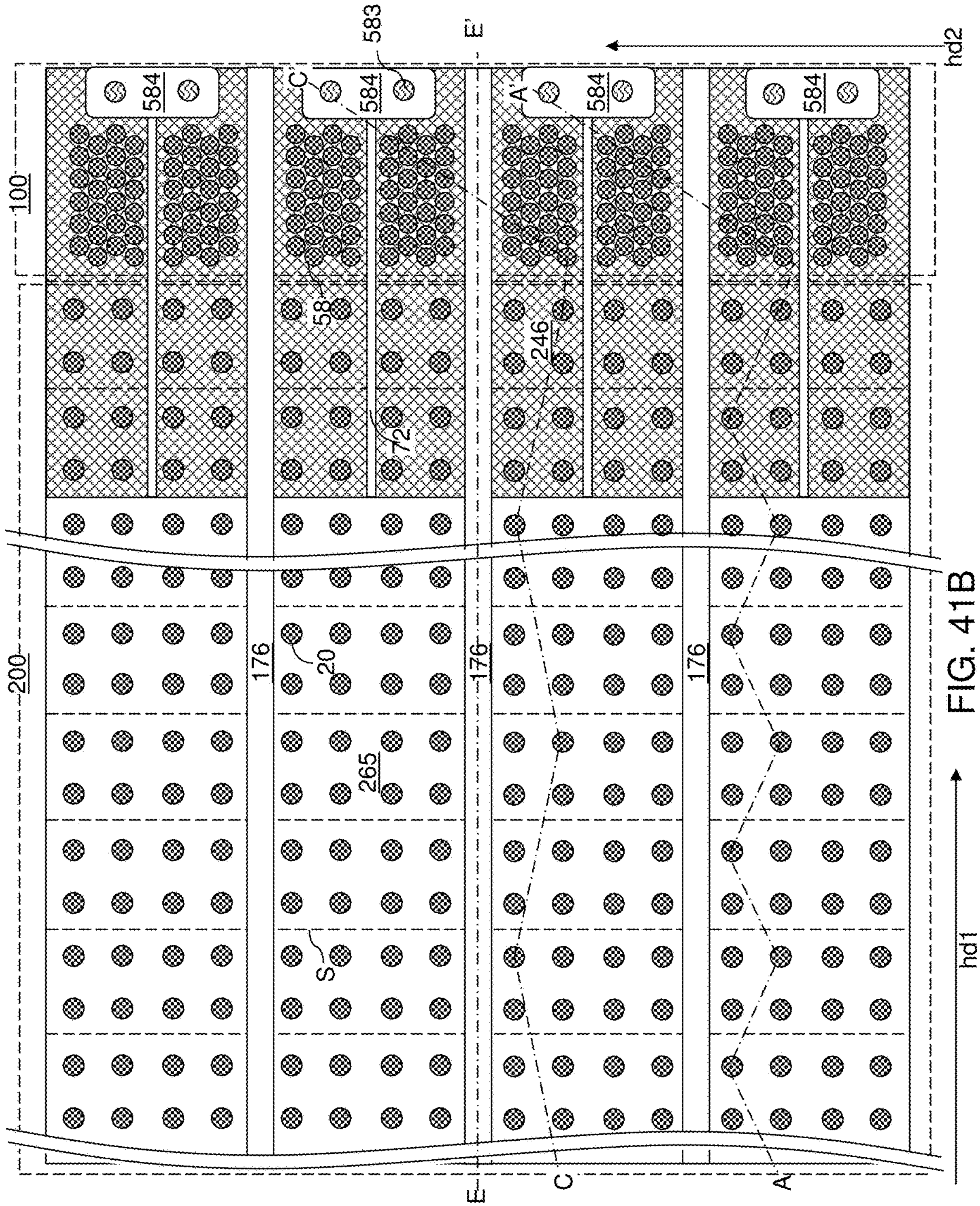
FIG. 41B is a horizontal cross-sectional view of the second exemplary structure along the horizontal plane B-B' of FIG. 41A. The hinged vertical plane A-A' corresponds to the plane of the vertical cross-sectional view of FIG. 41A.
Figure 41C:
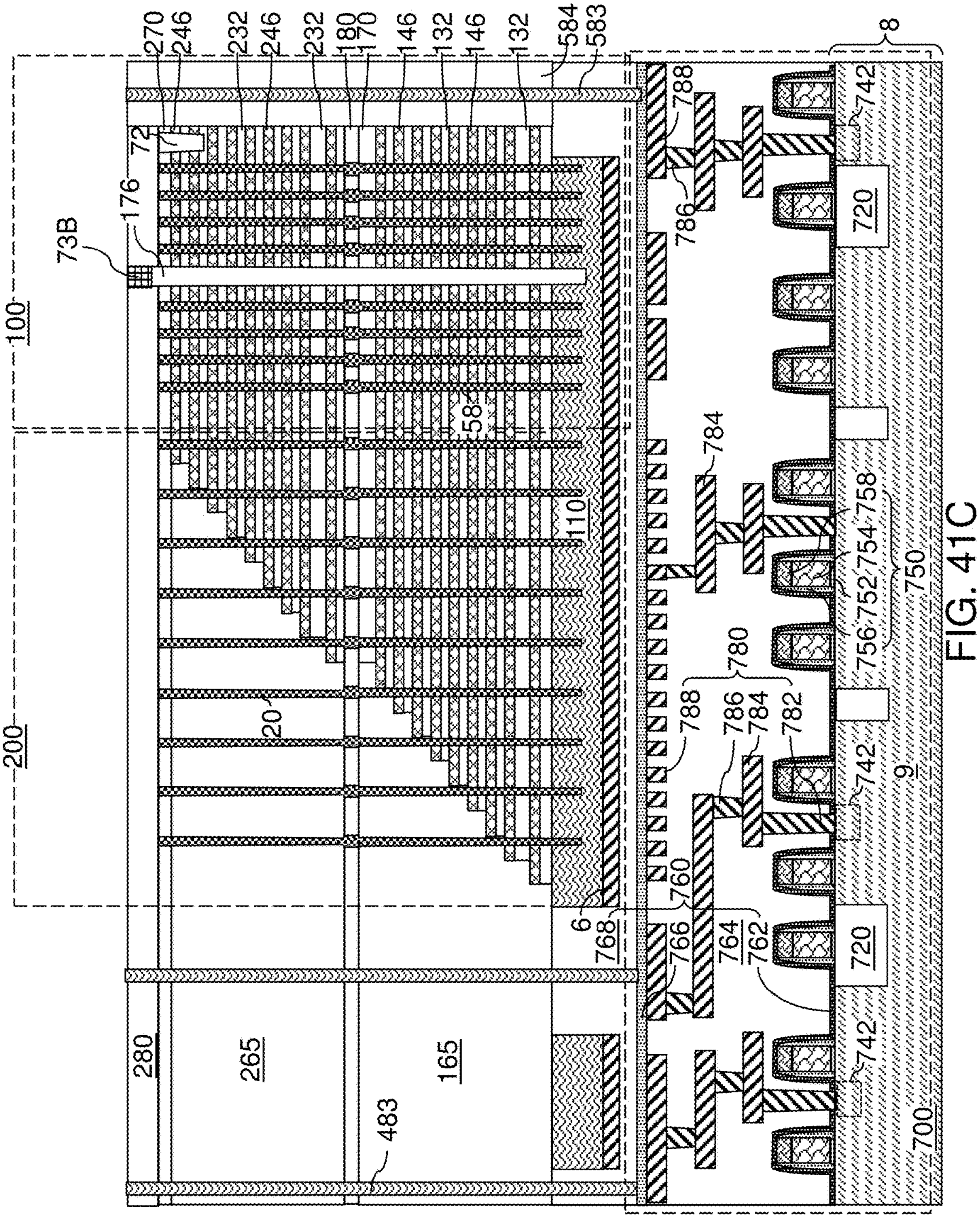
FIG. 41C is a vertical cross-sectional view of the second exemplary structure along the vertical plane C-C' of FIG. 41B.
Figure 41D:
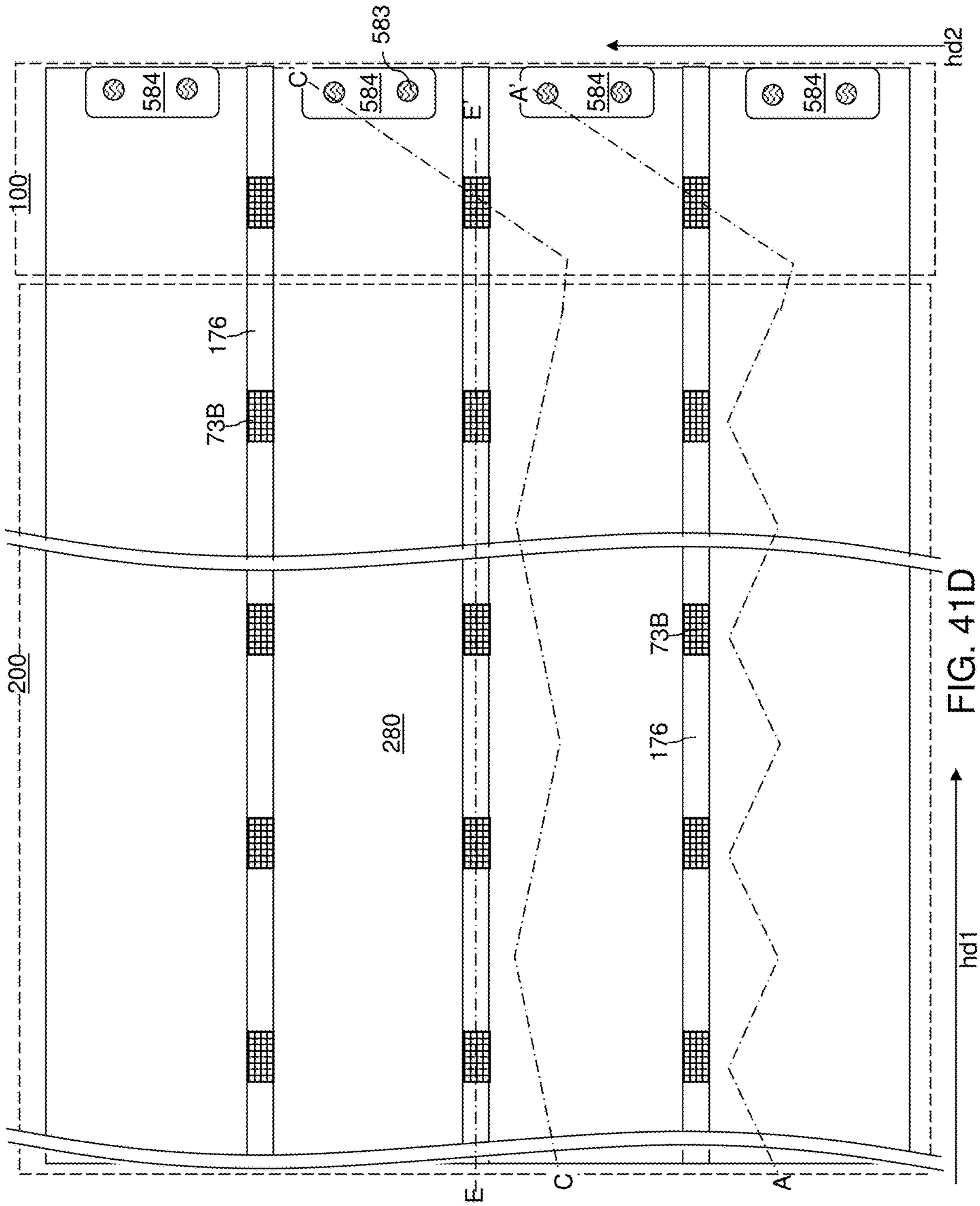
FIG. 41D is a top-down view of the second exemplary structure of FIGS. 41A-41C. The hinged vertical plane A-A' corresponds to the plane of the vertical cross-sectional view of FIG. 41A. The hinged vertical plane C-C' corresponds to the plane of the vertical cross-sectional view of FIG. 41C.
Figure 41E:
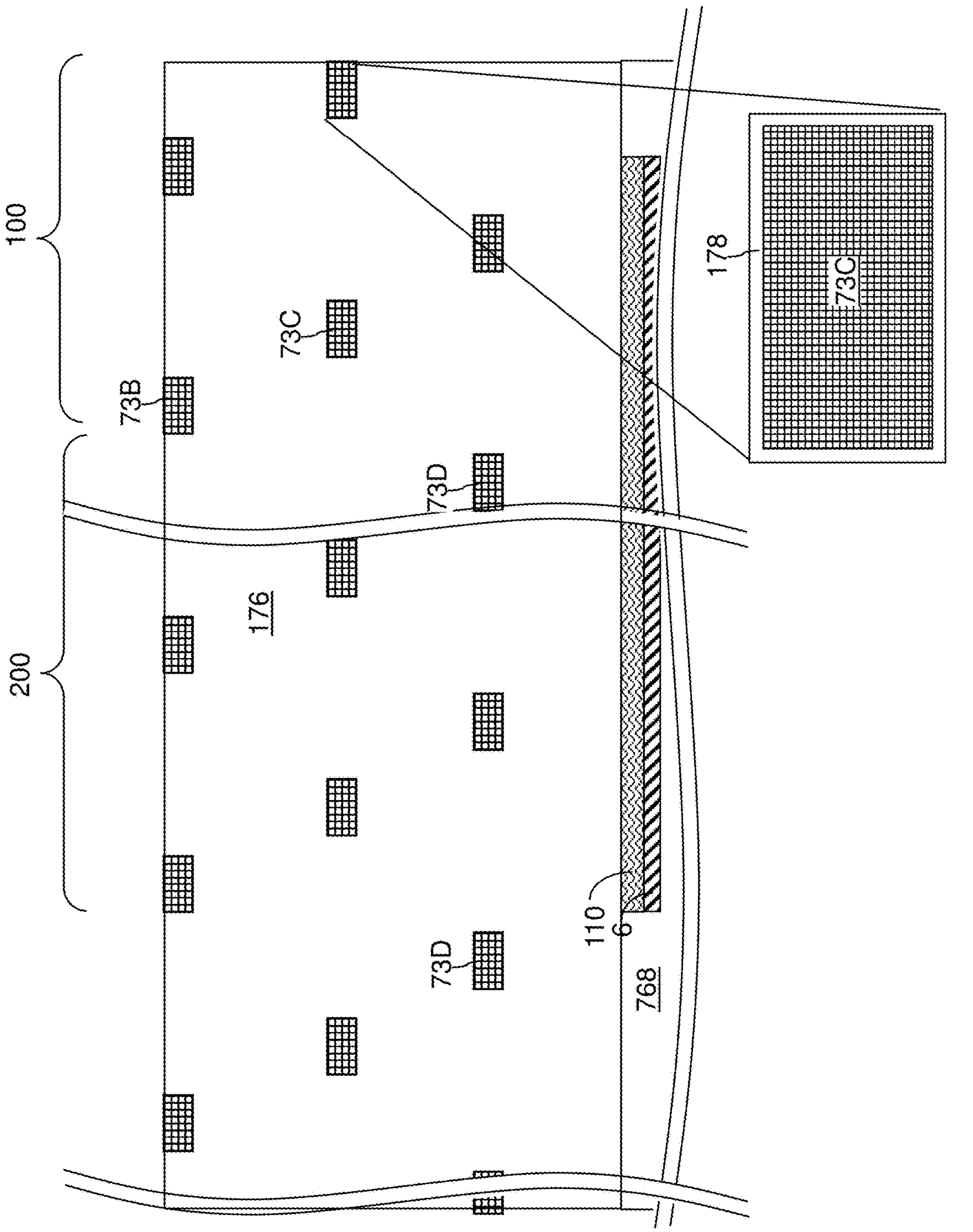
FIG. 41E is a vertical cross-sectional view of the second exemplary structure along the vertical plane E-E' of FIGS. 41B and 41D.

Referring to FIGS. 40A-40C, the processing steps of FIGS. 23A and 23B can be performed to replace the sacrificial material layers (142, 242) with electrically conductive layers (146, 246) while the bridge structures (73B, 73C, 73D) are present within the backside trenches 79, and provide structural support to the insulating layers (132, 232). Since the bridge structures (73B, 73C, 73D) are located at different vertical levels, the bridge structures reduce or eliminate tilting of the insulating layers (132, 232) into the backside trenches 79 at different vertical levels, rather than just at the top of the backside trenches 79.

Referring to FIGS. 41A-41E, the processing steps of FIGS. 24A-24E can be performed to form backside trench fill structures 176 in the backside trenches 79. Each backside trench fill structure 176 may comprise an insulating backside trench fill material portion embedding each bridge structure (73A, 73C, 73D) within a respective backside trench 79. The sidewalls of each insulating backside trench fill material portion 176 contacts a pair of lengthwise sidewalls of the backside trench 79 that laterally extends along the first horizontal direction hd1. In one embodiment, the backside trench fill structure 176 contacts a respective sidewall of each layer within a neighboring pair of alternating stacks of insulating layers (132, 232) and electrically conductive layers (146, 246).

Figure 42:
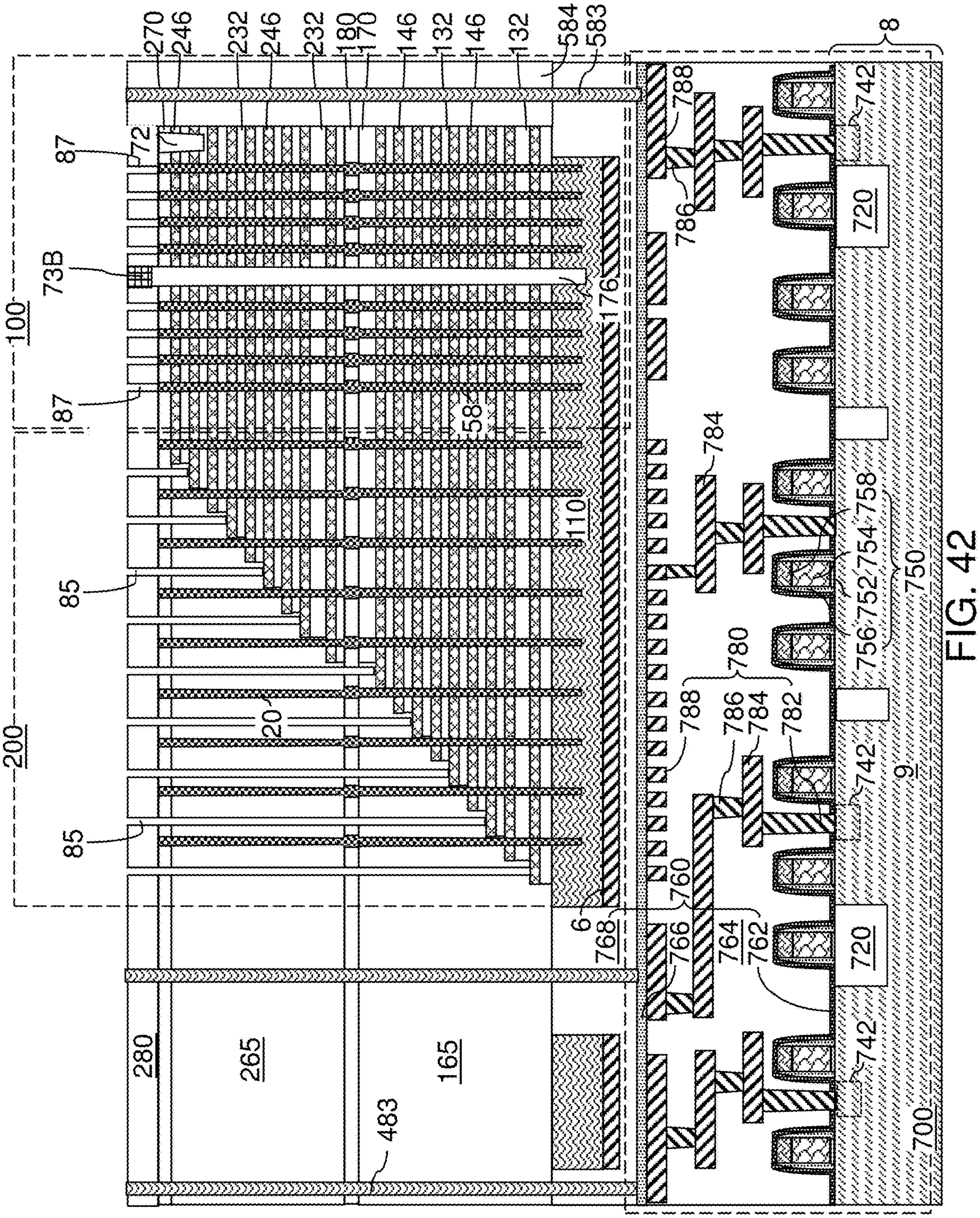
FIG. 42 is a vertical cross-sectional view of the second exemplary structure after formation of layer contact via cavities and drain contact via cavities according to an embodiment of the present disclosure.

Referring to FIG. 42, the processing steps of FIG. 25 can be performed to form layer contact via cavities 85 and drain contact via cavities 87.

Figure 43:
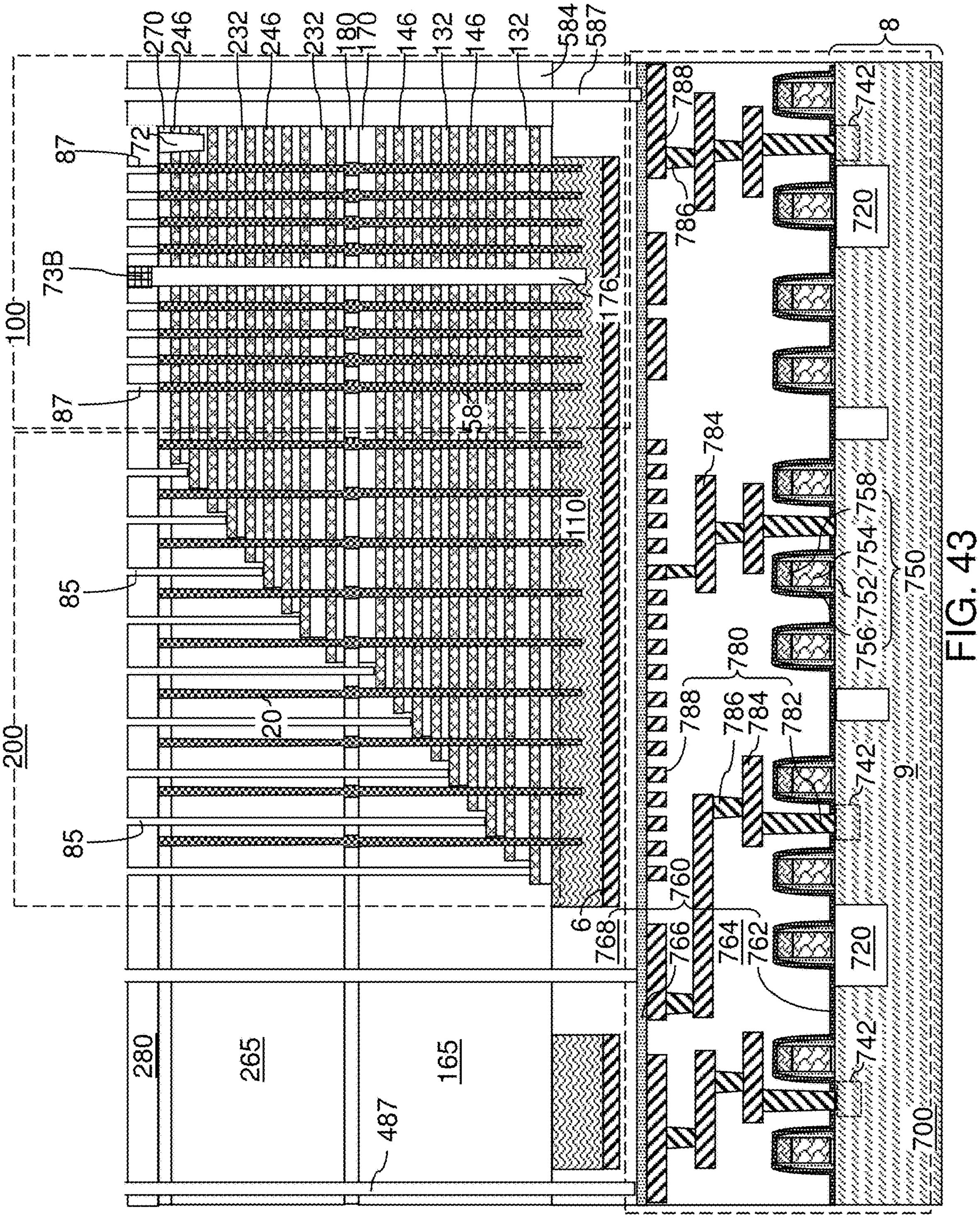
FIG. 43 is a vertical cross-sectional view of the second exemplary structure after removal of sacrificial via cavity fill structures according to an embodiment of the present disclosure.

Referring to FIG. 43, the processing steps of FIG. 26 can be performed to remove sacrificial via cavity fill structures (483, 583) and to form peripheral-region via cavities 487 and through-memory-level via cavities 587.

Figure 44A:
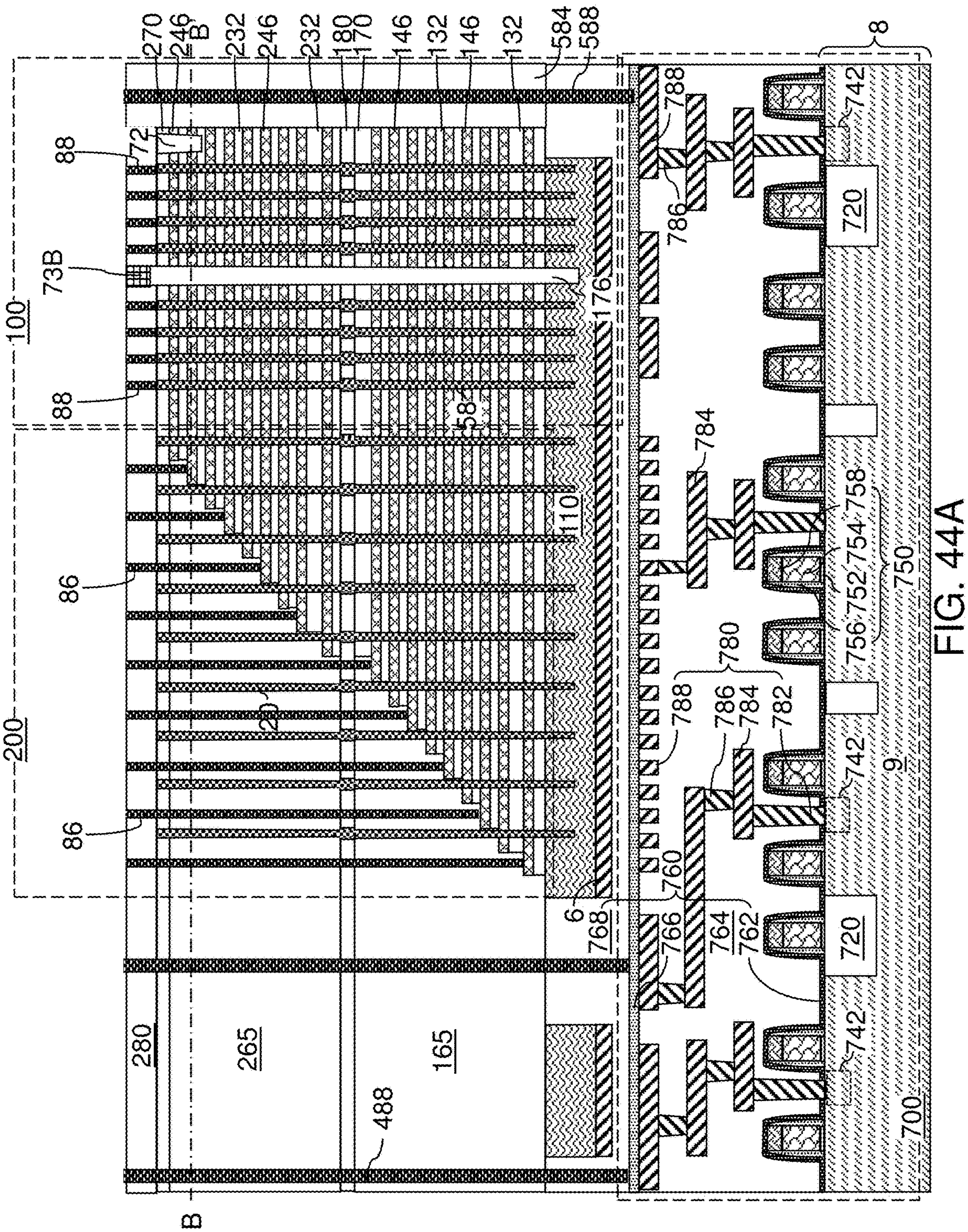
FIG. 44A is a vertical cross-sectional view of the second exemplary structure after formation of various contact via structures according to an embodiment of the present disclosure.
Figure 44B:
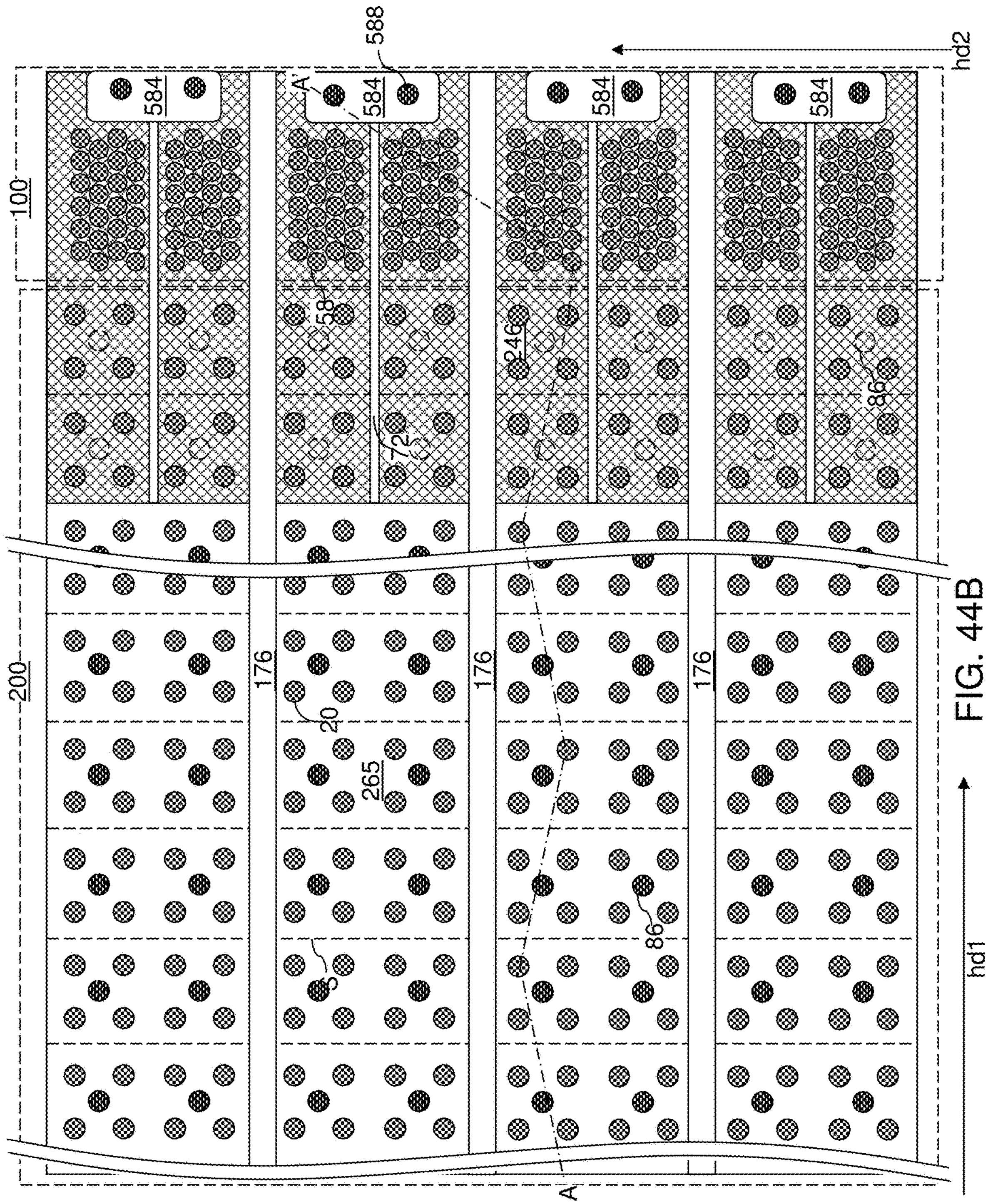
FIG. 44B is a horizontal cross-sectional view of the second exemplary structure along the vertical plane B-B' of FIG. 44A. The hinged vertical plane A-A' corresponds to the plane of the vertical cross-sectional view of FIG. 44A.

Referring to FIGS. 44A and 44B, the processing steps of FIGS. 27A and 27B can be performed to form various contact via structures (86, 88, 485, 586)

Figure 45:
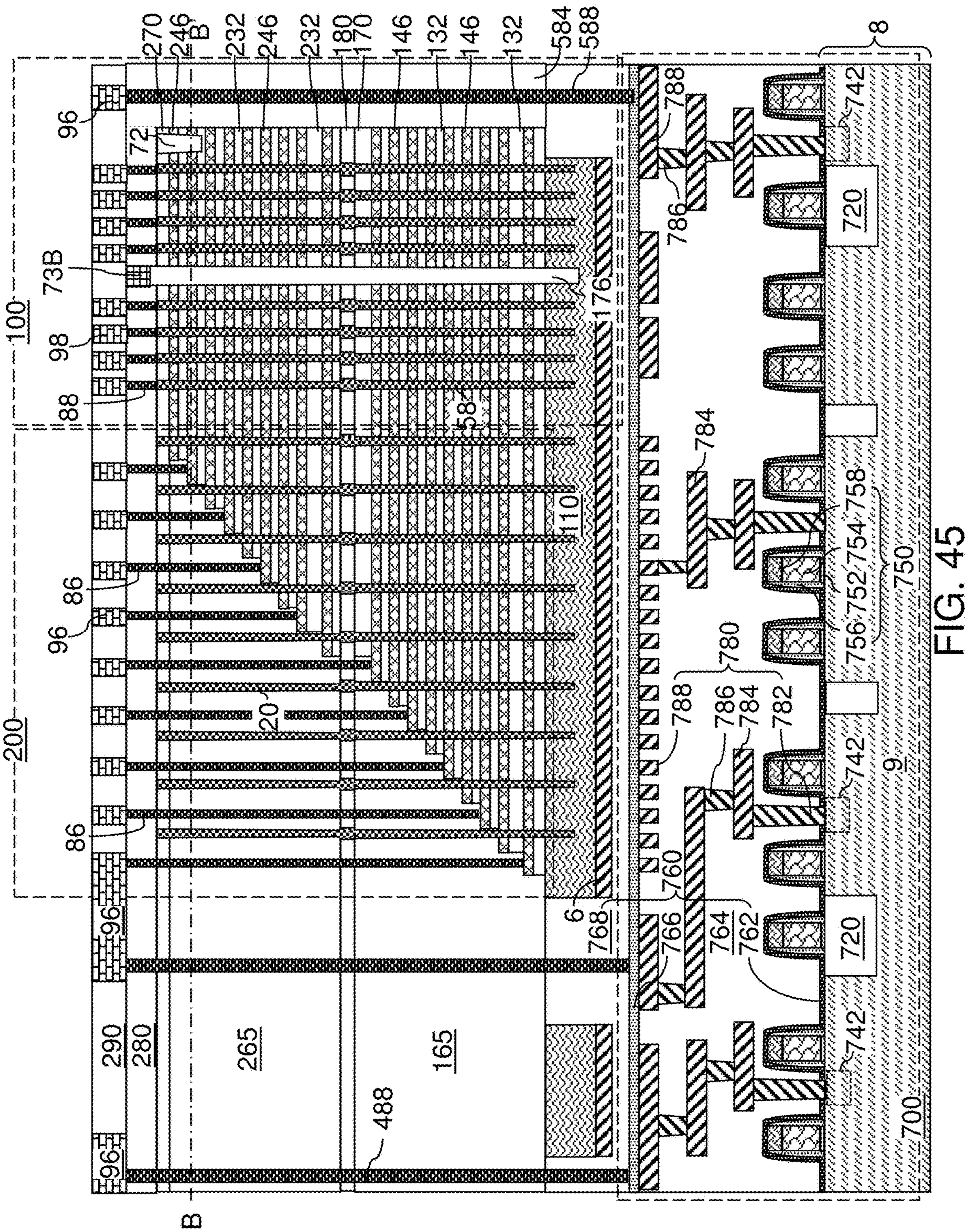
FIG. 45 is a vertical cross-sectional view of the second exemplary structure after formation of upper metal line structures according to an embodiment of the present disclosure.

Referring to FIG. 45, the processing steps of FIG. 28 can be performed to form upper metal line structures (96. 98) embedded in a line-level dielectric layer 290.

Referring to all drawings and according to various embodiments of the present disclosure, a three-dimensional memory device is provided, which comprises: a pair of alternating stacks {(132, 232), (146, 246)} of insulating layers (132, 232) and electrically conductive layers (146, 246) laterally spaced apart from each other by a backside trench 79, wherein each of the pair of alternating stacks {(132, 232), (146, 246)} and the backside trench 79 laterally extend along a first horizontal direction hd1; arrays of memory openings 49 vertically extending through a respective alternating stack {(132, 232), (146, 246)} among the pair of alternating stacks {(132, 232), (146, 246)}; arrays of memory openings fill structures 58 located in the arrays of memory openings 49, wherein each of the memory opening fill structures 58 comprises a respective vertical stack of memory elements; and a backside trench fill structure 176 located within the backside trench 79 and comprising a plurality of bridge structures (73B, 73C, 73D).

In one embodiment, the plurality of bridge structures (73B, 73C) comprises: a first bridge structure 73B located at a first vertical distance d1 from a horizontal plane including a top surface of the substrate 8; and a second bridge structure 73C located at a second vertical distance d2 from the horizontal plane, wherein the second vertical distance d2 is different from the first vertical distance d1. In one embodiment, the second bridge structure 73C is laterally offset from the first bridge structure 73B along the first horizontal direction hd1. In one embodiment, the second bridge structure 73C does not have any areal overlap with the first bridge structure 73B in a plan view along a vertical direction that is perpendicular to a top surface of the substrate 8.

The bridge structures may include multiple rows of bridge structures located at different vertical distances from the substrate, which can provide structural support to the alternating stacks at multiple heights.

In one embodiment, the first bridge structure 73B is located above a horizontal plane including topmost surfaces of the pair of alternating stacks {(132, 232), (146, 246)}; and the second bridge structure 73C is located below the horizontal plane including the topmost surfaces of the pair of alternating stacks {(132, 232), (146, 246)}. In one embodiment, the three-dimensional memory device comprises a pair of contact-level dielectric material portions located above a respective alternating stack {(132, 232), (146, 246)} within the pair of alternating stacks {(132, 232), (146, 246)}, wherein the first bridge structure 73B has a top surface located within a horizontal plane including top surfaces of the pair of contact-level dielectric material portions.

In one embodiment, each of the memory opening fill structures 58 comprises a respective vertical semiconductor channel 60 and a respective drain region 63 contacting an upper end portion of the respective vertical semiconductor channel 60; and top surfaces of the drain regions 63 are located at, or underneath, a horizontal plane including topmost surfaces of the pair of alternating stacks {(132, 232), (146, 246)}.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

a pair of alternating stacks of insulating layers and electrically conductive layers laterally spaced apart from each other by a backside trench, wherein each of the pair of alternating stacks and the backside trench laterally extend along a first horizontal direction;

arrays of memory openings vertically extending through a respective alternating stack among the pair of alternating stacks;

arrays of memory openings fill structures located in the arrays of memory openings, wherein each of the memory opening fill structures comprises a respective vertical stack of memory elements; and a backside trench fill structure located within the backside trench and comprising a plurality of bridge structures;

wherein each of the plurality of bridge structures includes a doped semiconductor material; and wherein each of the plurality of bridge structures is embedded within a respective dielectric semiconductor oxide liner which comprises a dielectric oxide of the doped semiconductor material.

2. The three-dimensional memory device of claim 1, wherein the plurality of bridge structures comprises:

a first bridge structure located at a first vertical distance from a horizontal plane including a top surface of the substrate; and a second bridge structure located at a second vertical distance from the horizontal plane, wherein the second vertical distance is different from the first vertical distance.

3. The three-dimensional memory device of claim 2, wherein the second bridge structure is laterally offset from the first bridge structure along the first horizontal direction.

4. The three-dimensional memory device of claim 2, wherein the second bridge structure does not have any areal overlap with the first bridge structure in a plan view along a vertical direction that is perpendicular to a top surface of the substrate.

5. The three-dimensional memory device of claim 1, wherein:

the first bridge structure is located above a horizontal plane including topmost surfaces of the pair of alternating stacks; and the second bridge structure is located below the horizontal plane including the topmost surfaces of the pair of alternating stacks.

6. The three-dimensional memory device of claim 5, further comprising a pair of contact-level dielectric material portions located above a respective alternating stack within the pair of alternating stacks, wherein the first bridge structure has a top surface located within a horizontal plane including top surfaces of the pair of contact-level dielectric material portions.

7. The three-dimensional memory device of claim 1, wherein the doped semiconductor material comprises boron doped silicon.

8. The three-dimensional memory device of claim 1, wherein the plurality of bridge structures comprises three bridge structures located at three different vertical distances from a horizontal plane including a top surface of the substrate.

9. The three-dimensional memory device of claim 1, wherein the backside trench fill structure comprises an insulating backside trench fill material portion embedding each bridge structure of the plurality of bridge structures.

10. The three-dimensional memory device of claim 9, wherein:

the backside trench fill structure contacts a respective sidewall of each layer within the pair of alternating stacks; and sidewalls of the insulating backside trench fill material portion contacts a pair of lengthwise sidewalls of the backside trench that laterally extends along the first horizontal direction.

11. The three-dimensional memory device of claim 1, wherein the plurality of bridge structures comprises:

a row of first bridge structures that are arranged along the first horizontal direction and located at a first vertical distance from a horizontal plane including a top surface of the substrate; and a row of second bridge structures that are arranged along the first horizontal direction and located at a second vertical distance from the horizontal plane, wherein the second vertical distance is different from the first vertical distance.

* * * * *